United States Patent
Lee et al.

(10) Patent No.: US 12,550,513 B2
(45) Date of Patent: Feb. 10, 2026

(54) DISPLAY DEVICE AND METHOD OF MANUFACTURING THE SAME

(71) Applicant: Samsung Display Co., LTD., Yongin-si (KR)

(72) Inventors: Won Ho Lee, Yongin-si (KR); Buem Joon Kim, Yongin-si (KR); Jong Hyuk Kang, Yongin-si (KR); Hyun Deok Im, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 772 days.

(21) Appl. No.: 17/677,360

(22) Filed: Feb. 22, 2022

(65) Prior Publication Data
US 2022/0415962 A1    Dec. 29, 2022

(30) Foreign Application Priority Data

Jun. 23, 2021 (KR) .................. 10-2021-0081752

(51) Int. Cl.
*H10H 20/01*    (2025.01)
*H10H 20/821*    (2025.01)
(Continued)

(52) U.S. Cl.
CPC .......... *H10H 29/142* (2025.01); *H10H 20/01* (2025.01); *H10H 20/821* (2025.01);
(Continued)

(58) Field of Classification Search
CPC ....... H01L 27/156; H01L 33/24; H01L 33/38; H01L 33/44; H01L 33/50; H01L 33/58; H01L 2933/0016
See application file for complete search history.

(56) References Cited

U.S. PATENT DOCUMENTS 7,794,799 B1    9/2010    Kim et al.
8,656,582 B2    2/2014    Lee et al.
(Continued)

FOREIGN PATENT DOCUMENTS

CN    110112090    8/2019
KR    2003-0088782    11/2003
(Continued)

OTHER PUBLICATIONS

C. Wongchoosuk, S. Krongsukand T. Kerdcharoen," First principles and MD simulation study of the interaction of functionalized carbon nanotubes with water molecules, " 2007 7th IEEE Conference on Nanotechnology ( IEEE Nano ), Hong Kong, China, 2007, pp. 1130-1134 (Year: 2007).*

(Continued)

*Primary Examiner* — Marlon T Fletcher
*Assistant Examiner* — Da Wei Lee
(74) *Attorney, Agent, or Firm* — Womble Bond Dickinson (US) LLP

(57) ABSTRACT

A display device includes a substrate including a pixel area, and a pixel disposed in the pixel area and including an emission area and a non-emission area. The pixel includes a first alignment electrode and a second alignment electrode spaced from each other on the substrate, an insulating layer disposed on the first and second alignment electrodes, at least one light emitting element disposed on the insulating layer between the first alignment electrode and the second alignment electrode in the emission area, a pattern disposed between the at least one light emitting element and the insulating layer and including a hydrophilic group, and a bank disposed on the insulating layer in the non-emission area and including a first opening corresponding to the emission area and a second opening spaced from the first opening of the bank.

15 Claims, 36 Drawing Sheets

(51) Int. Cl.
  *H10H 20/831* (2025.01)
  *H10H 20/84* (2025.01)
  *H10H 20/851* (2025.01)
  *H10H 20/855* (2025.01)
  *H10H 29/14* (2025.01)

(52) U.S. Cl.
  CPC .......... *H10H 20/831* (2025.01); *H10H 20/84* (2025.01); *H10H 20/851* (2025.01); *H10H 20/855* (2025.01); *H10H 20/032* (2025.01)

(56) References Cited

U.S. PATENT DOCUMENTS

| | | |
|---|---|---|
| 9,773,761 B2 | 9/2017 | Do |
| 11,211,534 B2 | 12/2021 | Bae et al. |
| 11,430,759 B2 | 8/2022 | Song et al. |
| 11,967,607 B2 | 4/2024 | Do et al. |
| 2019/0288046 A1* | 9/2019 | Park .................. H10K 59/1315 |
| 2020/0035778 A1* | 1/2020 | Kim .................. H01L 25/0655 |
| 2020/0212267 A1* | 7/2020 | Kwak .................. H10H 20/854 |
| 2021/0193614 A1* | 6/2021 | Lee .................. H01L 24/82 |
| 2022/0005975 A1* | 1/2022 | Yang .................. H10H 20/831 |
| 2022/0068876 A1 | 3/2022 | Do et al. |
| 2022/0115470 A1* | 4/2022 | Kim .................. H10K 71/00 |
| 2022/0238760 A1* | 7/2022 | Chen .................. H01L 25/167 |
| 2022/0399398 A1* | 12/2022 | Kim .................. H10H 20/855 |

FOREIGN PATENT DOCUMENTS

| | | |
|---|---|---|
| KR | 10-2010-0087932 | 8/2010 |
| KR | 10-1490758 | 2/2015 |
| KR | 10-2028437 | 10/2019 |
| KR | 10-2020-0031189 A | 3/2020 |
| KR | 10-2020-0041044 A | 4/2020 |
| KR | 10-2020-0068150 | 6/2020 |
| KR | 10-2020-0088949 | 7/2020 |
| KR | 10-2020-0088962 | 7/2020 |
| KR | 10-2020-0134359 | 12/2020 |
| KR | 10-2021-0029337 | 3/2021 |
| KR | 10-2021-0044958 | 4/2021 |
| KR | 10-2021-0081506 A | 7/2021 |

OTHER PUBLICATIONS

International Search Report corresponding to International Application No. PCT/KR2022/001996 dated May 16, 2022.
Korean Notice of Allowance corresponding to KR Application No. 10-2021-0081752, dated Oct. 27, 2025 (7 pages).

* cited by examiner

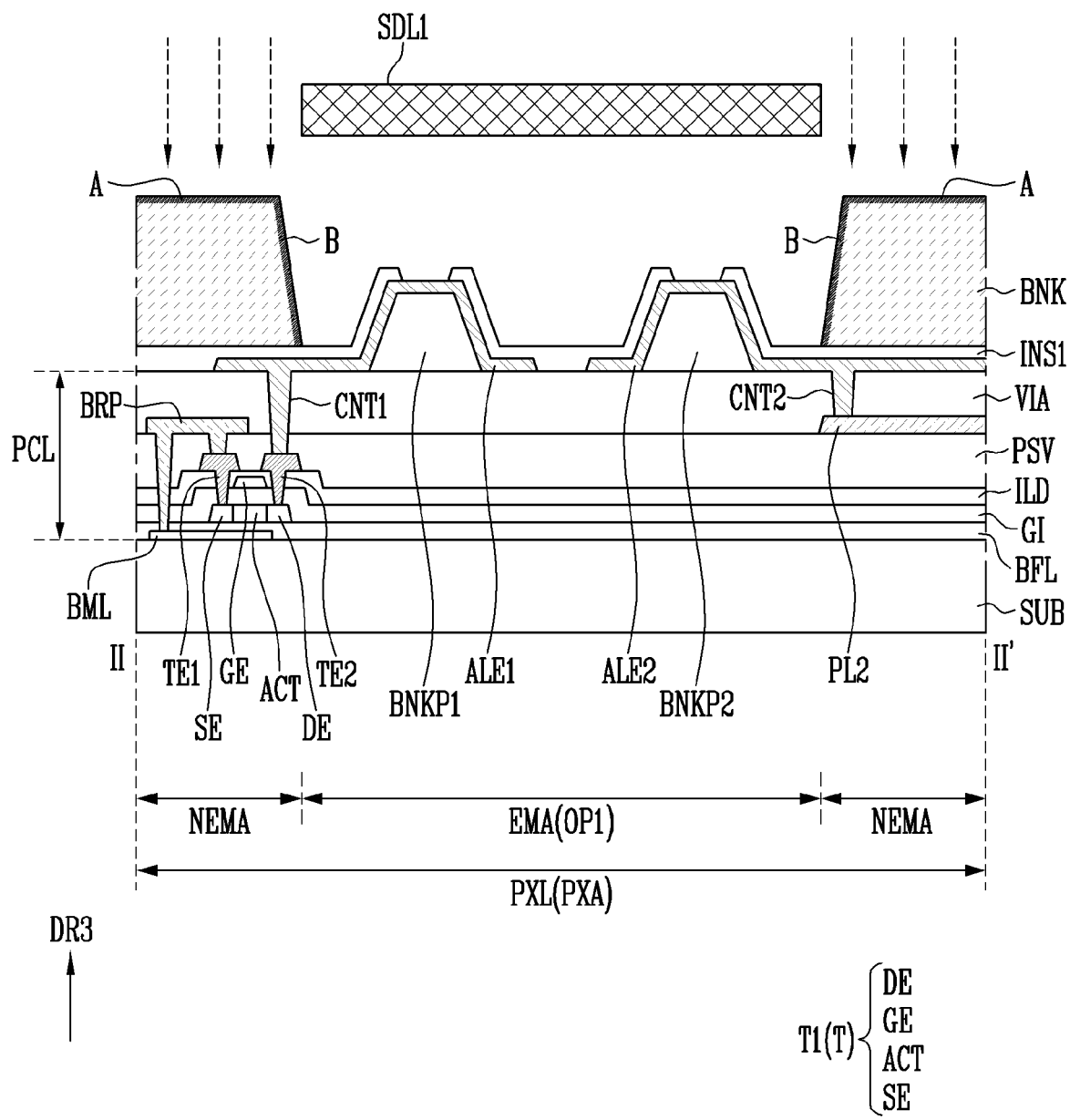

DISPLAY DEVICE AND METHOD OF MANUFACTURING THE SAME

CROSS-REFERENCE TO RELATED APPLICATION(S)

This application claims priority to and benefits of Korean Patent Application No. 10-2021-0081752 under 35 U.S.C. § 119, filed on Jun. 23, 2021, in the Korean Intellectual Property Office, the entire contents of which are incorporated herein by reference.

BACKGROUND

1. Technical Field

The disclosure relates to a display device and a method of manufacturing the same.

2. Description of the Related Art

Recently, as interest in information display is increased, research and development of a display device are continuously being conducted.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a display device that improves reliability by reducing the separation of a light emitting element within an emission area.

The disclosure also provides a method of manufacturing the above-described display device.

A display device may include a substrate including a pixel area; and a pixel disposed in the pixel area, the pixel including an emission area and a non-emission area. The pixel may include a first alignment electrode and a second alignment electrode spaced from each other on the substrate; an insulating layer disposed on the first alignment electrode and the second alignment electrode; at least one light emitting element disposed on the insulating layer between the first alignment electrode and the second alignment electrode in the emission area; a pattern disposed between the at least one light emitting element and the insulating layer, the pattern including a hydrophilic group; and a bank disposed on the insulating layer in the non-emission area, the bank including a first opening corresponding to the emission area and a second opening spaced from the first opening of the bank.

In an embodiment, the pattern may overlap the at least one light emitting element in a plan view.

The pattern may have a width equal to a length of the at least one light emitting element in a direction.

In an embodiment, the hydrophilic group of the pattern may include one of a hydroxyl group (—OH), a carboxyl group (—COOH), and a combination thereof.

In an embodiment, the at least one light emitting element may include an outer circumferential surface having hydrophobicity.

In an embodiment, the insulating layer may include silicon oxide ($SiO_x$), and the pattern may include an organic material.

The pattern may include an alkylsiloxane self-assembled monolayer.

In an embodiment, the pattern may have hydrophilicity, and at least a surface of the bank may have hydrophobicity.

In an embodiment, an upper surface of the bank and a side surface of the bank may include fluorine (F).

In an embodiment, the pixel may further include a first pixel electrode and a second pixel electrode spaced apart from each other and electrically connected to the at least one light emitting element.

In an embodiment, the insulating layer may be partially opened to expose each of a portion of the first alignment electrode and a portion of the second alignment electrode in the emission area. The first pixel electrode may be electrically connected to the first alignment electrode through an open portion of the insulating layer. The second pixel electrode may be electrically connected to the second alignment electrode through another open portion of the insulating layer.

In an embodiment, the insulating layer may include a first contact hole exposing a portion of the first alignment electrode; and a second contact hole exposing a portion of the second alignment electrode within the second opening of the bank.

In an embodiment, the first pixel electrode may be electrically connected to the first alignment electrode through the first contact hole of the insulating layer. The second pixel electrode may be electrically connected to the second alignment electrode through the second contact hole of the insulating layer.

In an embodiment, the insulating layer may completely overlap each of the first alignment electrode and the second alignment electrode in the emission area in a plan view.

In an embodiment, the pixel may further include a light conversion pattern disposed on the first pixel electrode and the second pixel electrode and corresponding to the emission area; and a light blocking pattern disposed on the bank and corresponding to the non-emission area.

A method of forming a display device may include forming at least one pixel including an emission area and a non-emission area on a substrate; forming of the at least one pixel may include forming a pixel circuit layer including at least one transistor on the substrate; forming a first alignment electrode and a second alignment electrode spaced from each other on the pixel circuit layer; forming an insulating layer on the first alignment electrode and the second alignment electrode; forming a bank in the non-emission area on the insulating layer; forming a self-assembled monolayer including a hydrophilic group on a surface of the insulating layer; disposing a light emitting element on the self-assembled monolayer on the insulating layer between the first alignment electrode and the second alignment electrode; and forming a pattern disposed between the insulating layer and the light emitting element by removing a portion of the self-assembled monolayer.

In an embodiment, the forming of the pattern may include performing an etching process using oxygen plasma on the self-assembled monolayer.

In an embodiment, the performing of the etching process may include irradiating the oxygen plasma to the self-assembled monolayer except for the light emitting element by disposing a shielding member on the light emitting element.

In an embodiment, the forming of the bank may include irradiating plasma on the bank. At least a surface of the bank may have hydrophobicity.

In an embodiment, the forming of the at least one pixel may further include forming a first pixel electrode and a second pixel electrode electrically connected to the light emitting element and spaced from each other, after the forming of the pattern.

A display device and a method of manufacturing the same according to an embodiment of the disclosure may improve a separation rate of a light emitting element and readily control an alignment of the light emitting element by using a repulsive force between the light emitting element having hydrophobicity and a pattern having hydrophilicity, by disposing the pattern including a hydrophilic group (or a hydrophilic functional group) between an insulating layer and the light emitting element.

An effect according to an embodiment of the disclosure is not limited to the contents illustrated above, and more various effects are included in the specification.

BRIEF DESCRIPTION OF THE DRAWINGS

The above and other features of the disclosure will become more apparent by describing in further detail embodiments thereof with reference to the accompanying drawings, in which:

FIG. 20 is a schematic cross-sectional view illustrating a method of manufacturing the pixel of FIG. 19E according to an embodiment;

DETAILED DESCRIPTION OF THE EMBODIMENTS

Figure 1:
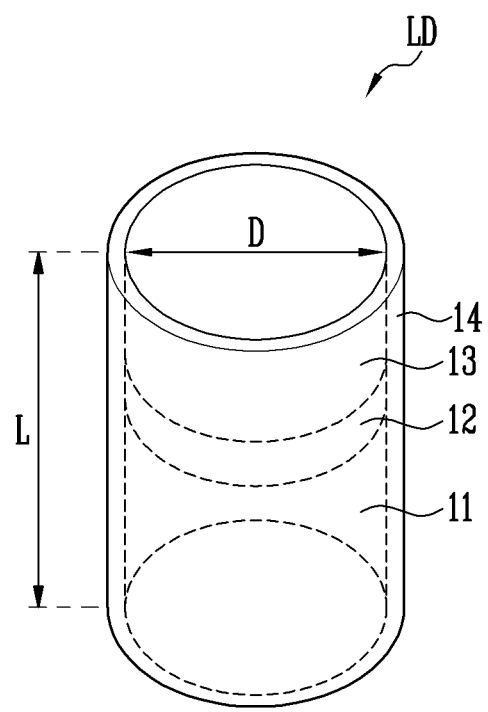
FIGS. 1 and 2 are schematic perspective views schematically illustrating a light emitting element according to an embodiment.

The disclosure may be modified in various manners and have various forms. Therefore, embodiments will be illustrated in the drawings and will be described in detail in the specification. However, it should be understood that the disclosure is not intended to be limited to the disclosed embodiments, and the disclosure includes all modifications, equivalents, and substitutions within the spirit and technical scope of the disclosure.

Similar reference numerals are used for similar components in describing each drawing. In the drawings, sizes, thicknesses, ratios, and dimensions of the elements may be exaggerated for ease of description and for clarity.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

Terms of "first", "second", and the like may be used to describe various components, but the components should not be limited by the terms. The terms are used only for the purpose of distinguishing one component from another component. For example, without departing from the scope of the disclosure, a first component may be referred to as a second component, and similarly, a second component may also be referred to as a first component.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

It should be understood that in the application, the terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

In addition, a case where a portion of a layer, a film, an area, a plate, or the like is referred to as being "on" another portion, it includes not only a case where the portion is "directly on" another portion, but also a case where there is further another portion between the portion and another portion. In addition, in the specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion.

In the application, in a case where "a component (for example, 'a first component') is operatively or communicatively coupled with/to or "connected to" another component (for example, 'a second component'), the case should be understood that the component may be directly connected to the other component, or may be connected to the other component through another component (for example, a 'third component'). In contrast, in a case where a component (for example, 'a first component') is "directly coupled with/to or "directly connected" to another component (for example, 'a second component'), the case may be understood that another component (for example, 'a third component') is not present between the component and the other component.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments and others necessary for those skilled in the art to understand the disclosure will be described in detail with reference to the accompanying drawings.

In the following description, the singular expressions include plural expressions unless the context clearly dictates otherwise. For example, as used herein, the singular forms, "a," "an," and "the" are intended to include the plural forms as well, unless the context clearly indicates otherwise.

Figure 2:
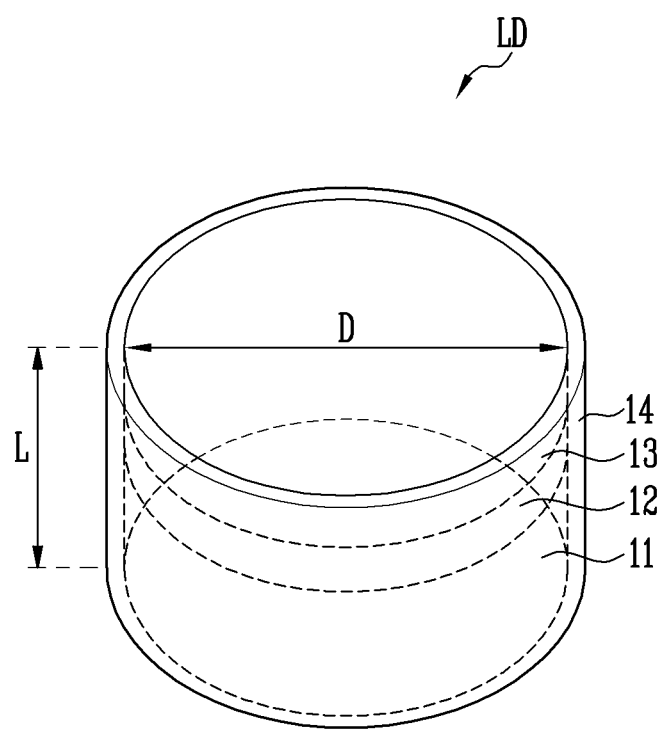
Figure 3:
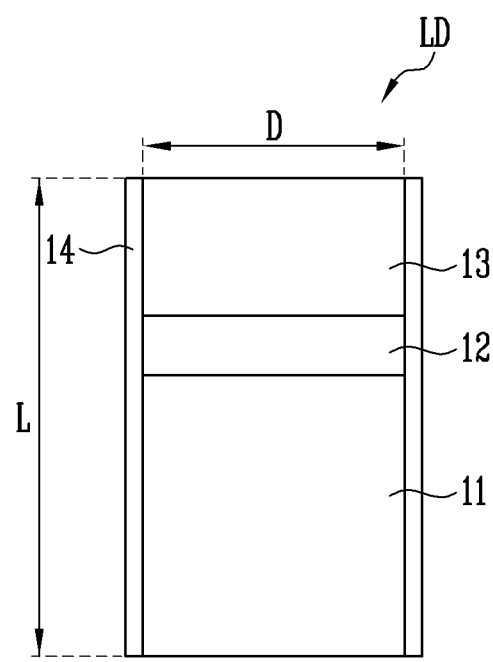
FIG. 3 is a schematic cross-sectional view of the light emitting element of FIG. 1.

FIGS. 1 and 2 are schematic perspective views schematically illustrating a light emitting element LD according to an embodiment, and FIG. 3 is a schematic cross-sectional view of the light emitting element LD of FIG. 1.

In an embodiment, a type and/or a shape of the light emitting element LD are/is not limited to the embodiment shown in FIGS. 1 to 3. It is to be understood that the shapes and/or surfaces disclosed herein may also include shapes and/or surfaces substantial to those shapes and or surfaces disclosed herein.

Referring to FIGS. 1 to 3, the light emitting element LD may include a first semiconductor layer 11, a second semiconductor layer 13, and an active layer 12 interposed between the first semiconductor layer 11 and the second semiconductor layer 13. For example, the light emitting element LD may implement a light emitting stack (or a stack) in which the first semiconductor layer 11, the active layer 12, and the second semiconductor layer 13 may be sequentially stacked each other.

The light emitting element LD may be provided in a shape extending in one direction or in a direction. In case that an extension direction of the light emitting element LD is referred to as a length direction, the light emitting element LD may include one end portion (or a lower end portion) and another end portion (or an upper end portion) along the extension direction. Any one of the first and second semiconductor layers 11 and 13 may be disposed at the one end portion of the light emitting element LD, and the other one of the first and second semiconductor layers 11 and 13 may be positioned at the other end portion of the light emitting element LD. For example, the first semiconductor layer 11 may be positioned at the one end portion of the light emitting element LD, and the second semiconductor layer 13 may be positioned at the other end portion of the light emitting element LD.

The light emitting element LD may be provided in various shapes. For example, as shown in FIG. 1, the light emitting element LD may have a rod shape, a bar shape, a column shape, or the like, which is long in the length direction (for example, an aspect ratio is greater than 1). In an embodiment, a length L of the light emitting element LD in the length direction may be greater than a diameter D (or a width of a cross section) of the light emitting element LD. However, the disclosure is not limited thereto. According to an embodiment, as shown in FIG. 2, the light emitting element LD may have a rod shape, a bar shape, a column shape, or the like, which is short in the length direction (for example, the aspect ratio is less than 1). According to an embodiment, the light emitting element LD may have a rod shape, a bar shape, a column shape, or the like, in which the length L and the diameter D are the same.

The light emitting element LD may include, for example, a light emitting diode (LED) manufactured to be extremely small to have the diameter D and/or the length L of about a nano scale (or nano meter) to a micro scale (or micrometer).

In case that the light emitting element LD is long in the length direction (for example, the aspect ratio is greater than 1), the diameter D of the light emitting element LD may be in a range of about 0.5 μm to about 6 μm, and the length L may be in a range of about 1 μm to about 10 μm. However, the diameter D and the length L of the light emitting element LD are not limited thereto. A size of the light emitting element LD may be changed to satisfy a requirement condition (or a design condition) of a lighting device or a light emitting display device DD to which the light emitting element LD is applied.

For example, the first semiconductor layer 11 may include at least one n-type semiconductor layer. For example, the first semiconductor layer 11 may include any one semiconductor material among InAlGaN, GaN, AlGaN, InGaN, AlN, and InN, and may be an n-type semiconductor layer doped with a first conductive dopant (or an n-type dopant) such as Si, Ge, or Sn. However, the material forming the first semiconductor layer 11 is not limited thereto, and other various materials may form the first semiconductor layer 11. The first semiconductor layer 11 may include an upper surface contacting the active layer 12 along the length direction of the light emitting element LD and a lower surface exposed to the outside. The lower surface of the first semiconductor layer 11 may be the one end portion (or the lower end portion) of the light emitting element LD.

The active layer 12 may be disposed on the first semiconductor layer 11 and may be formed in a single quantum well structure or a multiple quantum well structure. For example, in case that the active layer 12 is formed in the multiple quantum well structure, in the active layer 12, a barrier layer (not shown), a strain reinforcing layer, and a well layer may be periodically and repeatedly stacked as one unit. The strain reinforcing layer may have a lattice constant less than that of the barrier layer to further a reinforce strain, for example, a compression strain, applied to the well layer. However, a structure of the active layer 12 is not limited to the above-described embodiment.

The active layer 12 may emit light of a wavelength in a range of about 400 nm to about 900 nm, and may use a double hetero structure. In an embodiment, a clad layer (not shown) doped with a conductive dopant may be formed on and/or under or below the active layer 12 along the length direction of the light emitting element LD. For example, the clad layer may be formed of an AlGaN layer or an InAlGaN layer. According to an embodiment, a material such as AlGaN or InAlGaN may be used to form the active layer 12. Other various materials may form the active layer 12. The active layer 12 may include a first surface contacting the first semiconductor layer 11 and a second surface contacting the second semiconductor layer 13.

In case that an electric field of a set or given voltage or more is applied to both end portions of the light emitting element LD, the light emitting element LD emits light while an electron-hole pair is combined in the active layer 12. By controlling light emission of the light emitting element LD by using such a principle, the light emitting element LD may be used as a light source (or a light emitting source) of various light emitting devices including a pixel of the display device DD.

The second semiconductor layer 13 may be disposed on the second surface of the active layer 12 and may include a semiconductor layer of a type different from that of the first semiconductor layer 11. For example, the second semiconductor layer 13 may include at least one p-type semiconductor layer. For example, the second semiconductor layer 13 may include at least one semiconductor material among InAlGaN, GaN, AlGaN, InGaN, AlN, and InN, and may include a p-type semiconductor layer doped with a second conductive dopant (or a p-type dopant) such as Mg, Zn, Ca, Sr, or Ba. However, the material forming the second semiconductor layer 13 is not limited thereto, and other various materials may form the second semiconductor layer 13. The second semiconductor layer 13 may include a lower surface contacting the second surface of the active layer 12 along the length direction of the light emitting element LD and an upper surface exposed to the outside. Here, the upper surface of the second semiconductor layer 13 may be the other end portion (or the upper end portion) of the light emitting element LD.

In an embodiment, the first semiconductor layer 11 and the second semiconductor layer 13 may have thicknesses different from each other in the length direction of the light emitting element LD. For example, the first semiconductor layer 11 may have a thickness relatively thicker than that of the second semiconductor layer 13 along the length direction of the light emitting element LD. Therefore, the active layer 12 of the light emitting element LD may be positioned more adjacently to the upper surface of the second semiconductor layer 13 than to the lower surface of the first semiconductor layer 11.

Although the first semiconductor layer 11 and the second semiconductor layer 13 are shown as being formed of one layer or a layer, the disclosure is not limited thereto. In an embodiment, according to the material of the active layer 12, each of the first semiconductor layer 11 and the second semiconductor layer 13 may further include at least one or more layers, for example, a clad layer and/or a tensile strain barrier reducing (TSBR) layer. The TSBR layer may be a strain relief layer disposed between semiconductor layers having different lattice structures and serving as a buffer to reduce a difference of a lattice constant. The TSBR layer may be formed of a p-type semiconductor layer such as p-GaInP, p-AlInP, and p-AlGaInP, but the disclosure is not limited thereto.

According to an embodiment, the light emitting element LD may further include a contact electrode (not shown, hereinafter referred to as a "first contact electrode") disposed on the second semiconductor layer 13 in addition to the above-described first semiconductor layer 11, active layer 12, and second semiconductor layer 13. According to an embodiment, the light emitting element LD may further include another contact electrode (not shown, hereinafter referred to as a "second contact electrode") disposed at one end or an end of the first semiconductor layer 11.

Each of the first and second contact electrodes may be an ohmic contact electrode, but the disclosure is not limited thereto. According to an embodiment, the first and second contact electrodes may be schottky contact electrodes. The first and second contact electrodes may include a conductive material. For example, the first and second contact electrodes may include an opaque metal using chromium (Cr), titanium (Ti), aluminum (Al), gold (Au), nickel (Ni), oxide thereof, alloy thereof, and the like alone or in combination, but the disclosure is not limited thereto. According to an embodiment, the first and second contact electrodes may also include transparent conductive oxide such as indium tin oxide (ITO), indium zinc oxide (IZO), zinc oxide (ZnO), indium gallium zinc oxide (IGZO), and indium tin zinc oxide (ITZO).

The materials included in the first and second contact electrodes may be the same as or different from each other. The first and second contact electrodes may be substantially transparent or translucent. Therefore, the light generated by the light emitting element LD may pass through each of the first and second contact electrodes and may be emitted to the outside of the light emitting element LD. According to an embodiment, in case that the light generated by the light emitting element LD does not pass through the first and second contact electrodes and is emitted to the outside of the light emitting element LD through an area except for the both end portions of the light emitting element LD, the first and second contact electrodes may include an opaque metal.

In an embodiment, the light emitting element LD may further include an insulating layer 14 (or an insulating film). However, according to an embodiment, the insulating layer 14 may be omitted and may be provided so as to cover or overlap only a portion of the first semiconductor layer 11, the active layer 12, and the second semiconductor layer 13.

The insulating layer 14 may prevent an electrical short that may occur in case that the active layer 12 contacts a conductive material other than the first and second semiconductor layers 11 and 13. The insulating layer 14 may minimize a surface defect of the light emitting element LD to improve life and light emission efficiency of the light emitting element LD. In case that light emitting elements LD are closely disposed, the insulating layer 14 may prevent an unwanted short that may occur between the light emitting elements LD. In case that the active layer 12 may prevent an occurrence of a short with an external conductive material, presence or absence of the insulating layer 14 is not limited.

The insulating layer 14 may be provided in a form entirely surrounding an outer circumferential surface of the light emitting stack including the first semiconductor layer 11, the active layer 12, and the second semiconductor layer 13.

In the above-described embodiment, the insulating layer 14 entirely surround the outer circumferential surface of each of the first semiconductor layer 11, the active layer 12, and the second semiconductor layer 13, but the disclosure is not limited thereto. According to an embodiment, in case that the light emitting element LD may include the first contact electrode, the insulating layer 14 may entirely surround an outer circumferential surface of each of the first semiconductor layer 11, the active layer 12, the second semiconductor layer 13, and the first contact electrode. According to an embodiment, the insulating layer 14 may not entirely surround the outer circumferential surface of the first contact electrode, or may surround only a portion of the outer circumferential surface of the first contact electrode and may not surround the remaining of the outer circumferential surface of the first contact electrode. According to an embodiment, in case that the first contact electrode is disposed at the other end portion (or the upper end portion) of the light emitting element LD and the second contact electrode is disposed at the one end portion (or the lower end portion) of the light emitting element LD, the insulating layer 14 may expose at least one area or an area of each of the first and second contact electrodes.

The insulating layer 14 may include a transparent insulating material. For example, the insulating layer 14 may include at least one insulating material selected from a group consisting of silicon oxide ($SiO_x$), silicon nitride ($SiN_x$), silicon oxynitride ($SiO_xN_y$), aluminum oxide ($AlO_x$), titanium oxide ($TiO_x$), hafnium oxide ($HfO_x$), titanium strontium oxide ($SrTiO_x$), cobalt oxide ($Co_xO_y$), Magnesium oxide (MgO), zinc oxide (ZnO), rucenium oxide ($RuO_x$), nickel oxide (NiO), tungsten oxide ($WO_x$), tantalum oxide ($TaO_x$), gadolinium oxide ($GdO_x$), zirconium oxide ($ZrO_x$), gallium Oxide ($GaO_x$), vanadium oxide ($V_xO_y$), ZnO:Al, ZnO:B, InxOy:H, niobium oxide ($Nb_xO_y$), magnesium fluoride ($MgF_x$), aluminum fluoride ($AlF_x$), Alucone polymer film, titanium nitride (TiN), tantalum nitride (TaN), aluminum nitride ($AlN_x$), gallium nitride (GaN), tungsten nitride (WN), hafnium nitride (HfN), niobium nitride (NbN), gadolinium nitride (GdN), zirconium nitride (ZrN), and vanadium nitride (VN), but the disclosure is not limited thereto, and various materials having insulating properties may be used as the material of the insulating layer 14.

The insulating layer 14 may be provided in a form of a single layer, or may be provided in a form of multiple layers including at least a double layer. For example, in case that the insulating layer 14 is formed of a double layer including a first layer and a second layer sequentially stacked each other, the first layer and the second layer may be formed of different materials (or substances), and may be formed in different processes. According to an embodiment, the first layer and the second layer may be formed by a continuous process including a same material or a similar material.

According to an embodiment, the light emitting element LD may be implemented with a light emitting pattern of a core-shell structure. The above-described first semiconductor layer 11 may be positioned in a core, for example, a middle (or a center) of the light emitting element LD, the active layer 12 may be provided and/or formed in a form surrounding the outer circumferential surface of the first semiconductor layer 11, and the second semiconductor layer 13 may be provided and/or formed in a form surrounding the outer circumferential surface of the active layer 12. The light emitting element LD may further include a contact electrode (not shown) surrounding at least one side or a side of the second semiconductor layer 13. According to an embodiment, the light emitting element LD may further include the insulating layer 14 provided on an outer circumferential surface of the light emitting pattern of the core-shell structure and including a transparent insulating material. The light emitting element LD implemented with the light emitting pattern having the core-shell structure may be manufactured by a growth method.

The above-described light emitting element LD may be used as a light emitting source (or a light source) of various display devices. The light emitting element LD may be manufactured through a surface treatment process. For example, in case that light emitting elements LD are mixed in a fluid solution (or solvent) and supplied to each pixel area (for example, an emission area of each pixel or an emission area of each sub pixel), surface treatment may be performed on each of the light emitting elements LD so that the light emitting elements LD may be uniformly sprayed without being unevenly aggregated in the solution. For example, the surface treatment may be performed on the light emitting element LD to form the insulating layer 14 itself as a hydrophobic layer using a hydrophobic material. As another example, the surface treatment may be performed on the light emitting element LD to additionally form a hydrophobic film including a hydrophobic material on the insulating layer 14.

A light emitting unit (or a light emitting device) including the light emitting element LD described above may be used in various types of electronic devices that require a light source, including a display device DD. For example, in case that light emitting elements LD are disposed in a pixel area of each pixel of a display panel, the light emitting elements LD may be used as a light source of each pixel. However, an application field of the light emitting element LD is not limited to the above-described example. For example, the light emitting element LD may be used in other types of electronic devices that require a light source, such as a lighting device.

Figure 4:
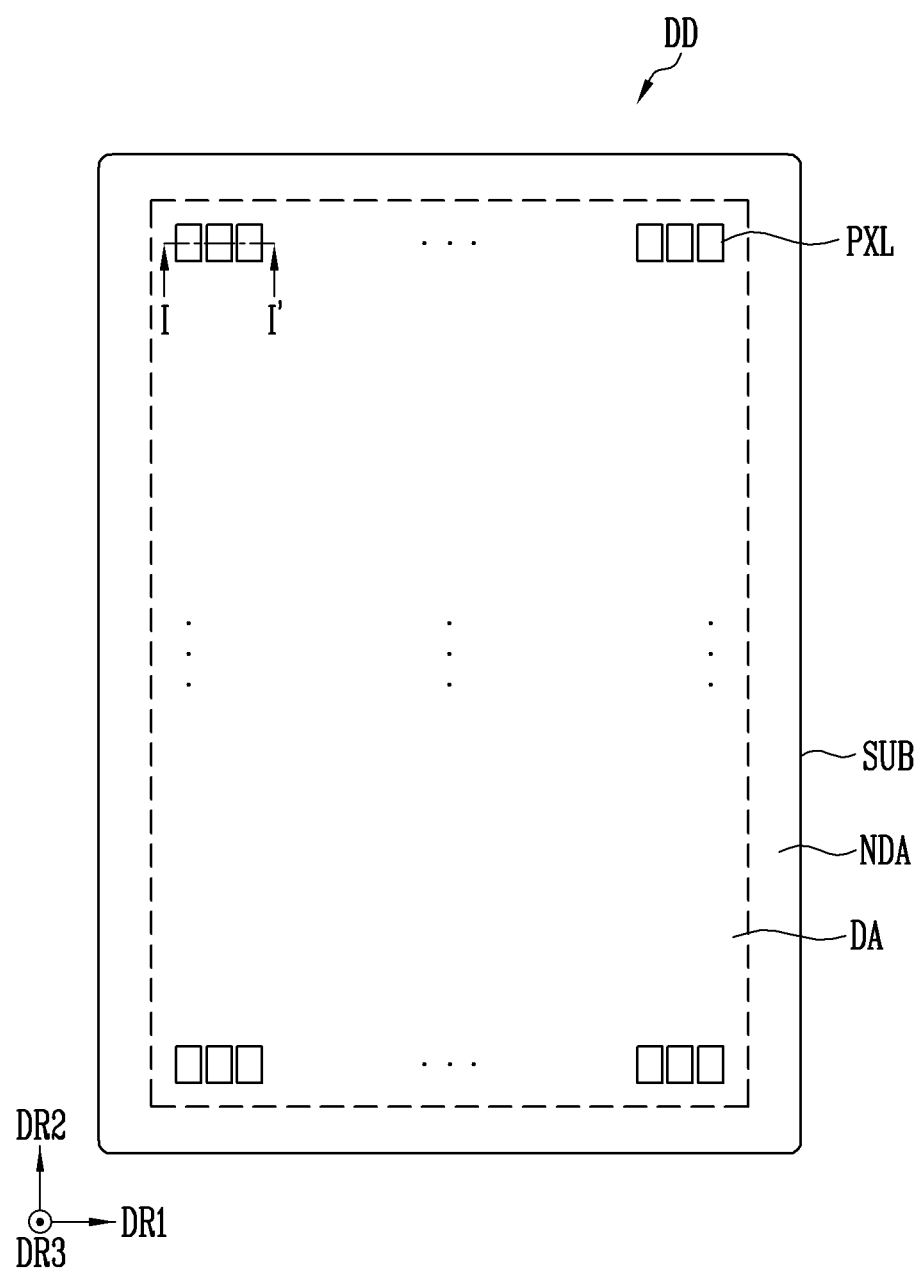
FIG. 4 is a schematic plan view schematically illustrating a display device according to an embodiment.

FIG. 4 is a schematic plan view schematically illustrating a display device according to an embodiment.

In FIG. 4, for convenience, a structure of the display device is schematically illustrated centering on a display area DA where an image is displayed.

In case that the display device DD is an electronic device to which a display surface is applied to at least one surface or a surface, such as a smartphone, a television, a tablet PC, a mobile phone, a video phone, an e-book reader, a desktop PC, a laptop PC, a netbook computer, a workstation, a server, a PDA, a portable multimedia player (PMP), an MP3 player, a medical device, a camera, or wearable device, the disclosure may be applied to the display device DD.

Referring to FIGS. 1 to 4, the display device DD may include a substrate SUB, pixels PXL provided on (or disposed on) the substrate SUB and respectively including at least one light emitting element LD, a driver driving the pixels PXL, and a line unit connecting the pixels PXL and the driver.

The display device DD may be classified into a passive matrix type display device DD and an active matrix type display device DD according to a method of driving the light emitting element LD. For example, in case that the display device is implemented as an active matrix type, each of the pixels PXL may include a driving transistor that controls a current amount supplied to the light emitting element LD, a switching transistor that transfers a data signal to the driving transistor, and the like within the spirit and the scope of the disclosure.

The display device DD may be provided in various shapes, and for example, may be provided in a rectangular plate shape having two pairs of sides parallel to each other, but the disclosure is not limited thereto. In case that the display device DD is provided in the rectangular plate shape, one pair of sides of the two pairs of sides may be provided to be longer than the other pair of sides. For convenience, a case where the display device DD has a rectangular shape having a pair of long sides and a pair of short sides is disclosed. An extension direction of the long side is denoted as a first direction DR2, an extension direction of the short side is denoted as a second direction DR1, and a thickness direction of the substrate SUB is denoted as a third direction DR3. In the display device DD provided in the rectangular plate shape, a corner portion in which one long side and one short side contact (or meet) may have a round shape.

The substrate SUB may include the display area DA and a non-display area NDA.

The display area DA may be an area where the pixels PXL displaying an image are provided. The non-display area NDA may be an area in which the driver for driving the pixels PXL and a portion of the line unit connecting the pixels PXL and the driver are provided.

The non-display area NDA may be positioned adjacent to the display area DA. The non-display area NDA may be provided on at least one side or a side of the display area DA. For example, the non-display area NDA may surround a circumference (or an edge) of the display area DA. The line unit electrically connected to the pixels PXL and the driver electrically connected to the line unit and driving the pixels PXL may be provided in the non-display area NDA.

The line unit may electrically connect the driver and the pixels PXL. The line unit may include a fan-out line electrically connected to signal lines providing a signal to the pixel PXL and electrically connected to each pixel PXL, for example, a scan line, a data line, an emission control line, or the like within the spirit and the scope of the disclosure. According to an embodiment, the line unit may include a fan-out line electrically connected to signal lines electrically connected to each pixel PXL to compensate for an electrical characteristic change of each pixel PXL in real time, for example, a control line, a sensing line, or the like within the spirit and the scope of the disclosure. The line unit may include a fan-out line electrically connected to power lines providing a voltage to each pixel PXL and electrically connected to each pixel PXL.

The substrate SUB may include a transparent insulating material and may transmit light. The substrate SUB may be a rigid substrate or a flexible substrate.

One area or an area on the substrate SUB may be provided as the display area DA and thus the pixels PXL may be disposed. The remaining area on the substrate SUB may be provided as the non-display area NDA. For example, the substrate SUB may include the display area DA including pixel areas in which each pixel PXL is disposed, and the non-display area NDA disposed around the display area DA (or adjacent to the display area DA).

Each of the pixels PXL may be provided in the pixel area in the display area DA on the substrate SUB. In an embodiment, the pixels PXL may be arranged or disposed in the display area DA in a stripe arrangement structure, but the disclosure is not limited thereto.

Each of the pixels PXL may include at least one light emitting element LD driven by corresponding scan signal and data signal. The light emitting element LD may have a size as small as a nano scale (or nano meter) to a micro scale (or micrometer) and may be electrically connected in parallel with adjacent light emitting elements, but the disclosure is not limited thereto. The light emitting element LD may form a light source of each of the pixels PXL.

Each of the pixels PXL may include at least one light source driven by a signal (for example, a scan signal, a data signal, and the like) and/or power (for example, first driving power, second driving power, and the like), for example, the light emitting element LD shown in FIGS. 1 to 3. However, the type of the light emitting element LD that may be used as the light source of each of the pixels PXL is not limited thereto.

The driver may supply a signal and power to each pixel PXL through the line unit, and thus may control driving of the pixel PXL.

Figure 5:
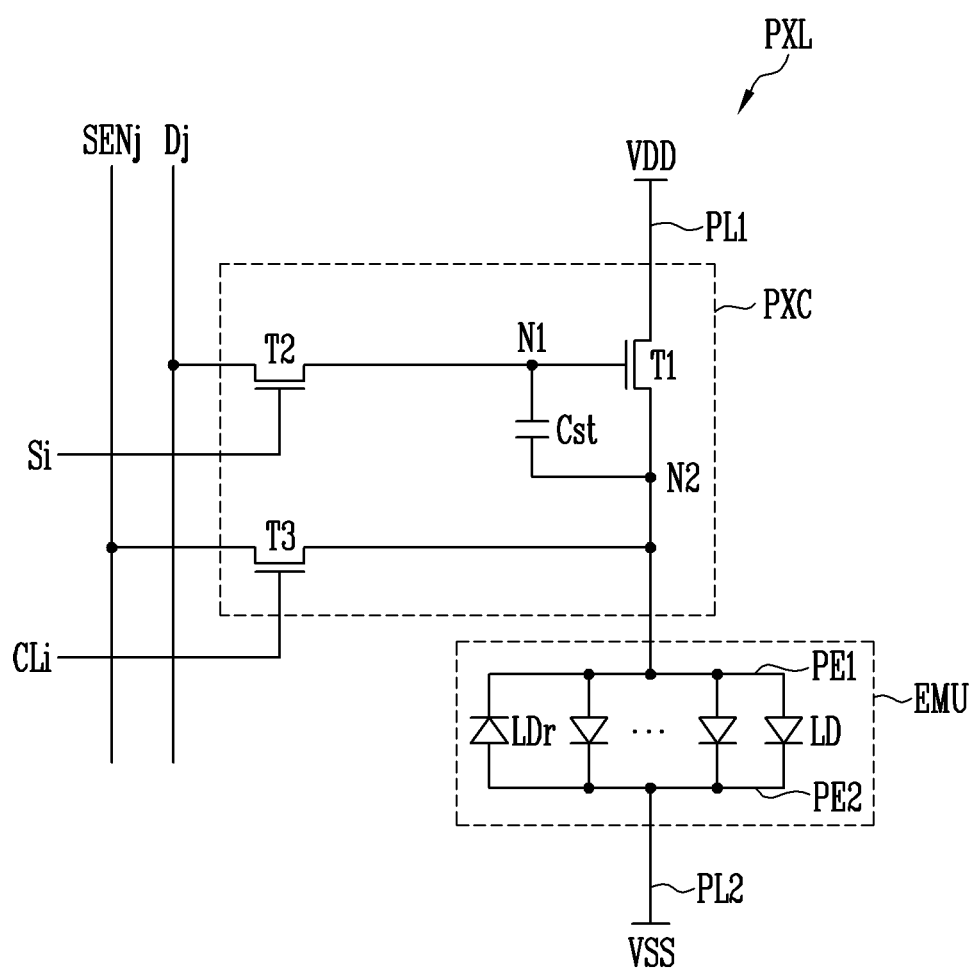
FIGS. 5 and 6 are circuit diagrams illustrating an electrical connection relationship between components included in a pixel shown in FIG. 4 according to various embodiments.
Figure 6:
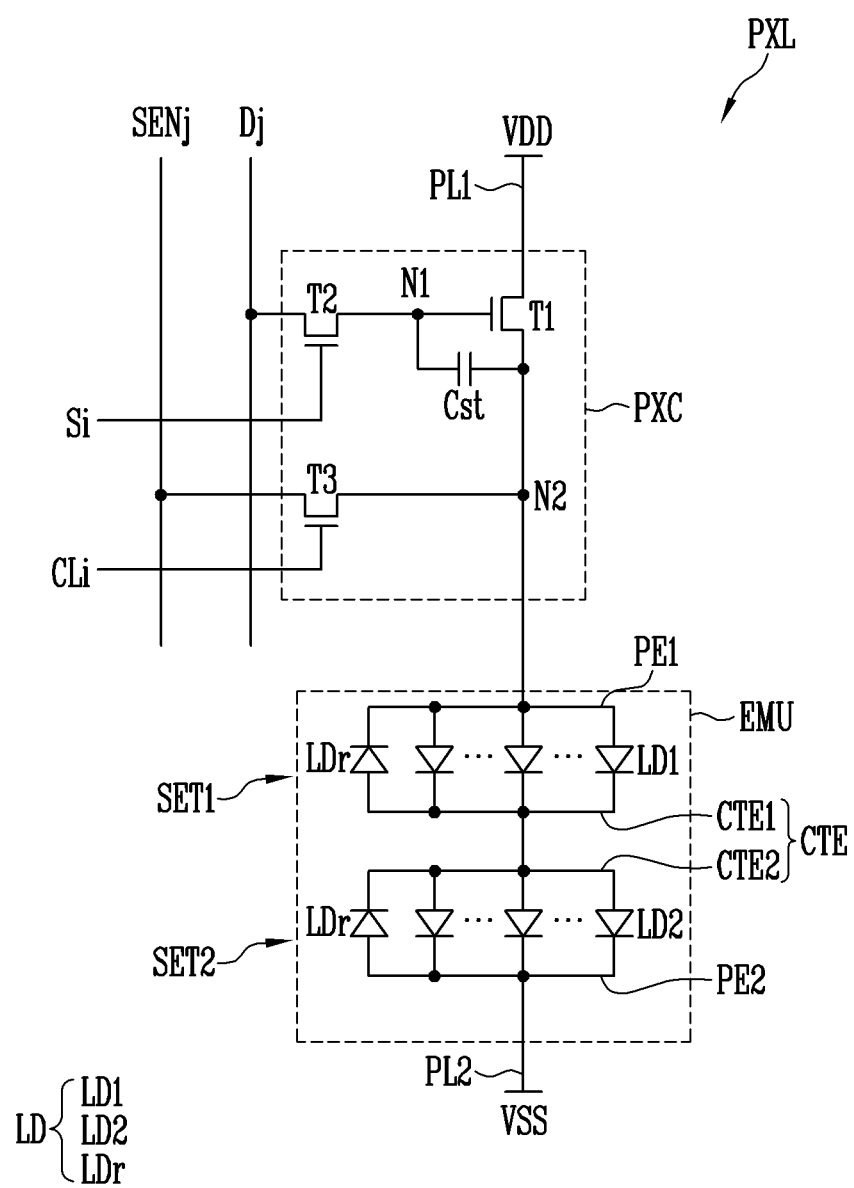

FIGS. 5 and 6 are circuit diagrams illustrating an electrical connection relationship between components included in the pixel PXL shown in FIG. 4 according to various embodiments.

For example, FIGS. 5 and 6 illustrate the electrical connection relationship between the components included in the pixel PXL that may be applied to an active matrix type display device DD according to various embodiments. However, types of the components included in the pixel PXL that may be applied to the embodiment of the disclosure are not limited thereto.

In FIGS. 5 and 6, not only the components included in the pixel PXL shown in FIG. 4, but also an area in which the components are provided (or positioned) are collectively referred to as the pixel PXL.

Referring to FIGS. 1 to 6, the pixel PXL may include a light emitting unit EMU (or a light emitting part) that generates light of a luminance corresponding to a data signal. The pixel PXL may selectively further include a pixel circuit PXC for driving the light emitting unit EMU.

According to an embodiment, the light emitting unit EMU may include light emitting elements LD electrically connected in parallel between a first power line PL1 electrically connected to first driving power VDD to which a voltage of the first driving power VDD is applied and a second power line PL2 electrically connected to second driving power VSS to which a voltage of second driving power VSS is applied. For example, the light emitting unit EMU may include a first pixel electrode PE1 electrically connected to the first driving power VDD through the pixel circuit PXC and the first power line PL1, a second pixel electrode PE2 electrically connected to the second driving power VSS through the second power line PL2, and the light emitting elements LD electrically connected in parallel in a same direction between the first and second pixel electrodes PE1 and PE2. In an embodiment, the first pixel electrode PE1 may be an anode, and the second pixel electrode PE2 may be a cathode.

Each of the light emitting elements LD included in the light emitting unit EMU may include one end electrically connected to the first driving power VDD through the first pixel electrode PE1 and another end electrically connected to the second driving power VSS through the second pixel electrode PE2. The first driving power VDD and the second driving power VSS may have different potentials. For example, the first driving power VDD may be set as high potential power, and the second driving power VSS may be set as low potential power. At this time, a potential difference between the first driving power VDD and the second driving power VSS may be set as a threshold voltage or more of the light emitting elements LD during an emission period of the pixel PXL.

As described above, the respective light emitting elements LD electrically connected in parallel in a same direction (for example, a forward direction) between the first pixel electrode PE1 and the second pixel electrode PE2 to which the voltages of the different power are supplied may form respective effective light sources.

The light emitting elements LD of the light emitting unit EMU may emit light with a luminance corresponding to a driving current supplied through a corresponding pixel circuit PXC. For example, a driving current corresponding to a grayscale value of corresponding frame data of the pixel circuit PXC may be supplied to the light emitting unit EMU during each frame period. The driving current supplied to the light emitting unit EMU may be divided and flow to each of the light emitting elements LD. Therefore, each of the light emitting elements LD may emit light with a luminance corresponding to the current flowing through the light emitting element LD, and thus the light emitting unit EMU may emit light of the luminance corresponding to the driving current.

An embodiment in which both end portions of the light emitting elements LD are electrically connected in a same direction between the first and second driving power VDD and VSS is described, but the disclosure is not limited thereto. According to an embodiment, the light emitting unit EMU may further include at least one ineffective light source, for example, a reverse light emitting element LDr, in addition to the light emitting elements LD forming each effective light source. The reverse light emitting element LDr may be electrically connected in parallel between the first and second pixel electrodes PE1 and PE2 together with the light emitting elements LD forming the effective light sources, and may be electrically connected between the first and second pixel electrodes PE1 and PE2 in a direction opposite to the light emitting elements LD. The reverse light emitting element LDr maintains an inactive state even though a driving voltage (for example, a driving voltage of a forward direction) is applied between the first and second pixel electrodes PE1 and PE2, and thus a current substantially does not flow through the reverse light emitting element LDr.

The pixel circuit PXC may be electrically connected to a scan line Si and a data line Dj of the pixel PXL. The pixel circuit PXC may be electrically connected to a control line CLi and a sensing line SENj of the pixel PXL. For example, in case that the pixel PXL is disposed in an i-th row and a j-th column of the display area DA, the pixel circuit PXC of the pixel PXL may be electrically connected to the i-th scan line Si and the j-th data line Dj, the i-th control line CLi, and the j-th sensing line SENj of the display area DA.

The pixel circuit PXC may include first to third transistors T1 to T3 and a storage capacitor Cst.

The first transistor T1 may be a driving transistor for controlling the driving current applied to the light emitting unit EMU, and may be electrically connected between the first driving power VDD and the light emitting unit EMU. By way of example, a first terminal of the first transistor T1 may be connected (or coupled) to the first driving power VDD through the first power line PL1, a second terminal of the first transistor T1 may be electrically connected to a second node N2, and a gate electrode of the first transistor T1 may be electrically connected to a first node N1. The first transistor T1 may control an amount of the driving current applied from the first driving power VDD to the light emitting unit EMU through the second node N2, according to a voltage applied to the first node N1. In an embodiment, the first terminal of the first transistor T1 may be a drain electrode, and the second terminal of the first transistor T1 may be a source electrode, but the disclosure is not limited thereto. According to an embodiment, the first terminal may be a source electrode and the second terminal may be a drain electrode.

The second transistor T2 may be a switching transistor that selects the pixel PXL in response to a scan signal and activates the pixel PXL, and may be electrically connected between the data line Dj and the first node N1. A first terminal of the second transistor T2 may be electrically connected to the data line Dj, a second terminal of the second transistor T2 may be electrically connected to the first node N1, and a gate electrode of the second transistor T2 may be electrically connected to the scan line Si. The first terminal and the second terminal of the second transistor T2 may be different terminals. For example, in case that the first terminal is a drain electrode, the second terminal may be a source electrode.

The second transistor T2 may be turned on in case that a scan signal of a gate-on voltage (for example, a high level voltage) is supplied from the scan line Si, to electrically connect the data line Dj and the first node N1. The first node N1 may be a point where the second terminal of the second transistor T2 and the gate electrode of the first transistor T1 are electrically connected, and the second transistor T2 may transmit a data signal to the gate electrode of the first transistor T1.

The third transistor T3 may connect the first transistor T1 to the sensing line SENj to obtain a sensing signal through the sensing line SENj, and detect a characteristic of each pixel PXL including a threshold voltage and the like of the first transistor T1 using the sensing signal. Information on the characteristic of each pixel PXL may be used to convert image data so that a characteristic deviation between the pixels PXL may be compensated. A second terminal of the third transistor T3 may be electrically connected to the second terminal of the first transistor T1, a first terminal of the third transistor T3 may be electrically connected to the sensing line SENj, and a gate electrode of the third transistor T3 may be electrically connected to the control line CLi. The first terminal of the third transistor T3 may be electrically connected to initialization power. The third transistor T3 may be an initialization transistor that initializes the second node N2, and may be turned on in case that a sensing control signal is supplied from the control line CLi, to transmit a voltage of the initialization power to the second node N2.

Accordingly, a second storage electrode of the storage capacitor Cst electrically connected to the second node N2 may be initialized.

A first storage electrode of the storage capacitor Cst may be electrically connected to the first node N1, and the second storage electrode of the storage capacitor Cst may be electrically connected to the second node N2. The storage capacitor Cst charges a data voltage corresponding to the data signal supplied to the first node N1 during one frame period. Accordingly, the storage capacitor Cst may store a voltage corresponding to a voltage difference between a voltage of the gate electrode of the first transistor T1 and a voltage of the second node N2.

Although FIG. 5 shows an embodiment in which all of the light emitting elements LD forming the light emitting unit EMU are electrically connected in parallel, the disclosure is not limited thereto. According to an embodiment, the light emitting unit EMU may be formed to include at least one series stage including the light emitting elements LD electrically connected in parallel with each other. For example, the light emitting unit EMU may be formed in a series/parallel mixed structure as shown in FIG. 5.

Referring to FIG. 6, the light emitting unit EMU may include first and second stages SET1 and SET2 sequentially electrically connected between the first and second driving power VDD and VSS. Each of the first and second stages SET1 and SET2 may include two electrodes PE1 and CTE1, and CTE2 and PE2 forming an electrode pair of a corresponding series stage, and the light emitting elements LD electrically connected in parallel in a same direction between the two electrodes PE1 and CTE1, and CTE2 and PE2.

The first series stage SET1 may include the first pixel electrode PE1, a first intermediate electrode CTE1, and at least one first light emitting element LD1 electrically connected between the first pixel electrode PE1 and the first intermediate electrode CTE1. The first series stage SET1 may include the reverse light emitting element LDr electrically connected in a direction opposite to the first light emitting element LD1 between the first pixel electrode PE1 and the first intermediate electrode CTE1.

The second series stage SET2 may include a second intermediate electrode CTE2, the second pixel electrode PE2, and at least one second light emitting element LD2 electrically connected between the second intermediate electrode CTE2 and the second pixel electrode PE2. The second series stage SET2 may include the reverse light emitting element LDr electrically connected in a direction opposite to the second light emitting element LD2 between the second intermediate electrode CTE2 and the second pixel electrode PE2.

The first intermediate electrode CTE1 and the second intermediate electrode CTE2 may be electrically or physically connected to each other. The first intermediate electrode CTE1 and the second intermediate electrode CTE2 may form an intermediate electrode CTE that electrically connects the continuous first series stage SET1 and second series stage SET2.

In the above-described embodiment, the first pixel electrode PE1 of the first series stage SET1 may be the anode of each pixel PXL, and the second pixel electrode PE2 of the second series stage SET2 may be the cathode of the corresponding pixel PXL.

As described above, the light emitting unit EMU of the pixel PXL including the series stages SET1 and SET2 (or the light emitting elements LD) electrically connected in a series/parallel mixed structure may readily adjust a driving current or voltage condition according to an applied product specification.

For example, the light emitting unit EMU of the pixel PXL including the series stages SET1 and SET2 (or the light emitting elements LD) electrically connected in the series/parallel mixed structure may reduce a driving current compared to the light emitting unit of a structure in which the light emitting elements LD are electrically connected only in parallel. The light emitting unit EMU of the pixel PXL including the series stages SET1 and SET2 electrically connected in the series/parallel mixed structure may reduce a driving voltage applied to both ends of the light emitting unit EMU compared to the light emitting unit in which all of the same number of light emitting elements LD are electrically connected in series. Furthermore, the light emitting unit EMU of the pixel PXL including the series stages SET1 and SET2 (or the light emitting elements LD electrically connected in the series/parallel mixed structure may include a greater number of light emitting elements LD between the same number of electrodes PE1, CTE1, CTE2, and PE2 compared to the light emitting unit of a structure in which all of the series stages are electrically connected in series. Light emission efficiency of the light emitting elements LD may be improved, and even though a defect occurs in a specific or given series stage, a ratio of the light emitting elements LD that do not emit light due to the defect may be relatively reduced, and thus a reduction of light emission efficiency of the light emitting elements LD may be alleviated.

FIGS. 5 and 6 disclose an embodiment in which all of the first, second, and third transistors T1, T2, and T3 included in the pixel circuit PXC are N-type transistors, but the disclosure is not limited thereto. For example, at least one of the above-described first, second, and third transistors T1, T2, and T3 may be changed to a P-type transistor. FIGS. 5 and 6 disclose an embodiment in which the light emitting unit EMU is electrically connected between the pixel circuit PXC and the second driving power VSS, but the light emitting unit EMU may be electrically connected between the first driving power VDD and the pixel circuit PXC.

A structure of the pixel circuit PXC may be variously changed. For example, the pixel circuit PXC may further include at least one transistor element such as a transistor element for initializing the first node N1, and/or a transistor element for controlling an emission time of the light emitting elements LD, and other circuit elements such as a boosting capacitor for boosting the voltage of the first node N1.

A structure of the pixel PXL that may be applied to the disclosure is not limited to the embodiments shown in FIGS. 5 and 6, and the corresponding pixel PXL may have various structures. For example, each pixel PXL may be formed inside a passive light emitting display device DD or the like within the spirit and the scope of the disclosure. The pixel circuit PXC may be omitted, and the both end portions of the light emitting elements LD included in the light emitting unit EMU may be electrically connected to or directly electrically connected to the scan line Si, the data line Dj, the first power line PL1 to which the first driving power VDD is applied, the second power line PL2 to which the second driving power VSS is applied, a control line, and/or the like within the spirit and the scope of the disclosure.

Figure 7:
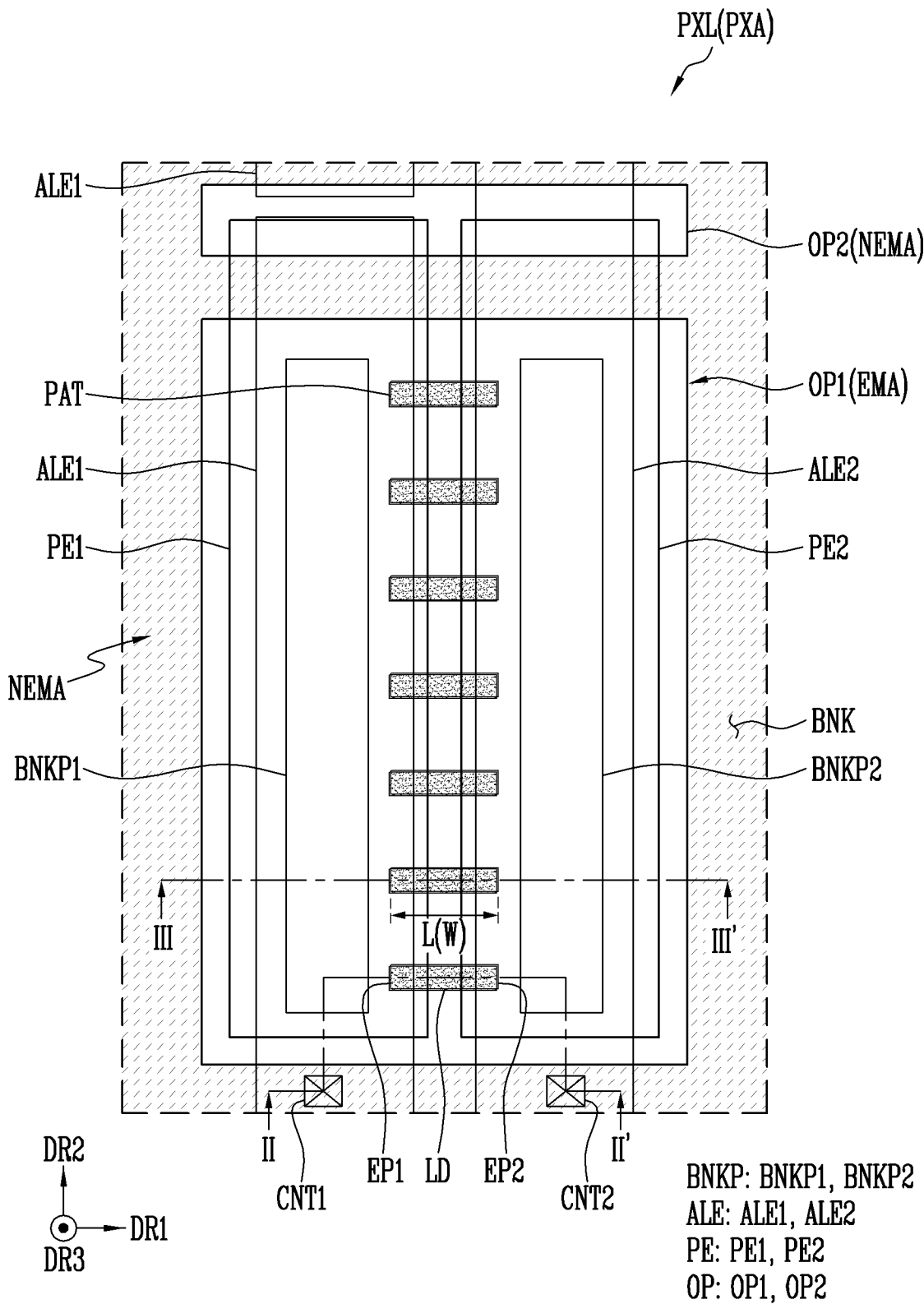
FIG. 7 is a schematic plan view schematically illustrating the pixel shown in FIG. 4.

FIG. 7 is a schematic plan view schematically illustrating the pixel PXL shown in FIG. 4.

In FIG. 7, illustration of transistors electrically connected to the light emitting elements LD and signal lines electrically connected to the transistors is omitted for convenience.

In FIG. 7, for convenience of description, a horizontal direction on a plane is denoted as the first direction DR1, a vertical direction on the plane is denoted as the second direction DR2, and the thickness direction of the substrate SUB is denoted as the third direction DR3. The first, second, and third directions DR1, DR2, and DR3 may refer to directions indicated by the first, second, and third directions DR1, DR2, and DR3, respectively.

In an embodiment, the term "connection" between two components may mean both of an electrical connection and a physical connection collectively, but is not limited thereto.

Referring to FIGS. 1 to 5 and 7, the pixel PXL may be positioned in a pixel area PXA arranged or disposed (or provided) on the substrate SUB. The pixel area PXA may include an emission area EMA and a non-emission area NEMA.

The pixel PXL may include a bank BNK positioned in the non-emission area NEMA.

The bank BNK may be a structure defining (or partitioning) the pixel area (or the emission area EMA) of each of the pixel PXL and adjacent pixels PXL adjacent thereto, and may be, for example, a pixel defining layer.

In an embodiment, the bank BNK may be a pixel defining layer or a dam structure that defines each emission area EMA where the light emitting elements LD are to be supplied in a process of supplying (or inputting) the light emitting elements LD to the pixel PXL. For example, a liquid mixture (for example, an ink) including the light emitting element LD of a targeted amount and/or type may be supplied (or input) to the emission area EMA by dividing the emission area EMA of the pixel PXL by the bank BNK.

The bank BNK may be formed to include at least one light blocking material and/or reflective material to prevent a light leakage defect in which light leaks between the pixel PXL and the pixels PXL adjacent thereto. According to an embodiment, the bank BNK may include a transparent material (or substance). The transparent material may include, for example, polyamides resin, polyimides resin, or the like, but the disclosure is not limited thereto. According to an embodiment, a reflective layer may be separately provided and/or formed on the bank BNK in order to further improve efficiency of light emitted from the pixel PXL.

The bank BNK may include at least one opening OP exposing configurations positioned under or below the bank BNK. For example, the bank BNK may include a first opening OP1 and a second opening OP2 exposing configurations positioned under or below the bank BNK in the pixel area PXA. In an embodiment, the emission area EMA of the pixel PXL and the first opening OP1 of the bank BNK may correspond to each other.

In the pixel area PXA, the second opening OP2 may be positioned to be spaced from the first opening OP1 and may be positioned adjacent to one side or a side, for example, an upper side, of the pixel area PXA.

In an embodiment, the second opening OP2 may be an electrode separation area in which at least one alignment electrode ALE is separated from at least one alignment electrode ALE provided to the pixels PXL adjacent in the second direction DR2.

Surface treatment may be performed on the bank BNK so that at least one surface or a surface of the bank BNK may have hydrophobicity. For example, the surface treatment may be performed on the bank BNK to have hydrophobicity by plasma before the light emitting elements LD are aligned.

The pixel PXL may include pixel electrodes PE provided at least in the emission area EMA, the light emitting elements LD electrically connected to the pixel electrodes PE, patterns PAT overlapping the light emitting elements LD, alignment electrodes ALE provided at a position corresponding to the pixel electrodes PE, and bank patterns BNKP provided under or below the alignment electrodes ALE so that each of the bank patterns BNKP overlaps at least one alignment electrode ALE. For example, the pixel PXL may include the first and second pixel electrodes PE1 and PE2 provided at least in the emission area EMA, the light emitting elements LD, the patterns PAT, the first and second alignments electrodes ALE1 and ALE2, and first and second bank patterns BNKP1 and BNKP2.

The pixel PXL may include at least one pair of pixel electrodes PE, at least one pair of alignment electrodes ALE, and/or the bank patterns BNKP. The number, shape, size, arrangement structure, and the like of each of the pixel electrodes PE, the alignment electrodes ALE, and/or the bank patterns BNKP may be variously changed according to a structure of the pixel PXL (for example, the light emitting unit EMU).

In an embodiment, the bank patterns BNKP, the alignment electrodes ALE, the patterns PAT, the light emitting elements LD, and the pixel electrodes PE are sequentially provided based on one surface or a surface of the substrate SUB on which the pixel PXL is provided, but the disclosure is not limited thereto. According to an embodiment, a position and a formation order of electrode patterns and/or the insulating layer forming the pixel PXL may be variously changed. A description of a stack structure of the pixel PXL is described later with reference to FIGS. 8 to 14.

The bank patterns BNKP may be provided at least in the emission area EMA, may be spaced from each other in the first direction DR1 in the emission area EMA, and may each extend along the second direction DR2.

Each bank pattern BNKP (also referred to as a "wall pattern", a "protrusion pattern" or a "support pattern") may have a uniform width in the emission area EMA. For example, each of the first and second bank patterns BNKP1 and BNKP2 may have a bar shape having a constant width along an extension direction in the emission area EMA in case that viewed in a plan view.

The bank pattern BNKP may be a support member that supports each of the first and second alignment electrodes ALE1 and ALE2 in order to change a surface profile (or a shape) of each of the first and second alignment electrodes ALE1 and ALE2 to guide the light emitted from the light emitting elements LD in an image display direction of the display device DD.

The bank patterns BNKP may have the same or different widths. For example, first and second bank patterns BNKP1 and BNKP2 may have the same or different widths in the first direction DR1 at least in the emission area EMA.

Each of the first and second bank patterns BNKP1 and BNKP2 may partially overlap at least one alignment electrode ALE at least in the emission area EMA. For example, the first bank pattern BNKP1 may be positioned under or below the first alignment electrode ALE1 to overlap one area or an area of the first alignment electrode ALE1, and the second bank pattern BNKP2 may be positioned under or below the second alignment electrode ALE2 to overlap one area or an area of the second alignment electrode ALE2.

As the bank patterns BNKP are provided under or below one area or an area of each of the alignment electrodes ALE in the emission area EMA, one area or an area of each of the alignment electrodes ALE may protrude in an upper direction of the pixel PXL in an area where the bank patterns BNKP are formed. Accordingly, a wall structure may be formed around the light emitting elements LD. For example, the wall structure may be formed in the emission area EMA to face the first and second end portions EP1 and EP2 of the light emitting elements LD.

In an embodiment, in case that the bank patterns BNKP and/or the alignment electrodes ALE include a reflective material, a reflective wall structure may be formed around the light emitting elements LD. Accordingly, as the light emitted from the light emitting elements LD is directed in the upper direction of the pixel PXL (for example, the image display direction of the display device DD), the light efficiency of the pixel PXL may be further improved.

The alignment electrodes ALE may be positioned at least in the emission area EMA, may be spaced from each other along the first direction DR1 in the emission area EMA, and may each extend in the second direction DR2. The alignment electrodes ALE may be partially removed from the second opening OP2 of the bank BNK to be separated from the alignment electrodes ALE of the pixels PXL adjacent in the second direction DR2.

In an embodiment, the alignment electrodes ALE may include a first alignment electrode ALE1 (or a first alignment line) and a second alignment electrode ALE2 (or a second alignment line) arranged or disposed to be spaced from each other in the first direction DR1.

At least one of the first and second alignment electrodes ALE1 and ALE2 may be separated from another electrode (for example, the alignment electrode ALE provided to each of the adjacent pixels PXL adjacent in the second direction DR2) in the second opening OP2 (or the electrode separation area) of the bank BNK after the light emitting elements LD are supplied and aligned to the pixel area PXA (or the emission area EMA) in a manufacturing process of the display device DD. For example, one end of the first alignment electrode ALE1 may be separated from the first alignment electrode ALE1 positioned above the corresponding pixel PXL in the second direction DR2 within the second opening OP2 of the bank BNK.

The first alignment electrode ALE1 may be electrically connected to the first transistor T1 described with reference to FIGS. 5 and 6 through a first contact portion CNT1, and the second alignment electrode ALE2 may be electrically connected to the second power line PL2 described with reference to FIGS. 5 and 6 through a second contact portion CNT2.

The first contact portion CNT1 may be formed by removing a portion of at least one insulating layer positioned between the first alignment electrode ALE1 and the first transistor T1, and the second contact portion CNT2 may be formed by removing a portion of at least one insulating layer positioned between the second alignment electrode ALE2 and the second power line PL2. The first contact portion CNT1 and the second contact portion CNT2 may be positioned in the non-emission area EMA to overlap the bank BNK, but the disclosure is not limited thereto. According to an embodiment, the first and second contact portions CNT1 and CNT2 may be positioned in the second opening OP2 of the bank BNK, which is the electrode separation area, or may be positioned in the emission area EMA.

The first alignment electrode ALE1 may be positioned on the first bank pattern BNKP1 at least in the emission area EMA to overlap the first bank pattern BNKP1. The second alignment electrode ALE2 may be positioned on the second bank pattern BNKP2 at least in the emission area EMA to overlap the second bank pattern BNKP2. As described above, each of the first and second alignment electrodes ALE1 and ALE2 may be provided and/or formed on the corresponding bank pattern BNKP, and may have a surface profile corresponding to a shape of the bank pattern BNKP disposed thereunder. Accordingly, the light emitted from the light emitting elements LD may be reflected by each of the first and second alignment electrodes ALE1 and ALE2 and further proceed in the third direction DR3. The bank pattern BNKP and the alignment electrodes ALE1 may be used as a reflective member to improve the light efficiency of the display device DD by guiding the light emitted from the light emitting elements LD in a desired direction. Accordingly, the light emission efficiency of the light emitting elements LD may be improved in each pixel PXL.

Each of the first alignment electrode ALE1 and the second alignment electrode ALE2 may receive a signal (or an alignment signal) from an alignment pad (not shown) positioned in the non-display area NDA in an alignment step of the light emitting elements LD. For example, the first alignment electrode ALE1 may receive a first alignment signal (or a first alignment voltage) from a first alignment pad, and the second alignment electrode ALE2 may receive a second alignment signal (or a second alignment voltage) from a second alignment pad. The above-described first and second alignment signals may be signals having a voltage difference and/or a phase difference of a degree that the light emitting elements LD may be aligned between the first and second alignment electrodes ALE1 and ALE2. At least one of the first and second alignment signals may be an AC signal, but is not limited thereto.

Each alignment electrode ALE may be provided in a bar shape having a constant width along the second direction DR2, but is not limited thereto. According to an embodiment, each alignment electrode ALE may or may not have a curved portion in the non-emission area NEMA and/or the second opening OP2 of the bank BNK, which is the electrode separation area, and a shape and/or a size in remaining areas except for the emission area EMA are/is not particularly limited and may be variously changed.

At least two to tens of light emitting elements LD may be arranged or disposed and/or provided in the emission area EMA (or the pixel area PXA), but the number of the light emitting elements LD is limited thereto. According to an embodiment, the number of light emitting elements LD arranged or disposed and/or provided in the emission area EMA (or the pixel area PXA) may be variously changed.

The light emitting elements LD may be disposed between the first alignment electrode ALE1 and the second alignment electrode ALE2. Each of the light emitting elements LD may be the light emitting element LD described with reference to FIGS. 1 and 3. Each of the light emitting elements LD may include the first end portion EP1 portion (or one end portion) and the second end portion EP2 (or the other end portion) positioned at both ends in the length L direction. In an embodiment, the second semiconductor layer 13 including the p-type semiconductor layer may be positioned at the first end portion EP1, and the first semiconductor layer 11 including the n-type semiconductor layer may be positioned at the second end portion EP2. The light emitting elements LD may be electrically connected in parallel between the first alignment electrode ALE1 and the second alignment electrode ALE2.

Each of the light emitting elements LD may emit any one of color light and/or white light. Each of the light emitting elements LD may be aligned between the first alignment electrode ALE1 and the second alignment electrode ALE2 so that the length direction is parallel to the first direction DR1. According to an embodiment, at least some or a number of the light emitting elements LD may be aligned between the first alignment electrode ALE1 and the second alignment electrode ALE2 so as not to be completely parallel to the first direction DR1. For example, some or a number of the light emitting elements LD may be aligned between the first alignment electrode ALE1 and the second alignment electrode ALE2 so as to be inclined in the first direction DR1. The light emitting elements LD may be provided in a form of being sprayed in a solution and input (or supplied) to the pixel area PXA (or the emission area EMA).

The light emitting elements LD may be input (or supplied) to the pixel area PXA (or the emission area EMA) through an inkjet printing method, a slit coating method, or other various methods. For example, the light emitting elements LD may be mixed with a volatile solvent and input (or supplied) to the pixel area PXA through an inkjet printing method or a slit coating method. In case that an alignment signal corresponding to each of the first alignment electrode ALE1 and the second alignment electrode ALE2 is applied, an electric field may be formed between the first alignment electrode ALE1 and the second alignment electrode ALE2. Accordingly, the light emitting elements LD may be aligned between the first alignment electrode ALE1 and the second alignment electrode ALE2. After the light emitting elements LD are aligned, the light emitting elements LD may be stably aligned between the first alignment electrode ALE1 and the second alignment electrode ALE2 by volatilizing the solvent or removing the solvent in other methods.

Each of the light emitting elements LD may be a light emitting diode using a material of an inorganic crystalline structure, for example, as small as a nano scale (or nanometer) to a micro scale (or micrometer). For example, each of the light emitting elements LD may be the light emitting element LD described with reference to FIGS. 1 to 3. For example, surface treatment may be performed on each of the light emitting elements LD so that an outer circumferential surface has hydrophobicity.

The patterns PAT may be positioned under or below the light emitting elements LD between the first alignment electrode ALE1 and the second alignment electrode ALE2 to overlap the light emitting elements LD. For example, each pattern PAT may be positioned under or below the corresponding light emitting element LD between the first alignment electrode ALE1 and the second alignment electrode ALE2 at least in the emission area EMA and may overlap the light emitting element LD.

The patterns PAT may be an organic layer including a hydrophilic material. For example, the patterns PAT may be self-assembled monolayer (SAM). The SAM may mean a uniformly aligned monolayer having a relatively long alkyl group and using a self-assembly phenomenon for two-dimensional alignment on a surface of a base member, by using molecules having a functional group capable of covalent bonding by interacting with the base member (for example, the substrate SUB, or the like) disposed under or below at an end (or a terminal). The functional group of the molecules may be adsorbed and combined to the surface of the base member, and the alkyl groups may be two-dimensionally aligned with each other by hydrophobic attraction to form a self-assembled organic monolayer. Such self-assembled organic monolayer may control a formation process at a molecule level, may selectively and variously change the functional group of the molecule, may also control the functional group of the molecule, may have strong bonding to the surface of the base member, may be excellent stability of a membrane, and may be readily removed as necessary. In an embodiment, the pattern PAT may be an SAM having a hydrophilic group (or a hydrophilic functional group).

Each of the patterns PAT may be disposed in an island shape in the pixel area PXA. The patterns PAT may be a portion of the SAM (or an organic layer) that is not removed and that remains in an etching process using the light emitting elements LD as an etching mask during the etching process using oxygen plasma that is performed after a step of aligning the light emitting elements LD. Accordingly, the patterns PAT may have the same plane shape as the light emitting elements LD. A width W of each of the patterns PAT may be the same as the length L of each of the light emitting elements LD in the first direction DR1. However, the disclosure is not limited thereto, and according to an embodiment, the patterns PAT may have a plane shapes different from that of the light emitting elements LD.

In the above-described embodiment, the light emitting elements LD overlap the patterns PAT, respectively, and thus the number of light emitting elements LD and the number of patterns PAT are the same, but the disclosure is not limited thereto. According to an embodiment, one pattern PAT may overlap light emitting elements LD disposed in one pixel PXL. For example, the number of patterns PAT disposed in one pixel PXL may be less than the number of light emitting elements LD. A detailed description thereof is described later with reference to FIGS. 18A and 18B.

The pixel electrodes PE (or electrodes) are provided at least in the emission area EMA, and may be provided at a position corresponding to at least one alignment electrode ALE and the light emitting elements LD, respectively. For example, each pixel electrode PE may be formed on each alignment electrode ALE and the corresponding light emitting elements LD to overlap each alignment electrode ALE and the corresponding light emitting elements LD, and may be electrically connected to at least the light emitting elements LD.

The first pixel electrode PE1 ("first electrode", or "anode") may be formed on the first alignment electrode ALE1 and the first end portion EP1 of each of and the light emitting elements LD, and may be electrically connected to the first end portion EP1 of each of the light emitting elements LD. At least in the emission area EMA, the first pixel electrode PE1 may be in contact with or direct contact with the first alignment electrode ALE1 exposed by removal of a portion of at least one insulating layer positioned between the first pixel electrode PE1 and the first alignment electrode ALE1, and may be electrically and/or physically connected to the first alignment electrode ALE1. A connection point (or a contact point) of the first pixel electrode PE1 and the first alignment electrode ALE1 is positioned in the emission area EMA, but the disclosure is not limited thereto. According to an embodiment, the connection point (or the contact point) of the first pixel electrode PE1 and the first alignment electrode ALE1 may be positioned in the non-emission area NEMA, for example, the second opening OP2 of the bank BNK, which is the electrode separation area. A description of an embodiment in which the connection point (or the contact point) of the first pixel electrode PE1 and the first alignment electrode ALE1 is positioned in the second opening OP2 of the bank BNK is described later with reference to FIGS. 15 to 17.

The first pixel electrode PE1 may have a bar shape extending along the second direction DR2, but is not limited thereto. According to an embodiment, the shape of the first pixel electrode PE1 may be variously changed within a range in which the first pixel electrode PE1 is electrically and/or physically connected to the first end portion EP1 of the light emitting elements LD stably. The shape of the first pixel electrode PE1 may be variously changed in consideration of a connection relationship with the first alignment electrode ALE1 disposed thereunder.

The second pixel electrode PE2 ("second electrode", or "cathode") may be formed on the second alignment electrode ALE2 and the second end portion EP2 of each of the light emitting elements LD, and may be electrically connected to the second end portion EP2 of each of the light emitting elements LD. At least in the emission area EMA, the second pixel electrode PE2 may be in contact with or direct contact with the second alignment electrode ALE2 exposed be removal of a portion of at least one insulating layer positioned between the second pixel electrode PE2 and the second alignment electrode ALE2, and may be electrically and/or physically connected to the second alignment electrode ALE2. A connection point (or a contact point) of the second pixel electrode PE2 and the second alignment electrode ALE2 may be positioned in the emission area EMA or the non-emission area NEMA.

The second pixel electrode PE2 may have a bar shape extending along the second direction DR2, but is not limited thereto. According to an embodiment, the shape of the second pixel electrode PE2 may be variously changed within a range in which the second pixel electrode PE2 is electrically and physically connected to the second end portion EP2 of the light emitting elements LD stably. The shape of the second pixel electrode PE2 may be variously changed in consideration of a connection relationship with the second alignment electrode ALE2 disposed thereunder.

Hereinafter, the stack structure of the pixel PXL according to the above-described embodiment is described with reference to FIGS. 8 to 14.

Figure 8:
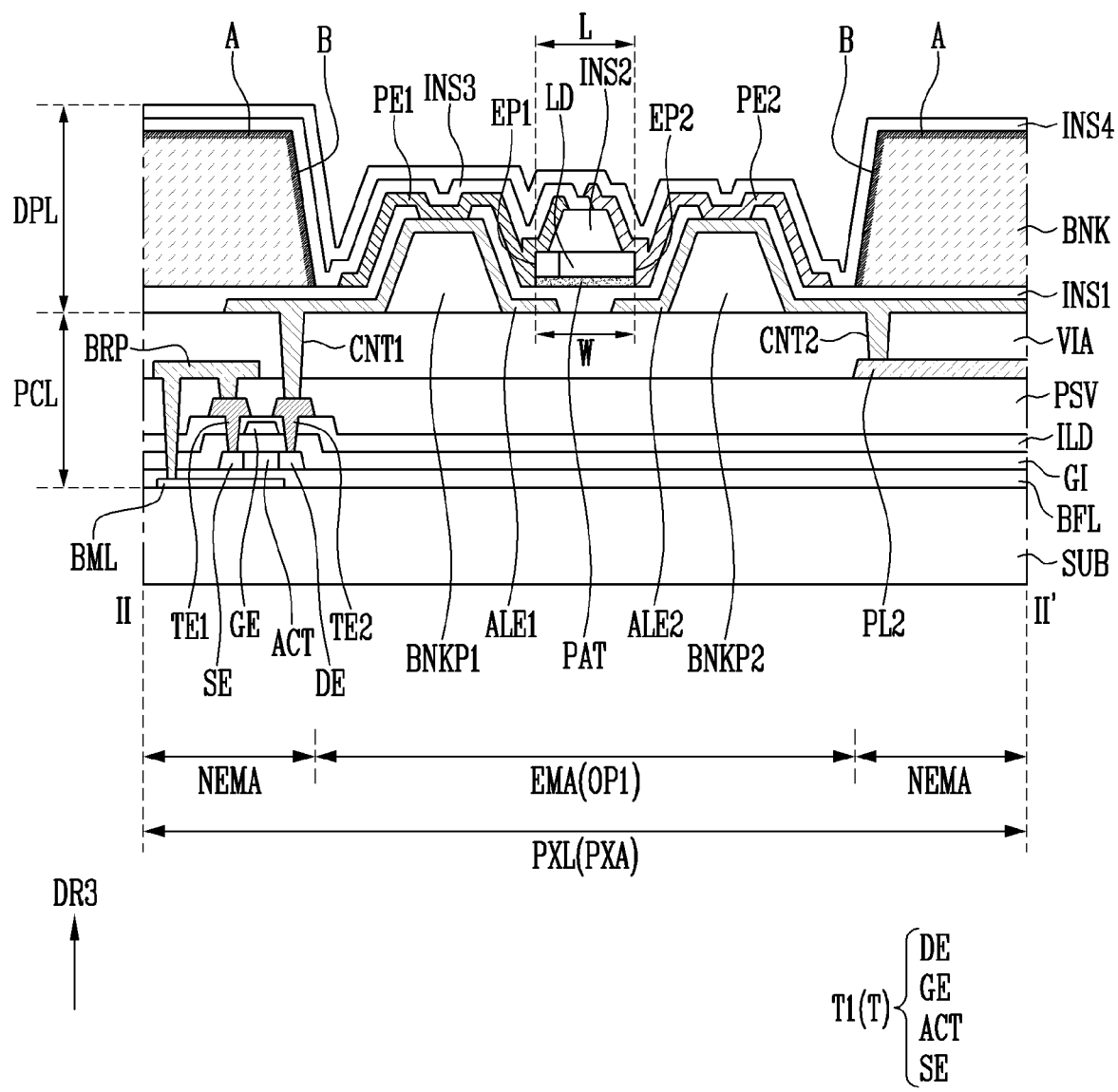
FIG. 8 is a schematic cross-sectional view taken along line II~II' of FIG. 7.

FIG. 8 is a schematic cross-sectional view taken along line II~II' of FIG. 7, and FIGS. 9 to 14 are schematic cross-sectional views taken along line III~III' of FIG. 7.

In describing embodiments, "formed and/or provided on the same layer or a same layer" means formed in the same process, and "formed and/or provided on a different layer" means formed in different processes.

Figure 9:
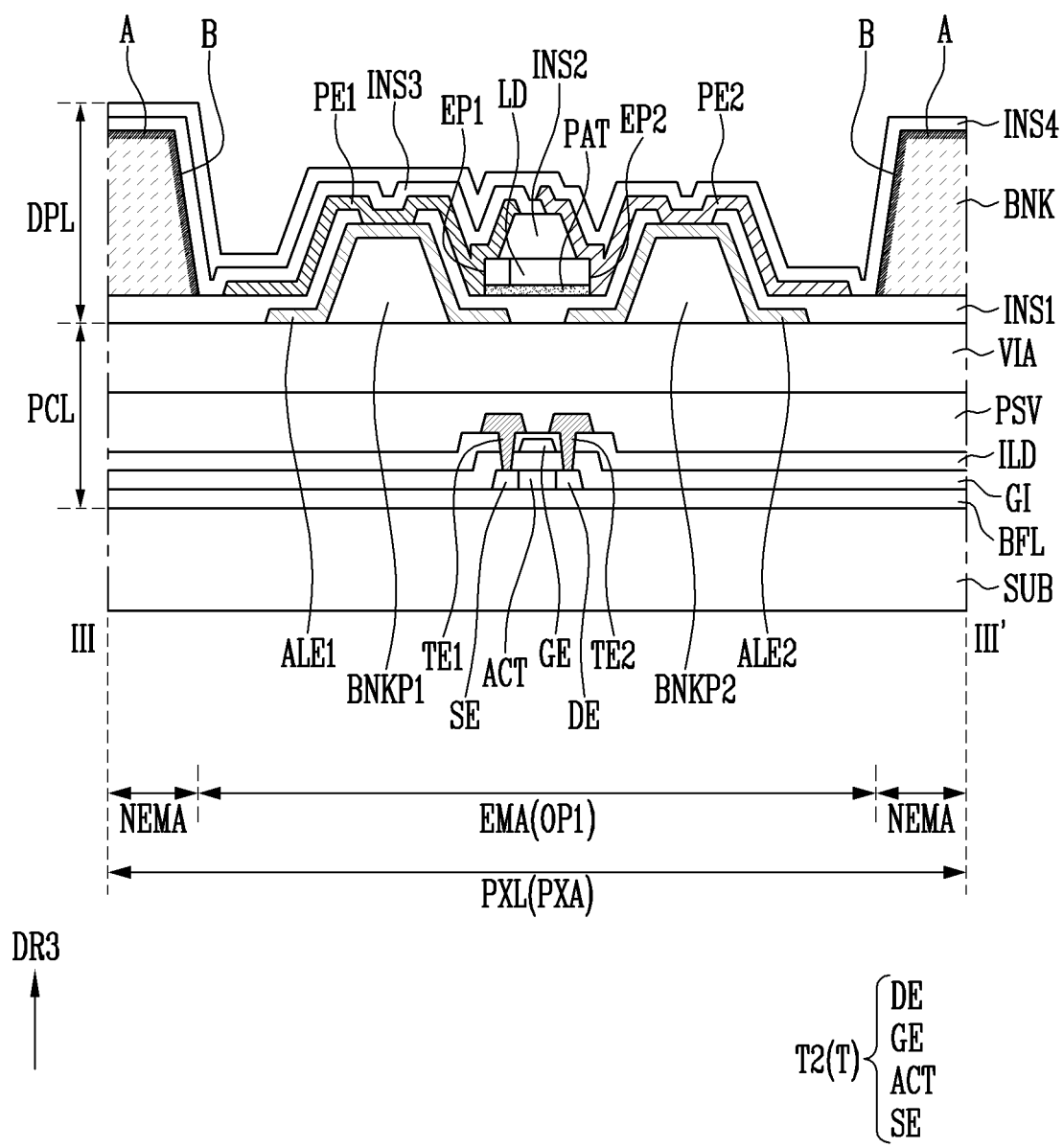
FIGS. 9 to 14 are schematic cross-sectional views taken along line III~III' of FIG. 7.
Figure 11:
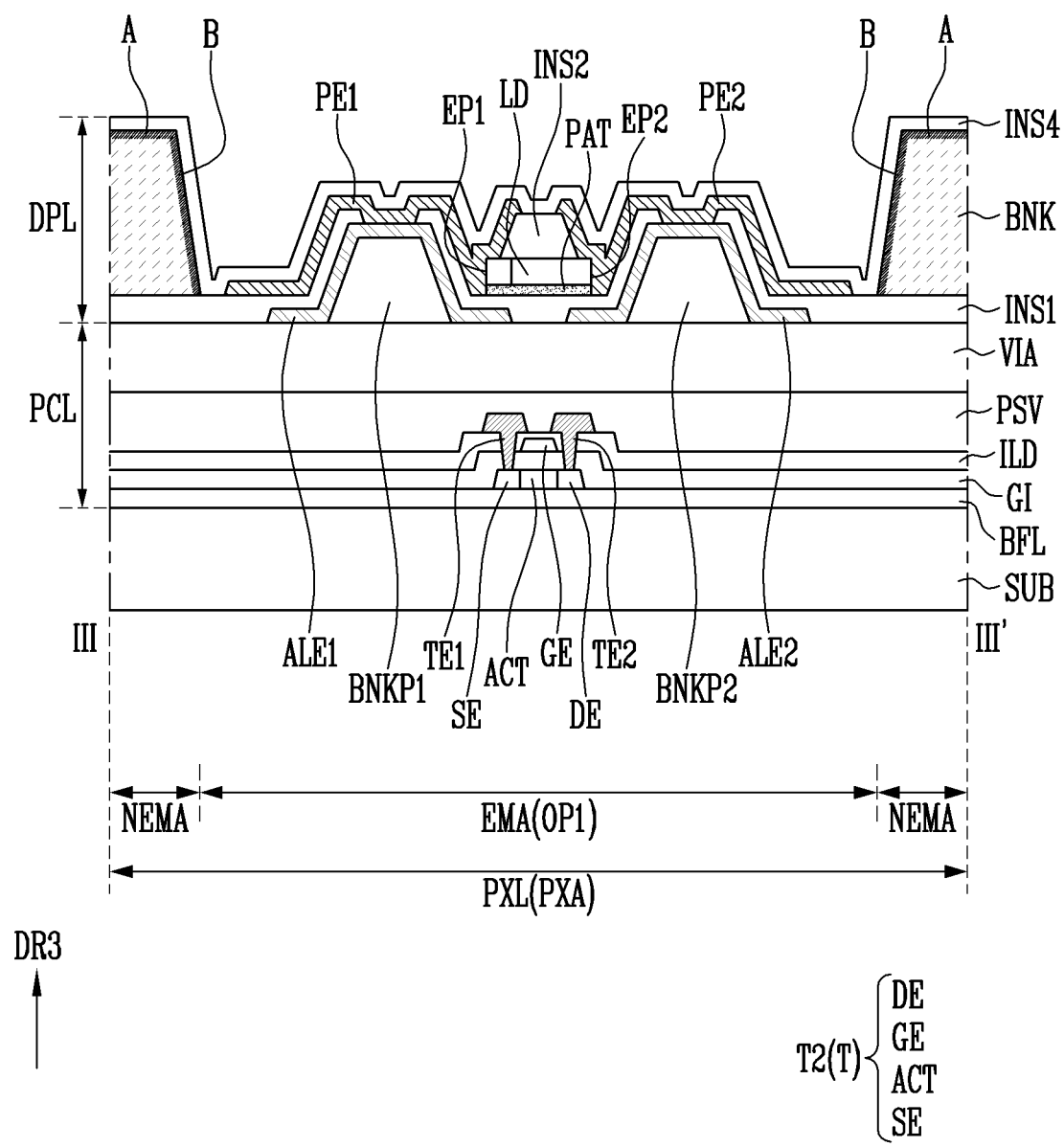

FIGS. 9 and 11 illustrate different embodiments in relation to a formation step of the first and second pixel electrodes PE1 and PE2 and presence or absence of a third insulating layer INS3. For example, FIG. 9 discloses an embodiment in which the second pixel electrode PE2 is formed after the first pixel electrode PE1 and the third insulating layer INS3 are formed, and FIG. 11 discloses an embodiment in which the first pixel electrode PE1 and the second pixel electrode PE2 are formed on a same layer.

Figure 10:
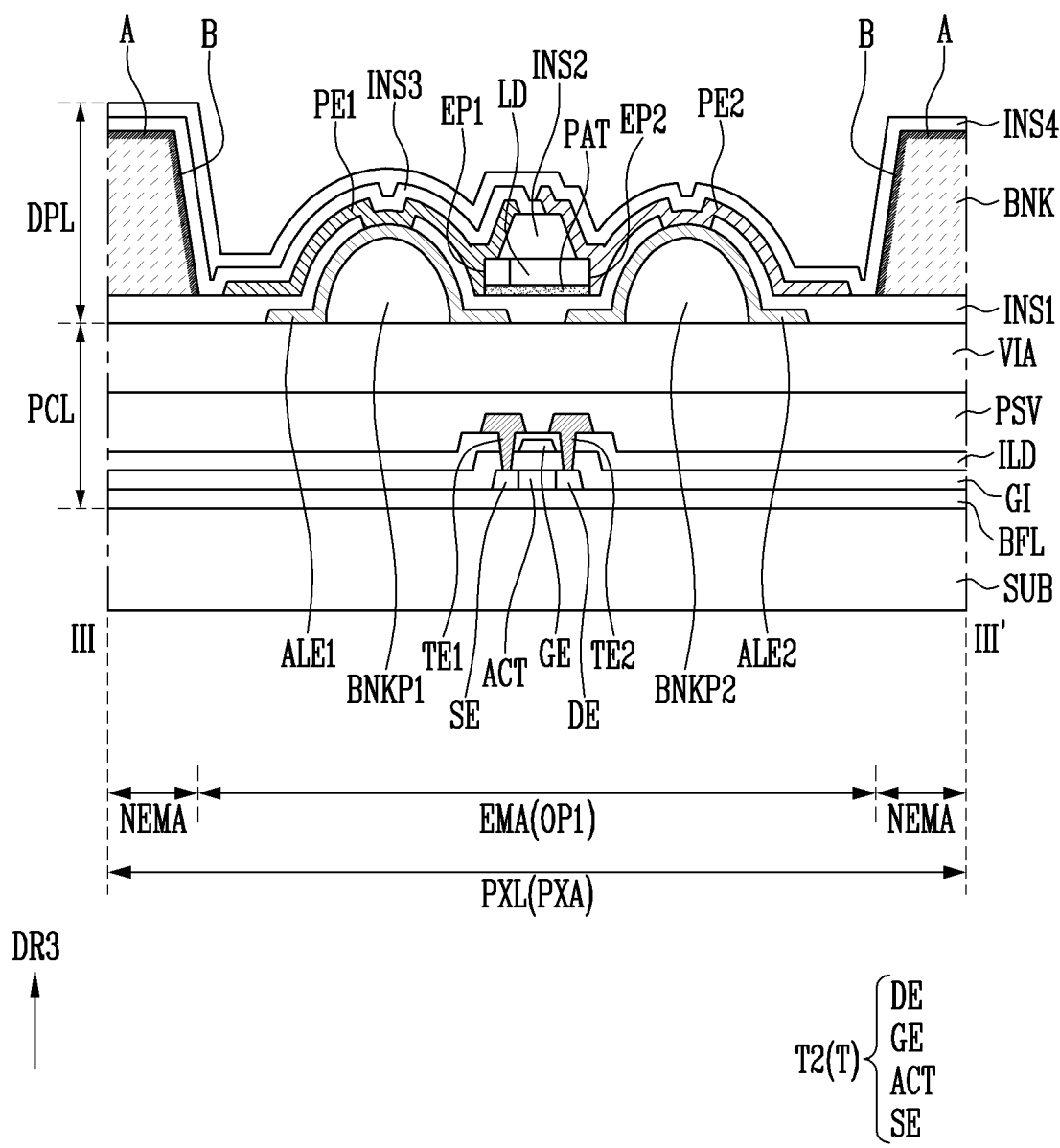

FIG. 10 illustrates a modified embodiment of the embodiment of FIG. 9 in relation to the bank pattern BNKP and the like within the spirit and the scope of the disclosure.

Figure 12:
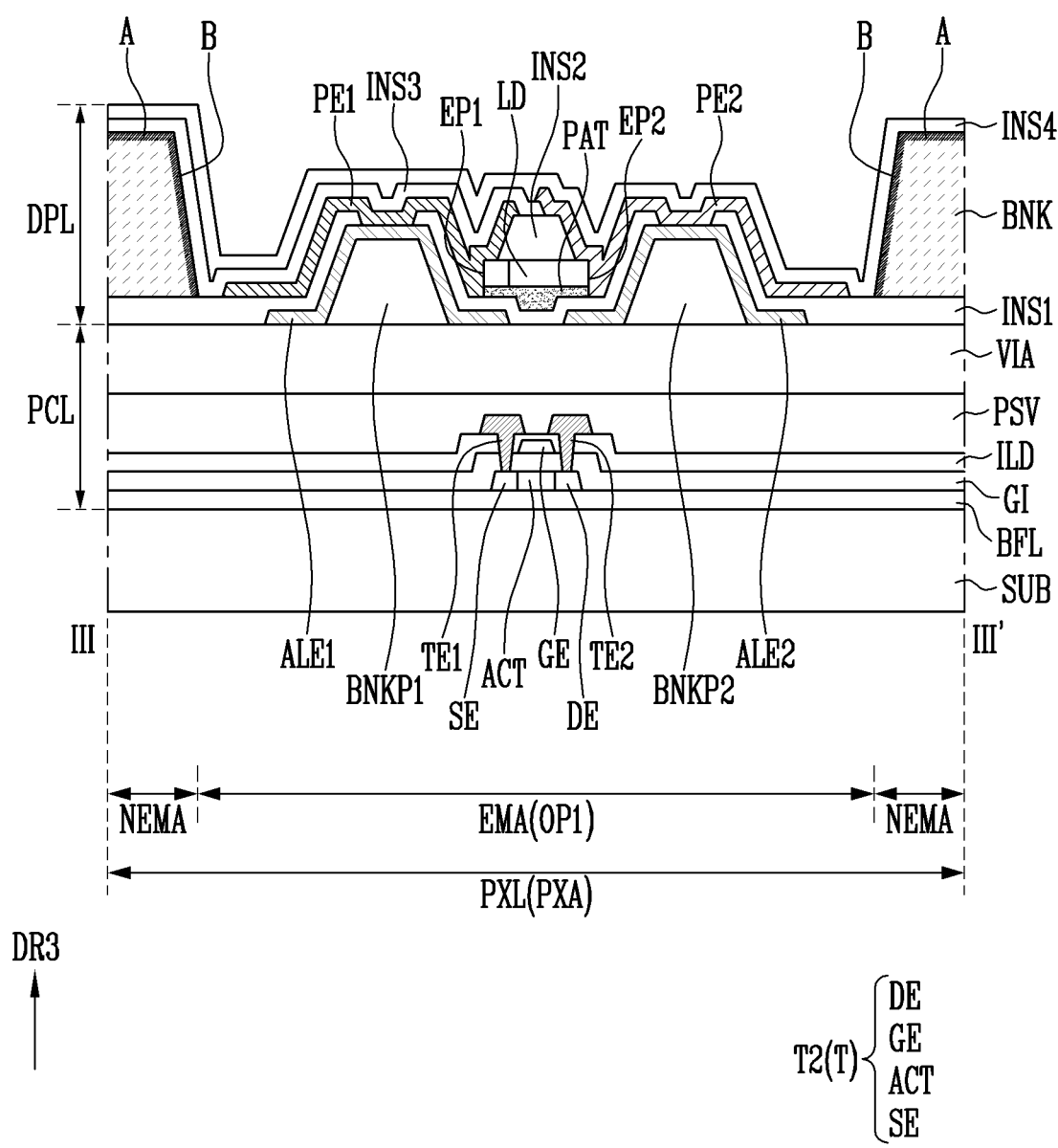

FIG. 12 illustrates a modified embodiment of the embodiment of FIG. 9 in relation to the pattern PAT and the like within the spirit and the scope of the disclosure.

Figure 13:
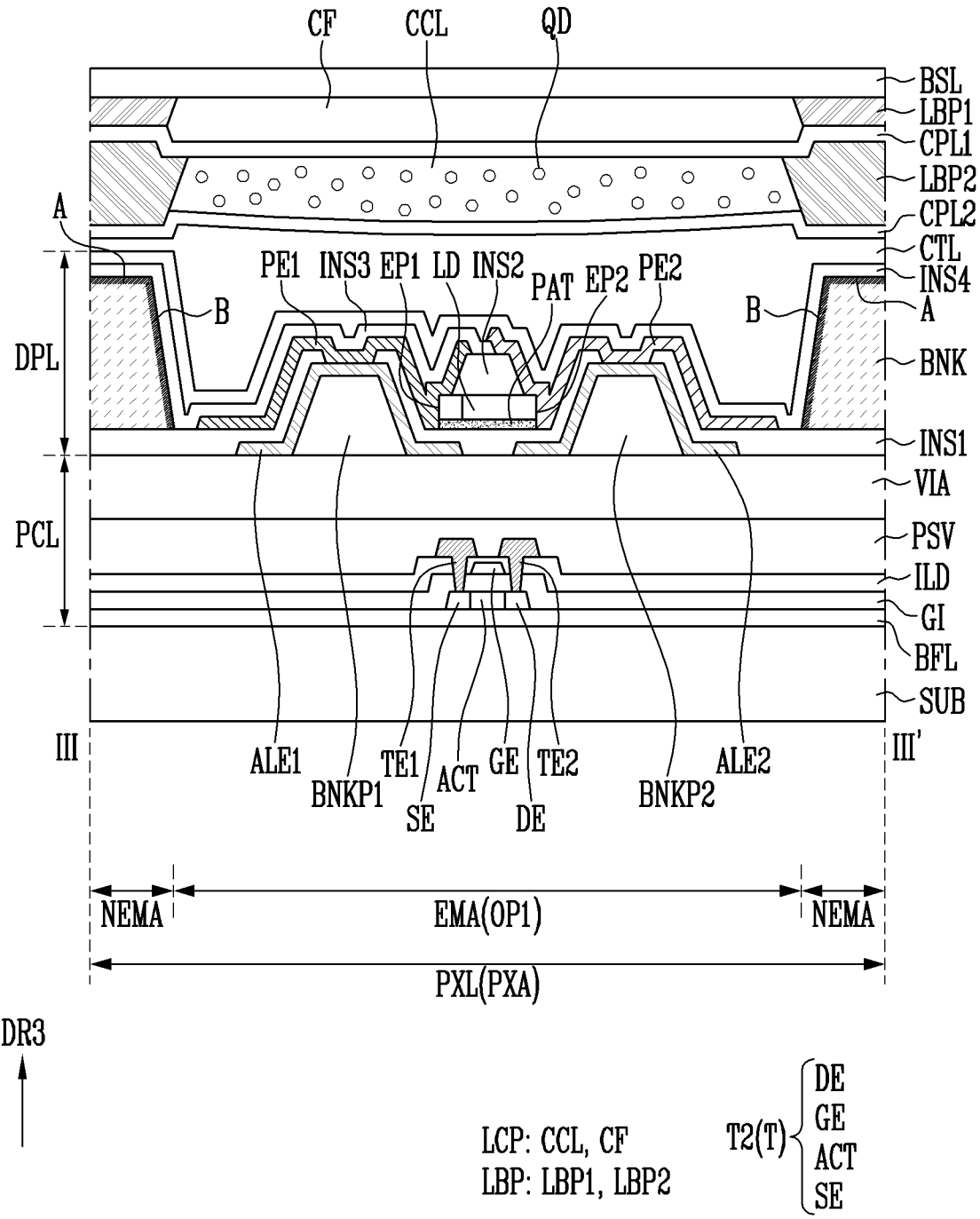
Figure 14:
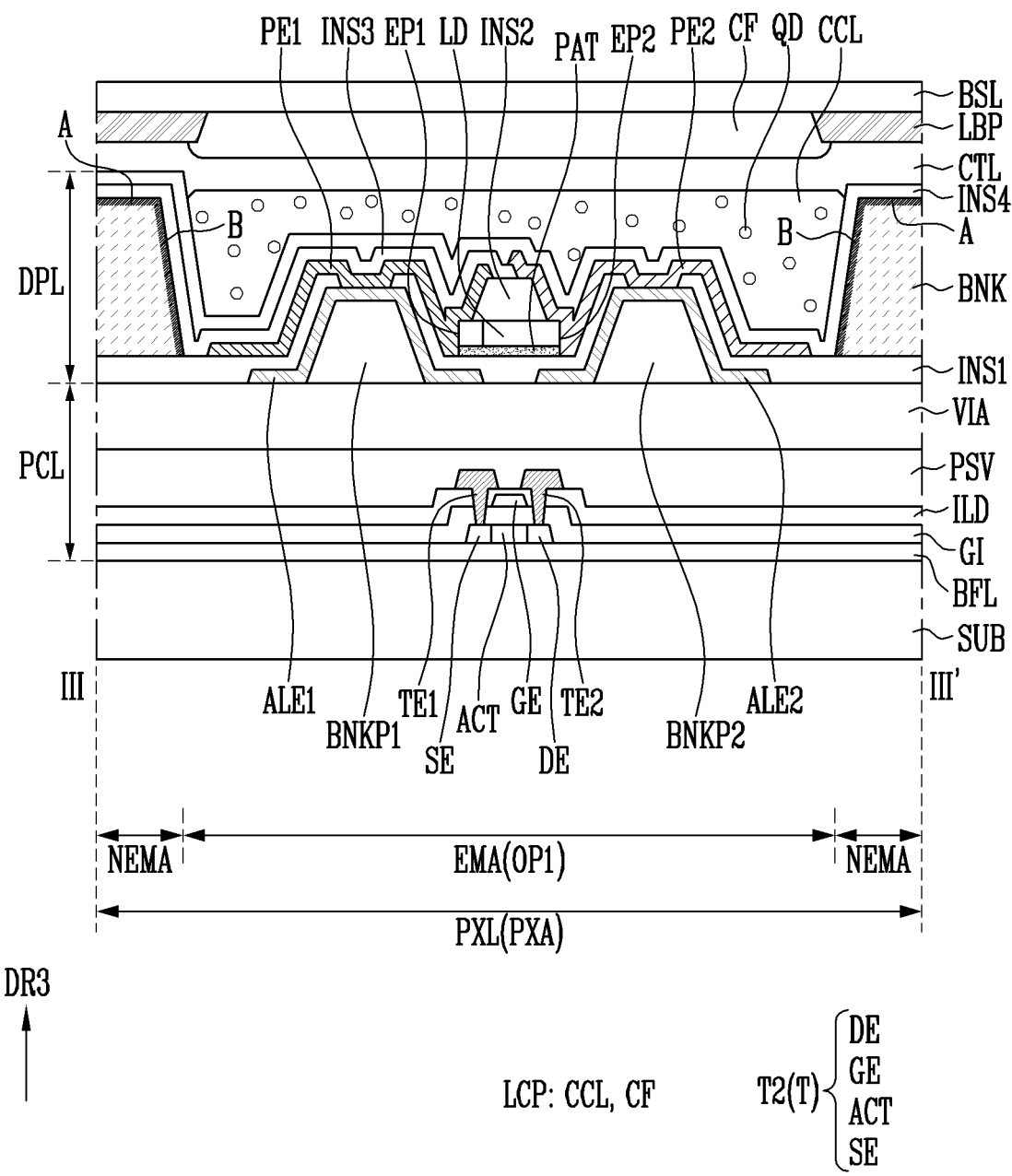

FIGS. 13 and 14 illustrate modified embodiments of the embodiment of FIG. 9 in relation to a light conversion pattern LCP and the like within the spirit and the scope of the disclosure. For example, FIG. 13 discloses an embodiment in which an upper substrate including the light conversion pattern LCP is positioned on a display element layer DPL through an adhesion process using an adhesive layer, and FIG. 14 discloses an embodiment in which the color conversion layer CCL and a color filter CF face each other with an intermediate layer CTL interposed therebetween.

In FIGS. 8 to 14, one pixel PXL is simplified, such as showing each electrode as an electrode of a single film (or a single layer) and each insulating layer as only an insulating layer of a single film (or a single layer), but the disclosure is not limited thereto.

In FIGS. 8 to 14, a vertical direction on a cross section is denoted as the third direction DR3. The third direction DR3 may mean a direction indicated by the third direction DR3.

Referring to FIGS. 1 to 5 and 7 to 14, the pixel PXL may include the substrate SUB, the pixel circuit layer PCL, and the display element layer DPL.

The pixel circuit layer PCL and the display element layer DPL may be disposed to overlap each other on one surface or a surface of the substrate SUB. For example, the display area DA of the substrate SUB may include the pixel circuit layer PCL disposed on one surface or a surface of the substrate SUB and the display element layer DPL disposed on the pixel circuit layer PCL. However, a mutual positions of the pixel circuit layer PCL and the display element layer DPL on the substrate SUB may vary according to an embodiment. In case that the pixel circuit layer PCL and the display element layer DPL are separated and overlapped as separate layers, each layout space for forming the pixel circuit PXC and the light emitting unit EMU may be sufficiently secured on a plane.

The substrate SUB may include a transparent insulating material and may transmit light. The substrate SUB may be a rigid substrate or a flexible substrate.

For example, the rigid substrate may be one of a glass substrate, a quartz substrate, a glass ceramic substrate, and a crystalline glass substrate.

The flexible substrate may be one of a film substrate and a plastic substrate including a polymer organic material. For example, the flexible substrate may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

In each pixel area PXA of the pixel circuit layer PCL, circuit elements (for example, transistors T) forming the pixel circuit PXC of the corresponding pixel PXL and signal lines electrically connected to the circuit element may be disposed. In each pixel area PXA of the display element layer DPL, the alignment electrode ALE, the light emitting elements LD, and/or the pixel electrodes PE forming the light emitting unit EMU of the corresponding pixel PXL may be disposed.

The pixel circuit layer PCL may include at least one insulating layer in addition to the circuit elements and the signal lines. For example, the pixel circuit layer PCL may include a buffer layer BFL, a gate insulating layer GI, an interlayer insulating layer ILD, a passivation layer PSV, and a via layer VIA sequentially stacked each other on the substrate SUB in the third direction DR3.

The buffer layer BFL may prevent an impurity from diffusing into the transistor T included in the pixel circuit PXC. The buffer layer BFL may be an inorganic insulating layer including an inorganic material. The buffer layer BFL may include at least one of a metal oxide such as silicon nitride ($SiN_x$), silicon oxide ($SiO_x$), silicon oxynitride ($SiO_xN_y$), and aluminum oxide ($AlO_x$). The buffer layer BFL may be provided as a single layer, but may also be provided as multiple layers of at least double layers. In case that the buffer layer BFL is provided as multiple layers, each layer may be formed of a same material or a similar material or may be formed of different materials. The buffer layer BFL may be omitted according to the material, a process condition, and the like of the substrate SUB.

The pixel circuit PXC may include the first transistor T1 (or the driving transistor) that controls the driving current of the light emitting elements LD, and the second transistor T2 (or the switching transistor) electrically connected to the first transistor T1. However, the disclosure is not limited thereto, and the pixel circuit PXC may further include circuit elements performing another function in addition to the first transistor T1 and the second transistor T2. In the following embodiment, in case that the first transistor T1 and the second transistor T2 are collectively referred to, the first transistor T1 and the second transistor T2 are referred to as a transistor T or transistors T.

The transistors T may include a semiconductor pattern and a gate electrode GE overlapping at least a portion of the semiconductor pattern. The semiconductor pattern may include a channel region ACT, a first contact region SE, and a second contact region DE. The first contact region SE may be a source region, and the second contact region DE may be a drain region.

The gate electrode GE may be provided and/or formed on the gate insulating layer GI to correspond to the channel region ACT of the semiconductor pattern. The gate electrode GE may be provided on the gate insulating layer GI to overlap the channel region ACT of the semiconductor pattern. The gate electrode GE may form a single layer with a material selected from a group consisting of copper (Cu), molybdenum (Mo), tungsten (W), aluminum neodymium (AlNd), titanium (Ti), aluminum (Al), silver (Ag), and an alloy thereof alone or a mixture thereof, or may be formed in a double layer or multi-layer structure of molybdenum (Mo), titanium (Ti), copper (Cu), aluminum (Al), or silver (Ag) which is a low-resistance material to reduce a line resistance.

The gate insulating layer GI may be an inorganic insulating layer including an inorganic material. For example, the gate insulating layer GI may include at least one of a metal oxide such as silicon nitride ($SiN_x$), silicon oxide ($SiO_x$), silicon oxynitride ($SiO_xN_y$), and aluminum oxide ($AlO_x$). However, the material of the gate insulating layer GI is not limited to the above-described embodiments. According to an embodiment, the gate insulating layer GI may be formed of an organic insulating layer including an organic material. The gate insulating layer GI may be provided as a single layer, but may also be provided as multiple layers of at least double layers.

The semiconductor pattern may be provided and/or formed on the buffer layer BFL. The channel region ACT, the first contact region SE, and the second contact region DE may be semiconductor patterns formed of polysilicon, amorphous silicon, an oxide semiconductor, and the like within the spirit and the scope of the disclosure. The channel region ACT, the first contact region SE, and the second contact region DE may be formed of a semiconductor layer that is not doped with an impurity or is doped with an impurity. For example, the first contact region SE and the second contact region DE may be formed of a semiconductor layer doped with an impurity, and the channel region ACT may be formed of a semiconductor layer that is not doped with an impurity. As an impurity, for example, an n-type impurity may be used, but is not limited thereto.

The channel region ACT may overlap the gate electrode GE of the corresponding transistor T. For example, the channel region ACT of the first transistor T1 may overlap the gate electrode GE of the first transistor T1, and the channel region ACT of the second transistor T2 may overlap the gate electrode GE of the second transistor T2.

The first contact region SE of the first transistor may be electrically connected (or contacted) to one end of the channel region ACT of the corresponding transistor T. The first contact region SE of the first transistor T1 may be electrically connected to a bridge pattern BRP through a first connection member TEL The first connection member TE1 may be provided and/or formed on the interlayer insulating layer ILD. One end of the first connection member TE1 may be electrically and/or physically connected to the first contact region SE of the first transistor T1 through a contact hole sequentially passing through the interlayer insulating layer ILD and the gate insulating layer GI. Another end of the first connection member TE1 may be electrically and/or physically connected to the bridge pattern BRP through a contact hole passing through the passivation layer PSV positioned on the interlayer insulating layer ILD. The first connection member TE1 may include a same material or a similar material as the gate electrode GE, or may include one or more materials selected from materials as a material of the gate electrode GE.

The interlayer insulating layer ILD may be provided and/or formed entirely on the gate electrode GE and the gate insulating layer GI. The interlayer insulating layer ILD may include a same material or a similar material as the gate insulating layer GI, or may include one or more materials selected from the materials as the configuration material of the gate insulating layer GI.

The bridge pattern BRP may be provided and/or formed on the passivation layer PSV. One end of the bridge pattern BRP may be electrically connected to the first contact region SE of the first transistor T1 through the first connection member TEL Another end of the bridge pattern BRP may be electrically and/or physically connected to a bottom metal layer BML through a contact hole sequentially passing through the passivation layer PSV, the interlayer insulating layer ILD, the gate insulating layer GI, and the buffer layer BFL. The bottom metal layer BML and the first contact region SE of the first transistor T1 may be electrically connected to each other through the bridge pattern BRP and the first connection member TE1.

The bottom metal layer BML may be a first conductive layer among conductive layers provided on the substrate SUB. For example, the bottom metal layer BML may be a first conductive layer positioned between the substrate SUB and the buffer layer BFL. The bottom metal layer BML may be electrically connected to the first transistor T1 to increase a driving range of a voltage supplied to the gate electrode GE of the first transistor T1. For example, the bottom metal layer BML may be electrically connected to the first contact region SE of the first transistor T1 to stabilize the channel region ACT of the first transistor T1. As the bottom metal layer BML is electrically connected to the first contact region SE of the first transistor T1, floating of the bottom metal layer BML may be prevented.

The second contact region DE of the first transistor T1 may be electrically connected (contacted) to another end of the active pattern ACT of the corresponding transistor T. The second contact region DE of the first transistor T1 may be electrically connected (or contacted) to a second connection member TE2.

The second connection member TE2 may be provided and/or formed on the interlayer insulating layer ILD. One end of the second connection member TE2 may be electrically and/or physically connected to the second contact region DE of the first transistor T1 through a contact hole passing through the interlayer insulating layer ILD and the gate insulating layer GI. Another end of the second connection member TE2 may be electrically and/or physically connected to the first alignment electrode ALE1 of the display element layer DPL through a first contact portion CNT1 sequentially penetrating the via layer VIA and the passivation layer PSV. In an embodiment, the second connection member TE2 may be a medium for connecting the first transistor T1 of the pixel circuit layer PCL and the first alignment electrode ALE1 of the display element layer DPL.

The first contact region SE of the second transistor T2 may be electrically connected (or contacted) to one end of the channel region ACT of the corresponding transistor T. Although not directly shown in the drawing, the first contact region SE of the second transistor T2 may be electrically connected to the gate electrode GE of the first transistor T1. For example, the first contact region SE of the second transistor T2 may be electrically connected to the gate electrode GE of the first transistor T1 through another first connection member TE1. The other first connection member TE1 may be provided and/or formed on the interlayer insulating layer ILD.

The second contact region DE of the second transistor T2 may be electrically connected (or contacted) to another end of the channel region ACT of the corresponding transistor T. Although not directly shown in the drawing, the second contact region DE of the second transistor T2 may be electrically connected to the data line Dj. For example, the second contact region DE of the second transistor T2 may be electrically connected to the data line Dj through another second connection member TE2. The other second connection member TE2 may be provided and/or formed on the interlayer insulating layer ILD.

The interlayer insulating layer ILD may be provided and/or formed on the above-described first transistor T1 and second transistor T2.

In the above-described embodiment, a case in which the transistors T are thin film transistors of a top gate structure is described as an example, but the disclosure is not limited thereto, and the structure of the transistors T may be variously changed.

The passivation layer PSV may be provided and/or formed on the transistors T and the first and second connection members TE1 and TE2.

The passivation layer PSV (or a protective layer) may be provided and/or formed entirely on the first and second connection members TE1 and TE2 and the interlayer insulating layer ILD. The passivation layer PVS may be an inorganic insulating layer including an inorganic material or an organic insulating layer including an organic material. The inorganic insulating layer may include, for example, at least one of a metal oxide such as silicon nitride ($SiN_x$), silicon oxide ($SiO_x$), silicon oxynitride ($SiO_xN_y$), and aluminum oxide ($AlO_x$). The organic insulating layer may include, for example, at least one of an acrylic resin (polyacrylates resin), an epoxy resin, a phenolic resin, a polyamide resin, a polyimide resin, an unsaturated polyester resin, a poly-phenylene ethers resin, a poly-phenylene sulfides resin, and a benzocyclobutene resin.

According to an embodiment, the passivation layer PSV may include a same material or a similar material as the interlayer insulating layer ILD, but is not limited thereto. The passivation layer PSV may be provided as a single layer, but may also be provided as multiple layers of at least double layers.

The pixel circuit layer PCL may include a power line provided and/or formed on the passivation layer PSV. For example, the power line may include the second power line PL2. The second power line PL2 may be provided on a same layer as the bridge pattern BRP. The voltage of the second driving power VSS may be applied to the second power line PL2. Although not directly shown in FIGS. 8 to 14, the pixel circuit layer PCL may further include the first power line PL1 described with reference to FIGS. 5 and 6. The first power line PL1 may be provided on a same layer as the second power line PL2 or may be provided on a layer different from that of the second power line PL2. In the above-described embodiment, the second power line PL2 is provided and/or formed on the passivation layer PSV, but the disclosure is not limited thereto. According to an embodiment, the second power line PL2 may be provided on an insulating layer in which any one of the conductive layers included in the pixel circuit layer PCL is disposed. For example, the position of the second power line PL2 may be variously changed in the pixel circuit layer PCL.

Each of the first power line PL1 and the second power line PL2 may include a conductive material (or substance). For example, each of the first power line PL1 and the second power line PL2 may be formed in a single layer formed of a material selected from a group consisting of copper (Cu), molybdenum (Mo), tungsten (W), aluminum neodymium (AlNd), titanium (Ti), aluminum (Al), silver (Ag), and an alloy thereof alone or a mixture thereof, or may be formed in a double layer or multi-layer structure of molybdenum (Mo), titanium (Ti), copper (Cu), aluminum (Al), or silver (Ag) which is a low-resistance material to reduce a line resistance.

The first power line PL1 may be electrically connected to some or a number of configurations of the display element layer DPL, and the second power line PL2 may be electrically connected to other configurations of the display element layer DPL.

The via layer VIA may be provided and/or formed on the bridge pattern BRP and the second power line PL2.

The via layer VIA may be provided in a form including an organic insulating layer, an inorganic insulating layer, or an organic insulating layer disposed on an inorganic insulating layer. The inorganic insulating layer may include, for example, at least one of a metal oxide such as silicon nitride ($SiN_x$), silicon oxide ($SiO_x$), silicon oxynitride ($SiO_xN_y$), and aluminum oxide ($AlO_x$). The organic insulating layer may include, for example, at least one of an acrylic resin (polyacrylates resin), an epoxy resin, a phenolic resin, a polyamide resin, a polyimide resin, an unsaturated polyester resin, a poly-phenylene ethers resin, a poly-phenylene sulfides resin, and a benzocyclobutene resin.

The via layer VIA may include a first contact portion CNT1 corresponding to the first contact portion CNT1 of the passivation layer PSV exposing the second connection member TE2 electrically connected to the first transistor T1, and a second contact portion CNT2 exposing the second power line PL2.

The display element layer DPL may be provided and/or formed on the via layer VIA.

The display element layer DP may include the bank patterns BNKP, the alignment electrodes ALE, the bank BNK, the patterns PAT, the light emitting elements LD, and the pixel electrodes PE. The display element layer DPL may include at least one or more insulating layers positioned between the above-described configurations. For example, the display element layer DPL may include a first insulating layer INS1, a second insulating layer INS2, a third insulating layer INS3, and a fourth insulating layer INS4. According to an embodiment, the third insulating layer INS3 may be selectively provided.

The bank patterns BNKP may be provided and/or formed on the via layer VIA.

The bank patterns BNKP may be disposed on one surface or a surface of the via layer VIA. For example, the bank patterns BNKP may protrude in the third direction DR3 on one surface or a surface of the via layer VIA. Accordingly, one area or an area of the alignment electrodes ALE disposed on the bank patterns BNKP may protrude in the third direction DR3 (or the thickness direction of the substrate SUB).

The bank patterns BNKP may be an inorganic insulating layer including an inorganic material or an organic insulating layer including an organic material. According to an embodiment, the bank patterns BNKP may include an organic insulating layer of a single layer and/or an inorganic insulating layer of a single layer, but is not limited thereto. According to an embodiment, the bank patterns BNKP may be provided in a form of a multilayer in which at least one organic insulating layer and at least one inorganic insulating layer may be stacked each other. However, the material of the bank patterns BNKP is not limited to the above-described embodiment, and according to an embodiment, the bank patterns BNKP may include a conductive material (or substance).

The bank patterns BNKP may have a cross section of a trapezoidal shape of which a width becomes narrower from one surface or a surface (for example, an upper surface) of the via layer VIA toward an upper portion in the third direction DR3, but is limited thereto. According to an embodiment, as shown in FIG. 10, the bank patterns BNKP may include a curved surface having a cross-section of a semi-elliptical shape, a semi-circular shape (or a hemispherical shape). When viewed in a cross section, the shape of the bank patterns BNKP is not limited to the above-described embodiment and may be variously changed within a range capable of improving efficiency of the light emitted from each of the light emitting elements LD. According to an embodiment, at least one of the bank patterns BNKP may be omitted or a position thereof may be changed.

In an embodiment, the bank patterns BNKP may be used as a reflective member. For example, the bank patterns BNKP may be used as a reflective member that guides the light emitted from each light emitting element LD in a desired direction together with the alignment electrodes ALE disposed thereon to improve the light emission efficiency of the pixel PXL.

The alignment electrodes ALE may be provided and/or formed on the bank patterns BNKP.

The alignment electrodes ALE may be provided and/or formed on the via layer VIA and the bank patterns BNKP. The alignment electrodes ALE may be disposed on a same plane and may have a same thickness in the third direction DR3. For example, the first alignment electrode ALE1 and the second alignment electrode ALE2 may be provided on the via layer VIA and the corresponding bank pattern BNKP and may have a same thickness in the third direction DR3. The first alignment electrode ALE1 and the second alignment electrode ALE2 may be simultaneously formed in the same process.

The first alignment electrode ALE1 may have a shape corresponding to an inclination degree of the first bank pattern BNKP1 positioned thereunder, and the second alignment electrode ALE2 have a shape corresponding to an inclination degree of the second bank pattern BNKP2 positioned thereunder.

The alignment electrodes ALE may be formed of a material having a constant (or uniform) reflectance in order to allow the light emitted from the light emitting elements LD to proceed in the image display direction of the display device DD. For example, the alignment electrodes ALE may be formed of a conductive material (or substance). The conductive material may include an opaque metal advantageous for reflecting the light emitted from the light emitting elements LD in the image display direction of the display device DD. The opaque metal may include, for example, a metal such as silver (Ag), magnesium (Mg), aluminum (Al), platinum (Pt), palladium (Pd), gold (Au), nickel (Ni), neodymium (Nd), iridium (Ir), chromium (Cr), titanium (Ti), and an alloy thereof. However, the material of the alignment electrodes ALE is not limited to the above-described embodiment. According to an embodiment, the alignment electrodes ALE may include a transparent conductive material (or substance). The transparent conductive material (or substance) may include a conductive oxide such as indium tin oxide (ITO), indium zinc oxide (IZO), zinc oxide (ZnO), indium gallium zinc oxide, IGZO), and indium tin zinc oxide (ITZO), a conductive polymer such as poly(3,4-ethylenedioxythiophene) (PEDOT), and the like within the spirit and the scope of the disclosure. In case that the alignment electrodes ALE include a transparent conductive material (or substance), a separate conductive layer formed of an opaque metal for reflecting the light emitted from the light emitting elements LD in the image display direction of the display device DD may be added. However, the material of the alignment electrodes ALE is not limited to the above-described materials.

Each of the alignment electrodes ALE may be provided and/or formed as a single layer, but is not limited thereto. According to an embodiment, each of the alignment electrodes ALE may be provided and/or formed as multiple layers in which at least two materials among metals, alloys, a conductive oxide, and conductive polymers may be stacked each other. Each of the alignment electrodes ALE may be formed as multiple layers of at least a double layer or more in order to minimize distortion due to signal delay in case that transmitting a signal (or a voltage) to the both end portions EP1 and EP2 of each of the light emitting elements LD. For example, each of the alignment electrodes ALE may be formed as multiple layers selectively further including at least one of at least one reflective electrode layer, at least one transparent electrode layer disposed on and/or under or below the reflective electrode layer, at least one conductive capping layer covering or overlapping on the reflective electrode layer and/or the transparent electrode layer.

As described above, in case that the alignment electrodes ALE are formed of a conductive material having a constant reflectance, the light emitted from the both end portions, that is the first and second end portions EP1 and EP2 of each of the light emitting elements LD may be allowed to further progress in the image display direction (or the third direction DR3) of the display device DD. In case that the alignment electrodes ALE have an inclined surface or a curved surface corresponding to the shape of the bank pattern BNKP and are disposed to face the first and second end portions EP1 and EP2 of the light emitting elements LD, the light emitted from the first and second end portions EP1 and EP2 of each of the light emitting elements LD may be reflected by the alignment electrodes ALE and may be further progressed in the image display direction of the display device DD. Accordingly, the efficiency of the light emitted from the light emitting elements LD may be improved.

The first alignment electrode ALE1 may be electrically connected to the first transistor T1 of the pixel circuit layer PCL through the first contact portion CNT1, and the second alignment electrode ALE2 may be electrically connected to the second power line PL2 of the pixel circuit layer PCL through the second contact portion CNT2.

The first insulating layer INS1 may be provided and/or formed on the alignment electrodes ALE.

The first insulating layer INS1 may include an inorganic insulating layer formed of an inorganic material or an organic insulating layer formed of an organic material. The first insulating layer INS1 may be formed of an inorganic insulating layer advantageous for protecting the light emitting elements LD from the pixel circuit layer PCL. For example, the first insulating layer INS1 may include at least one of a metal oxide such as silicon nitride ($SiN_x$), silicon oxide ($SiO_x$), silicon oxynitride ($SiO_xN_y$), and aluminum oxide ($AlO_x$), but is not limited thereto.

The first insulating layer INS1 may be provided as a single layer or multiple layers. In case that the first insulating layer INS1 is provided as the multiple layers, the first insulating layer INS1 may be provided in a distributed Bragg reflectors (DBR) structure in which a first layer and a second layer having different refractive indices formed of an inorganic insulating layer may be alternately stacked each other. For example, the first insulating layer INS1 may be provided in a structure in which a first layer having a less refractive index and a second layer having a refractive index greater than that of the first layer may be alternately stacked each other. As described above, in case that the first insulating layer INS1 is provided as the multiple layers, the first insulating layer INS1 may be used as a reflective member that reflects the light emitted from the light emitting elements LD in a desired direction using constructive interference due to a difference of the refractive index between the first layer and the second layer. At this time, each of the first and second layers may include at least one of silicon oxide ($SiO_x$), silicon nitride ($SiN_x$), silicon oxynitride ($SiO_xN_y$), silicon oxycarbide ($SiO_xC_y$), silicon carbonitride ($SiC_xN_y$), silicon oxycarbide ($SiO_xC_y$), aluminum oxide ($AlO_x$), aluminum nitride ($AlN_x$), hafnium oxide ($HfO_x$), zirconium oxide ($ZrO_x$), titanium oxide ($TiO_x$), and tantalum oxide ($TaO_x$). In an embodiment, the first insulating layer INS1 may include silicon oxide ($SiO_x$) including a hydroxyl group (—OH) on a surface.

The first insulating layer INS1 may be partially opened in at least one area or an area of the emission area EMA to expose configurations positioned thereunder. For example, at least one area or an area of the first insulating layer INS1 may be removed in the emission area EMA, and may be partially opened to expose a portion of the first alignment electrode ALE1 on the first bank pattern BNKP1 and a portion of the second alignment electrode ALE2 on the second bank pattern BNKP2.

The bank BNK may be provided and/or formed on the first insulating layer INS1.

The bank BNK may be formed between adjacent pixels PXL to surround the emission area EMA of the pixel PXL, and may form the pixel defining layer partitioning the emission area EMA of the corresponding pixel PXL. In a step of supplying the light emitting elements LD to the emission area EMA, the bank BNK may be a dam structure that prevents the solution mixed with the light emitting elements LD from flowing into the emission area EMA of the adjacent pixel PXL or controls supply of a amount of the solution to each emission area EMA.

In an embodiment, surface treatment may be performed on the bank BNK so that at least one surface or a surface have hydrophobicity. For example, surface treatment may be performed on the bank BNK so that an upper surface A and a side surface B of the bank BNK have hydrophobicity. In an embodiment, hydrophobicity ("lipophilic" or "lyophobic") may refer to a property that is not readily bound to a water molecule, a property of repelling an organic solvent or the like which is a liquid derived from inkjet, or the like within the spirit and the scope of the disclosure. Each of the upper surface A and the side surface B of the bank BNK may include a hydrophobic thin film having hydrophobicity. At this time, a contact angle of the hydrophobic thin film in case that a water droplet is dropped on a surface of an object on which the surface treatment is performed (for example, the upper surface A and the side surface B of the bank BNK) may be in a range of about 80° to about 130°, but is not limited thereto.

An example of the surface treatment described above may include treatment using a surface modifier as a hydrophobic treatment agent, treatment by various energy rays, treatment by chemical adsorption, treatment by graft polymerization on a material surface, and the like within the spirit and the scope of the disclosure.

Among the above-described surface treatment methods, the treatment by various energy rays may refer to a treatment for imparting hydrophobicity to the surface of the object by the energy rays. An example of the energy ray may include plasma, an electron ray, an ion beam, and the like within the spirit and the scope of the disclosure. An example of the surface treatment in a case of using plasma treatment may include forming, for example, a hydrophobic monomolecular film on a roughened surface after roughening the surface of the object by plasma etching, fluorination of the surface by fluorine-based gas plasma, forming a film formed of a liquid-repellent compound on the surface by plasma chemical vapor deposition (CVD), forming a hydrophobic thin film on the surface of the object by plasma polymerization, and the like within the spirit and the scope of the disclosure.

Among the examples of the above-described surface treatment, the fluorination of the surface of the object by the fluorine-based gas plasma may be such that the surface treatment may be performed conveniently and uniformly. In an embodiment, the upper surface A and the side surface B of the bank BNK may include a hydrophobic thin film having hydrophobicity by plasma.

In case that performing the above-described surface treatment, each of the upper surface A and the side surface B of the bank BNK may include a hydrophobic thin film having hydrophobicity by being exposed to an outside and reacting with a fluorine-based gas, for example, carbon tetrafluoride ($CF_4$) gas plasma. Here, the hydrophobic thin film may be a layer including fluorine (F).

The patterns PAT may be provided and/or formed on the first insulating layer INS1 at least in the emission area EMA. The patterns PAT may include an organic material having a hydrophilic group (or a hydrophilic functional group) for combining with the first insulating layer INS1. For example, the patterns PAT may be formed of an alkylsiloxane SAM including one selected from a group consisting of a hydroxyl group (—OH) which is a hydrophilic functional group, a carboxyl group (—C(=O)OH or —COOH), and a combination thereof as a hydrophilic group.

According to an embodiment, in case that a gap (or a space) exists between the first insulating layer INS1 and the light emitting elements LD as shown in FIG. 12 before forming the patterns PAT, the gap may be filled with the patterns PAT in a process of forming the patterns PAT.

The light emitting elements LD may be supplied and arranged or disposed in the emission area EMA of the pixel PXL defined by the bank BNK. For example, the light emitting elements LD may be disposed on the patterns PAT at least in the emission area EMA.

The light emitting elements LD may be supplied (or input) to the emission area EMA through an inkjet printing method, or the like, and the light emitting elements LD may be aligned between the alignment electrodes ALE in the emission area EMA by an alignment signal (or alignment voltage) applied to each of the alignment electrodes ALE.

In an embodiment, surface treatment may be performed on each of the light emitting elements LD so that an outer circumferential surface thereof, for example, the insulating layer 14 has hydrophobicity. In a step of aligning the light emitting elements LD, the light emitting elements LD may be aligned on the pattern PAT between the first alignment electrode ALE1 and the second alignment electrode ALE2 by the electric field formed between the first alignment electrode ALE1 and the second alignment electrode ALE2. At this time, repulsive force according to different properties may occur between the light emitting element LD having hydrophobicity and the pattern PAT having hydrophilicity.

The above-described repulsive force may alleviate or prevent the light emitting elements LD from being separated from a position (for example, a position between the first alignment electrode ALE1 and the second alignment electrode ALE2) by reducing frictional force between the light emitting elements LD and the pattern PAT. The repulsive force may minimize a limitation for motion ("rotation", or "movement") of the light emitting elements LD by weakening force of the light emitting elements LD to be fixed at a position in the emission area EMA. Accordingly, a deflection alignment degree of the light emitting elements LD may be improved by readily controlling rotation or the like of the light emitting elements LD. Thus, the light emission efficiency of the pixel PXL may be improved.

A detailed description of a manufacturing process of the pixel PXL including the bank BNK including the hydrophobic thin film and the patterns PAT having hydrophilicity is described later with reference to FIGS. 19A to 19N.

The second insulating layer INS2 may be provided and/or formed on each of the light emitting elements LD in the emission area EMA. The second insulating layer INS2 may be provided and/or formed on the light emitting elements LD, partially cover or overlap the outer circumferential surface (or surface) of each of the light emitting elements LD, and expose the first end portion EP1 and the second end portion EP2 of the light emitting elements LD to the outside.

The second insulating layer INS2 may be formed of a single layer or multiple layers, and may include an inorganic insulating layer including at least one inorganic material or an organic insulating layer including at least one organic material. The second insulating layer INS2 may include an inorganic insulating layer that is advantageous for protecting each active layer (refer to "12" of FIG. 1) of the light emitting elements LD from external oxygen, moisture, and the like within the spirit and the scope of the disclosure. However, the disclosure is not limited thereto. The second insulating layer INS2 may be formed of an organic insulating layer including an organic material according to a design condition or the like of the display device DD to which the light emitting elements LD are applied. The light emitting elements LD may be prevented from being separated from an aligned position by forming the second insulating layer INS2 on the light emitting elements LD after the alignment of the light emitting elements LD is completed in the pixel area PXA (or the emission area EMA) of the pixel PXL.

At least one of the pixel electrodes PE may be disposed on the light emitting elements LD, the second insulating layer INS2 on the light emitting elements LD, and the first insulating layer INS1 on the alignment electrodes ALE, at least in the emission area EMA. For example, at least in the emission area EMA, the first pixel electrode PE1 may be disposed on the first end portion EP1 of the light emitting element LD, the second insulating layer INS2 on the light emitting element LD, and the first insulating layer INS1 on the first alignment electrode ALE1. At least in the emission area EMA, the first pixel electrode PE1 may be in contact with or directly contact with the first alignment electrode ALE1 exposed by the partially opened first insulating layer INS1 to be electrically connected to the first alignment electrode ALE1.

The third insulating layer INS3 may be disposed on the first pixel electrode PE1 to cover or overlap the first pixel electrode PE1 as shown in FIGS. 8 to 10 and 12 to 14. The third insulating layer INS3 may include an inorganic insulating layer formed of an inorganic material or an organic insulating layer formed of an organic material. For example, the third insulating layer INS3 may include at least one of a metal oxide such as silicon nitride ($SiN_x$), silicon oxide ($SiO_x$), silicon oxynitride ($SiO_xN_y$), and aluminum oxide ($AlO_x$), but is not limited thereto. The third insulating layer INS3 may be formed as a single layer or multiple layers.

In case that the second and/or the third insulating layers INS2 and INS3 are formed on the light emitting elements LD, electrical stability space between the first and second end portions EP1 and EP2 of the light emitting elements LD may be secured. A short defect may be prevented from occurring between the first and second end portions EP1 and EP2 of the light emitting elements LD.

As shown in FIG. 11, in an embodiment in which the first pixel electrode PE1 and the second pixel electrode PE2 are disposed on a same layer, the third insulating layer INS3 may not be provided.

The remainder of the pixel electrodes PE may be disposed on the light emitting elements LD, the second insulating layer INS2 on the light emitting elements LD, the first insulating layer INS1 on the alignment electrode ALE, and the third insulating layer INS3 on the second insulating layer INS2, at least in the emission area EMA. For example, at least in the emission area EMA, the second pixel electrode PE2 may be disposed on the second end portion EP2 of the light emitting element LD, the second insulating layer INS2 on the light emitting element LD, the first insulating layer INS1 on the second alignment electrode ALE2, and the third insulating layer INS3 on the second insulating layer INS2. At least in the emission area EMA, the second pixel electrode PE2 may be in contact with or direct contact with the second alignment electrode ALE2 exposed by the partially opened first insulating layer INS1 to be electrically connected to the second alignment electrode ALE2.

The first pixel electrode PE1 and the second pixel electrode PE2 may be formed in different processes and provided on different layers. However, the disclosure is not limited thereto, and according to an embodiment, the first pixel electrode PE1 and the second pixel electrode PE2 may be formed in the same process and provided on a same layer as shown in FIG. 11.

The pixel electrodes PE may be formed of various transparent conductive materials. For example, the pixel electrodes PE may include at least one of various transparent conductive materials (or substances) including indium tin oxide (ITO), indium zinc oxide (IZO), zinc oxide (ZnO), indium gallium zinc oxide (IGZO), indium tin zinc oxide (ITZO), and the like, and may be formed to be substantially transparent or translucent to satisfy a transmittance. However, the material of the pixel electrodes PE is not limited to the above-described embodiment. According to an embodiment, the pixel electrodes PE may be formed of various opaque conductive materials (or substances). The pixel electrodes PE may be formed of a single layer or multiple layers.

The fourth insulating layer INS4 may be provided and/or formed on the pixel electrodes PE. The fourth insulating layer INS4 may be an inorganic insulating layer including an inorganic material or an organic insulating layer including an organic material. For example, the fourth insulating layer INS4 may have a structure in which at least one inorganic insulating layer and at least one organic insulating layer may be alternately stacked each other. The fourth insulating layer INS4 may entirely cover or overlap the display element layer DPL to prevent moisture or moisture from flowing into the display element layer DPL including the light emitting elements LD from the outside. According to an embodiment, at least one overcoat layer (for example, a layer that planarizes an upper surface of the display element layer DPL) may be further disposed on the fourth insulating layer INS4.

According to an embodiment, an upper substrate may be further disposed on the fourth insulating layer INS4 as shown in FIG. 13. The upper substrate may be provided on the display element layer DPL to cover or overlap the display area DA of the substrate SUB on which the pixel PXL is disposed. At this time, the intermediate layer CTL may be disposed on the display element layer DPL.

The intermediate layer CTL may be a transparent adhesive layer (or adhesive layer) for strengthening adhesion between the display element layer DPL and the upper substrate, for example, an optically clear adhesive layer, but is not limited thereto. According to an embodiment, the intermediate layer CTL may be a refractive index conversion layer for improving a light emission luminance of the pixel PXL by converting a refractive index of the light emitted from the light emitting elements LD and progressing to the upper substrate.

The upper substrate may be formed as an encapsulation substrate (or a thin film encapsulation layer) and/or a window member of the display device DD. The upper substrate may include a base layer BSL and a light conversion pattern LCP. The upper substrate may include a first capping layer CPL1 and a second capping layer CPL2.

The base layer BSL may be a rigid substrate or a flexible substrate, and a material or a property thereof is not particularly limited. The base layer BSL may be formed of a same material or a similar material as the substrate SUB or may be formed of a material different from that of the substrate SUB.

The light conversion pattern LCP may be disposed on one surface or a surface of the base layer BSL to face the pixels PXL of the substrate SUB. The light conversion pattern LCP may include a color conversion layer CCL and a color filter CF.

The color conversion layer CCL may include color conversion particles QD corresponding to a specific or given color. The color filter CF may selectively transmit light of the specific or given color. According to an embodiment, the color conversion layer CCL may include a scatterer.

The color conversion layer CCL may be disposed on one surface or a surface of the first capping layer CPL1 to face the pixel PXL, and may include color conversion particles QD that convert light of a first color emitted from the light emitting elements LD disposed in the corresponding pixel PXL into light of a second color. For example, in case that the pixel PXL is a red pixel (or a red sub pixel), the color conversion layer CCL may include color conversion particles QD of a red quantum dot that converts the light of the first color emitted from the light emitting elements LD into the light of the second color, for example, light of red. As another example, in case that the pixel PXL is a green pixel (or a green sub pixel), the color conversion layer CCL of the corresponding pixel PXL may include color conversion particles QD of a green quantum dot that converts the light of the first color emitted from the light emitting elements LD into the light of the second color, for example, light of green. As another example, in case that the pixel PXL is a blue pixel (or a blue sub pixel), the color conversion layer CCL of the corresponding pixel PXL may include color conversion particles QD of a blue quantum dot that converts the light of the first color emitted from the light emitting elements LD into the light of the second color, for example, light of blue. According to an embodiment, in case that the pixel PXL is the blue pixel (or the blue sub pixel), a light scattering layer including light scattering particles may be provided instead of the color conversion layer CCL including the color conversion particles QD. For example, in case that the light emitting elements LD emit blue-based light, the pixel PXL may include a light scattering layer including light scattering particles. The above-described light scattering layer may be omitted according to an embodiment. According to an embodiment, in case that the pixel PXL is the blue pixel (or the blue sub pixel), a transparent polymer may be provided instead of the color conversion layer CCL.

The color filter CF may selectively transmit light of a specific or given color. The color filter CF may form the light conversion pattern LCP together with the color conversion layer CCL, and may include a color filter material that selectively transmits light of a specific or given color converted by the color conversion layer CCL. The color filter CF may include a red color filter, a green color filter, and a blue color filter. The above-described color filter CF may be provided on one surface or on a surface of the base layer BSL to correspond to the color conversion layer CCL.

The light conversion pattern LCP including the color conversion layer CCL and the color filter CF may correspond to the emission area EMA of the pixel PXL.

The first capping layer CPL1 may be provided and/or formed between the color filter CF and the color conversion layer CCL.

The first capping layer CPL1 may be positioned on the color filter CF to cover or overlap the color filter CF, thereby protecting the color filter CF. The first capping layer CPL1 may be an inorganic insulating layer including an inorganic material or an organic insulating layer including an organic material.

A light blocking pattern LBP may be positioned adjacent to the light conversion pattern LCP. In an embodiment, the light blocking pattern LBP may be disposed on one surface or a surface of the base layer BSL to correspond to the non-emission area NEMA of the pixel PXL. The light blocking pattern LBP may correspond to the bank BNK of the display element layer DPL.

The light blocking pattern LBP may include a first light blocking pattern LBP1 and a second light blocking pattern LBP2.

The first light blocking pattern LBP1 may be disposed on one surface or a surface of the base layer BSL and may be disposed adjacent to the color filter CF.

According to an embodiment, the first light blocking pattern LBP1 may be provided in a form of multiple layers in which at least two or more color filters that selectively transmit light of different colors among a red color filter, a green color filter, and a blue color filter are overlapped. For example, the first light blocking pattern LBP1 may be provided in a form including the red color filter, the green color filter positioned on the red color filter and overlap the red color filter, and the blue color filter positioned on the green color filter and overlap the green color filter. For example, the first light blocking pattern LBP1 may be provided in a form of a structure in which the red color filter, the green color filter, and the blue color filter may be sequentially stacked each other. In the non-emission area NEMA of the pixel area PXA, the red color filter, the green color filter, and the blue color filter may be used as the first light blocking pattern LBP1 blocking transmission of light.

According to an embodiment, the first capping layer CPL1 may be provided and/or formed on the first light blocking pattern LBP1. The first capping layer CPL1 may be entirely disposed on the first light blocking pattern LBP1 and the color filter CF.

The second light blocking pattern LBP2 may be provided and/or formed on one surface or a surface of the first capping layer CPL1 to correspond to the first light blocking pattern LBP1. The second light blocking pattern LBP2 may be a black matrix. The first blocking pattern LBP1 and the second blocking pattern LBP2 may include a same material or a similar material. In an embodiment, the second light blocking pattern LBP2 may be a structure that finally defines the emission area EMA of the pixel PXL. For example, in a step of supplying the color conversion layer CCL including the color conversion particles QD, the second light blocking pattern LBP2 may be a dam structure that finally defines the emission area EMA to which the color conversion layer CCL is to be supplied.

The second capping layer CPL2 may be provided and/or formed entirely on the color conversion layer CCL and the second light blocking pattern LBP2.

The second capping layer CPL2 may include at least one of a metal oxide such as silicon nitride ($SiN_x$), silicon oxide ($SiO_x$), silicon oxynitride ($SiO_xN_y$), and aluminum oxide ($AlO_x$), but is not limited thereto. According to an embodiment, the second capping layer CPL2 may be formed of an organic layer (or an organic insulating layer) including an organic material. The second capping layer CPL2 may be positioned on the color conversion layer CCL to protect the color conversion layer CCL from external moisture, moisture, and the like, thereby further improving reliability of the color conversion layer CCL.

The above-described upper substrate may be positioned on the intermediate layer CTL to be connected or coupled to the display element layer DPL. To this end, the intermediate layer CTL may include a transparent adhesive layer (or an adhesive layer) for strengthening adhesion between the display element layer DPL and the upper substrate.

In the display device DD according to the above-described embodiment, the light emission efficiency may be improved by disposing the light conversion pattern LCP on the light emitting element LD to emit light having excellent color reproducibility through the light conversion pattern LCP.

In the above-described embodiment, the upper substrate including the base layer BSL and the light conversion pattern LCP is positioned on the display element layer DPL, but the disclosure is not limited thereto.

According to an embodiment, the light conversion pattern LCP may be formed on one surface or a surface of the substrate SUB on which the display element layer DPL is provided.

According to an embodiment, as shown in FIG. 14, a partial configuration of the light conversion pattern LCP, for example, the color conversion layer CCL, may be formed on one surface or a surface of the substrate SUB on which the pixel PXL is provided, and another configuration (or the remaining configurations) of the light conversion pattern LCP, for example, the color filter CF may be formed on one surface or a surface of the base layer BSL. Therefore, the color filter CF and the color conversion layer CCL may be provided to face each other with the intermediate layer CTL interposed therebetween.

The color conversion layer CCL may be provided and/or formed on the fourth insulating layer INS4 in a form of filling an area surrounded by the bank BNK.

The intermediate layer CTL may be positioned on the color conversion layer CCL. The intermediate layer CTL may be at least one insulating layer, but is not limited thereto. According to an embodiment, the intermediate layer CTL may be the intermediate layer CTL described with reference to FIG. 13. The base layer BSL including the color filter CF and the light blocking pattern LBP may be provided and/or formed on the intermediate layer CTL.

The color filter CF and the light blocking pattern LBP may be disposed on one surface or a surface of the base layer BSL and may face the color conversion layer CCL and the bank BNK with the intermediate layer CTL interposed therebetween. For example, the color filter CF may face the color conversion layer CCL with the intermediate layer CTL interposed therebetween, and the light blocking pattern LBP may face the bank BNK with the intermediate layer CTL interposed therebetween.

The light blocking pattern LBP may correspond to the non-emission area NEMA of the pixel PXL, and the color filter CF may correspond to the emission area EMA of the pixel PXL.

The light blocking pattern LBP may include a light blocking material that prevents a light leakage defect in which light (or ray) leaks between the pixel PXL and the pixels PXL adjacent thereto. The light blocking pattern LBP may be a black matrix. The light blocking pattern LBP may prevent color mixing of light emitted from each of the adjacent pixels PXL. The light blocking pattern LBP may be a configuration corresponding to the first light blocking pattern LBP1 described with reference to FIG. 13.

In the above-described embodiment, the color conversion layer CCL and the color filter CF are formed to face each other with the intermediate layer CTL interposed therebetween, but the disclosure is not limited thereto. According to an embodiment, the light conversion pattern LCP including the color conversion layer CCL and the color filter CF may be formed on one surface or a surface of the substrate SUB on which the display element layer DPL is provided.

According to the above-described embodiment, the patterns PAT formed of the SAM including the hydrophilic group (or the hydrophilic functional group) such as a hydroxyl group (—OH) or a carboxyl group (—COOH) at an end may be formed on the first insulating layer INS1 including silicon oxide at least in the emission area EMA before aligning the light emitting elements LD. In the step of aligning the light emitting elements LD, repulsive force may be generated between the patterns PAT having hydrophilicity and the light emitting elements LD on which surface treatment is performed so that the light emitting elements LD have hydrophobicity. The repulsive force may reduce frictional force between the light emitting elements LD and the patterns PAT to prevent the light emitting elements LD from being separated from the aligned position. The repulsive force may minimize a limitation for movement of the light emitting elements LD by weakening the force to be fixed at the aligned position of the light emitting elements LD, thereby readily controlling the deflection alignment of the light emitting elements LD.

According to the above-described embodiment, hydrophobic treatment is performed on at least one surface or on a surface of the bank BNK to form a hydrophobic thin film on the upper surface A and the side surface B of the bank BNK. At this time, in case that the ink dispersed in the light emitting elements LD is sprayed to the pixel area PXA, the ink may be discharged to the first insulating layer INS1 and the patterns PAT having hydrophilicity to maintain an initial position. In case that the ink is discharged to the upper surface A and the side surface B of the bank BNK having hydrophobicity, the ink may form strong attractive force with the first insulating layer INS1 and the patterns PAT having hydrophilicity, and thus may move to at least the emission area EMA. Accordingly, the number of light emitting elements LD positioned between the first alignment electrode ALE1 and the second alignment electrode ALE2 among the light emitting elements LD dispersed in the ink may increase. Therefore, an effective light source of the pixel PXL may be further secured, and thus the light emission efficiency of the pixel PXL may be improved.

Figure 15:
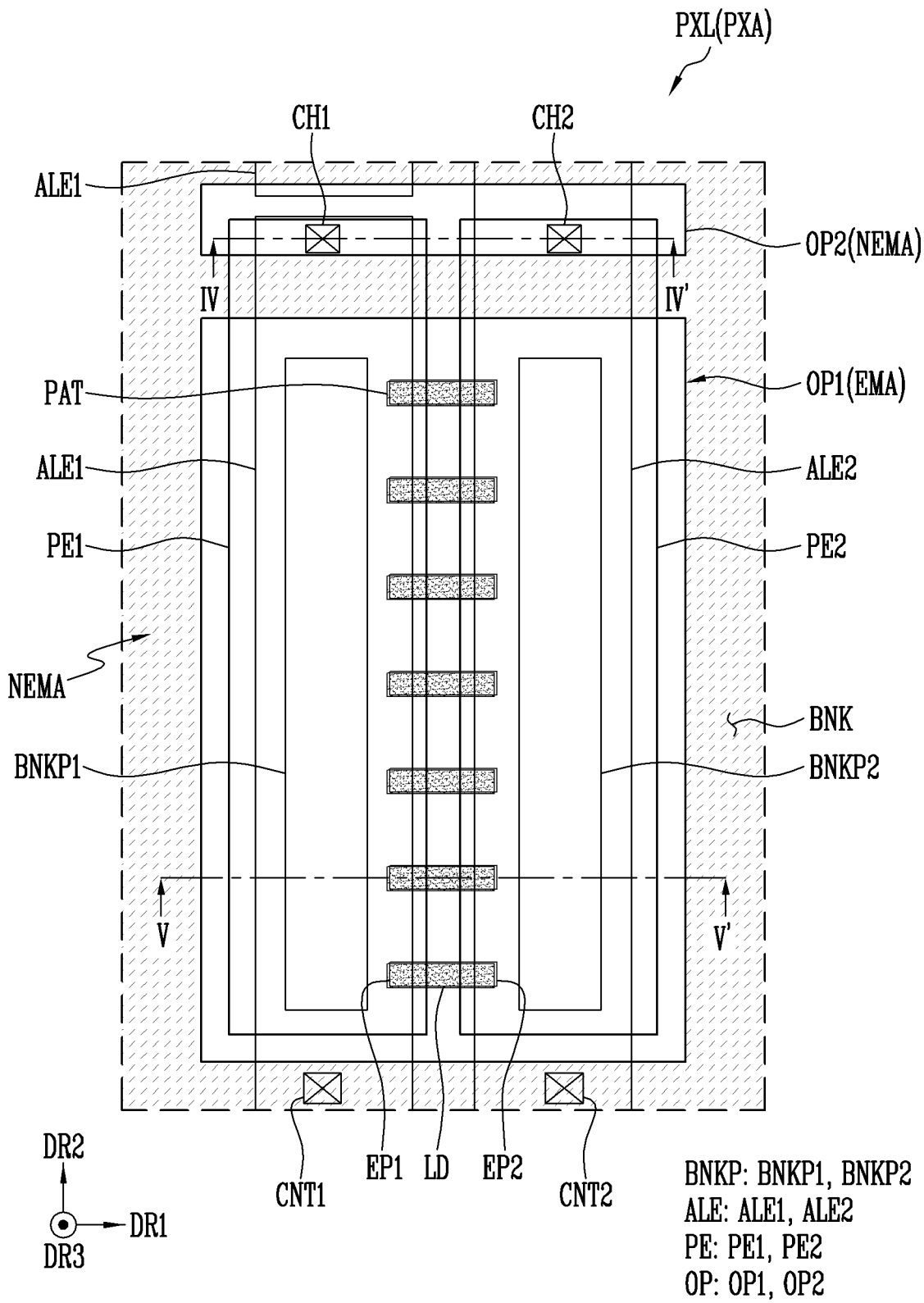
FIG. 15 is a schematic plan view schematically illustrating the pixel shown in FIG. 4.
Figure 16:
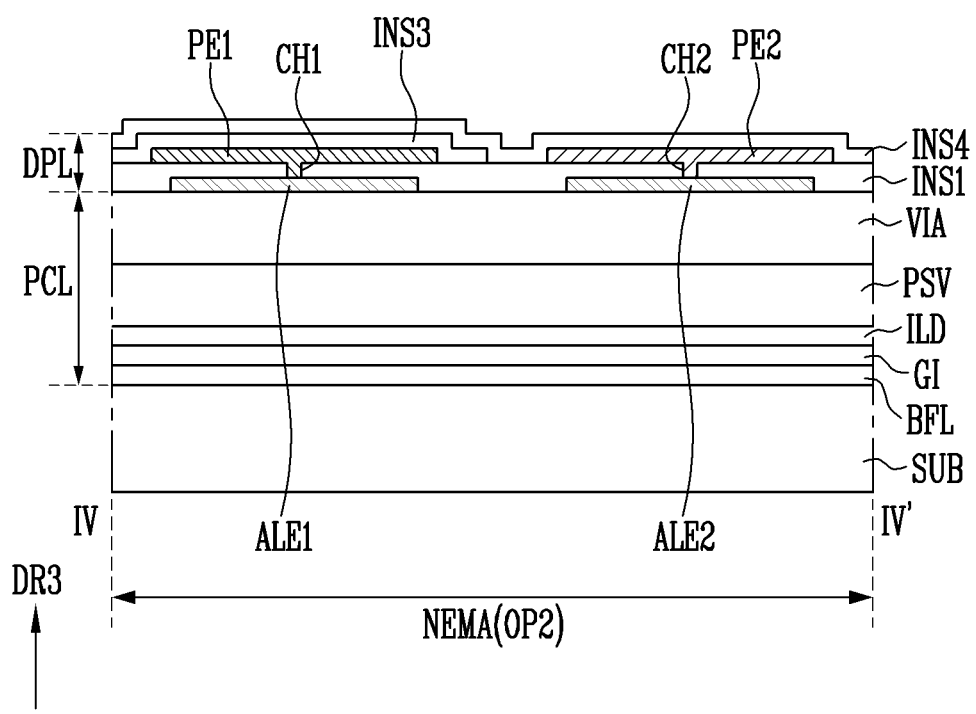
FIG. 16 is a schematic cross-sectional view taken along line IV~IV' of FIG. 15.
Figure 17:
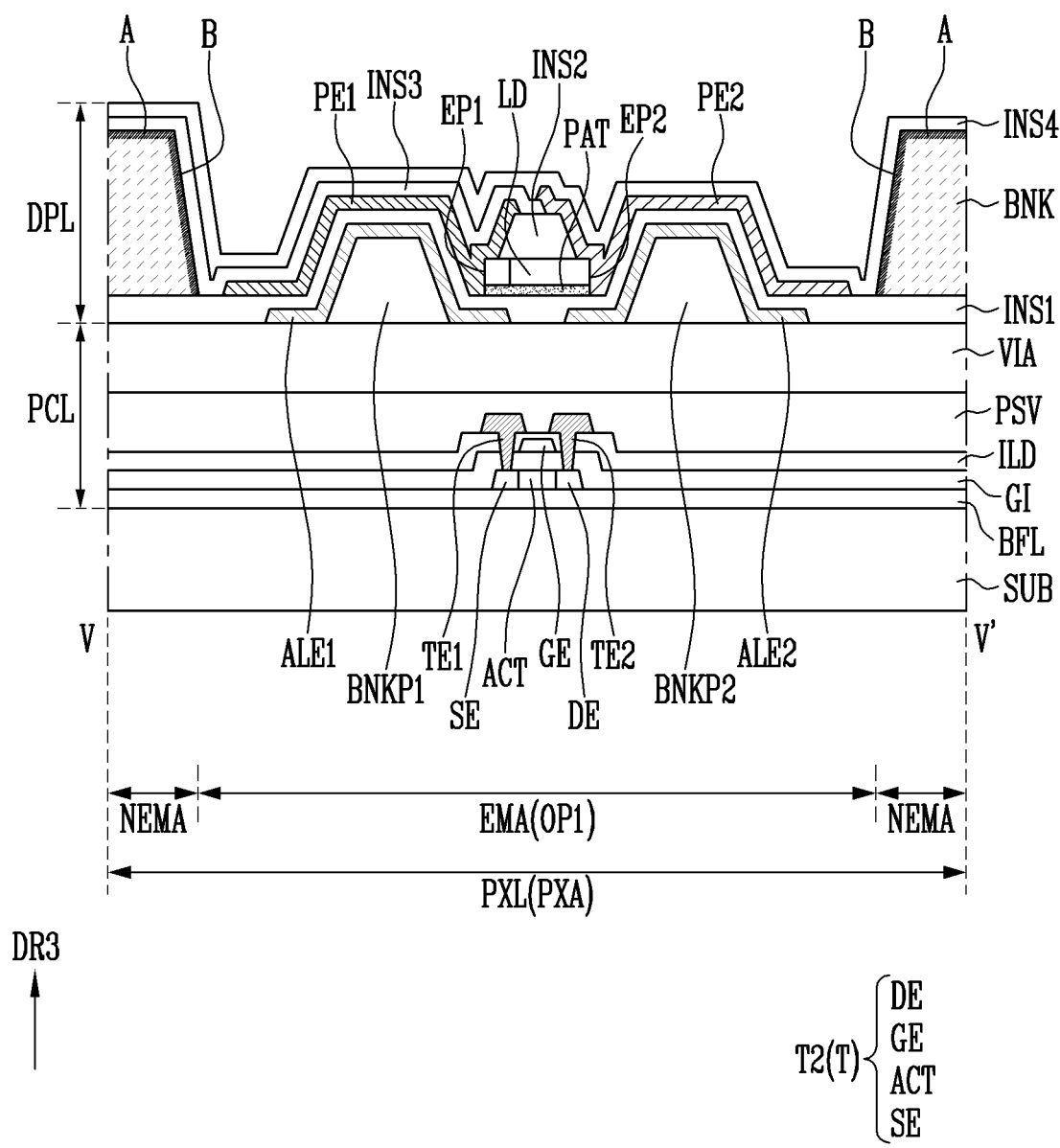
FIG. 17 is a schematic cross-sectional view taken along line V~V' of FIG. 15.

FIG. 15 is a schematic plan view schematically illustrating the pixel PXL shown in FIG. 4, FIG. 16 is a schematic cross-sectional view taken along line IV~IV' of FIG. 15, and FIG. 17 is a schematic cross-sectional view taken along line V~V' of FIG. 15.

The pixel PXL shown in FIGS. 15 to 17 may have a configuration substantially the same as or similar to that of the pixel PXL shown in FIGS. 7 to 14 except that an electrical connection of the pixel electrode PE and the alignment electrode ALE is formed in the second opening OP2 of the bank BNK.

Accordingly, in relation to the pixel PXL of FIGS. 15 to 17, differences from the above-described embodiment are described in order to avoid a repetitive description.

Referring to FIGS. 15 to 17, the pixel electrode PE and the alignment electrode ALE may be electrically connected to each other in the non-emission area NEMA of the pixel PXL. For example, the first pixel electrode PE1 and the first alignment electrode ALE1 may be electrically and/or physically connected to each other through a first contact hole CH1 in the second opening OP2 (or the electrode separation area) of the bank BNK included in the non-emission area NEMA. The second pixel electrode PE2 and the second alignment electrode ALE2 may be electrically and/or physically connected to each other through a second contact hole CH2 in the second opening OP2 of the bank BNK.

The first and second contact holes CH1 and CH2 may be positioned in the second opening OP2 of the bank BNK, which is the electrode separation area, and may be formed by removing a portion at least one insulating layer positioned between the alignment electrode ALE and the pixel electrode PE. For example, the first contact hole CH1 may be positioned in the second opening OP2 of the bank BNK and may be formed by removing a portion of the first insulating layer INS1 positioned between the first alignment electrode ALE1 and the first pixel electrode PE1. The first contact hole CH1 may expose at least one area or an area of the first alignment electrode ALE1 in the non-emission area NEMA. The second contact hole CH2 may be positioned in the second opening OP2 of the bank BNK, and may be formed by removing a portion of the first insulating layer INS1 positioned between the second alignment electrode ALE2 and the second pixel electrode PE2. The second contact hole CH2 may expose at least one area or an area of the second alignment electrode ALE2 in the non-emission area NEMA.

The electrical connection of the first pixel electrode PE1 and the first alignment electrode ALE1 and the electrical connection of the second pixel electrode PE2 and the second alignment electrode ALE2 are formed in the second opening OP2 of the bank BNK, which is the electrode separation area (for example, the first pixel electrode PE1 and the first alignment electrode ALE1 are electrically connected in the non-emission area NEMA, and the second pixel electrode PE2 and the second alignment electrode ALE2 are electrically connected in the non-emission area NEMA), as shown in FIG. 17, the first insulating layer INS1 positioned each of areas between the first pixel electrode PE1 and the first alignment electrode ALE1 and between the second pixel electrode PE2 and the second alignment electrodes ALE2 may not be opened at least in the emission area EMA. Accordingly, at least in the emission area EMA, the first and second alignment electrodes ALE1 and ALE2 may be completely covered or overlapped by the first insulating layer INS1.

Figure 18A:
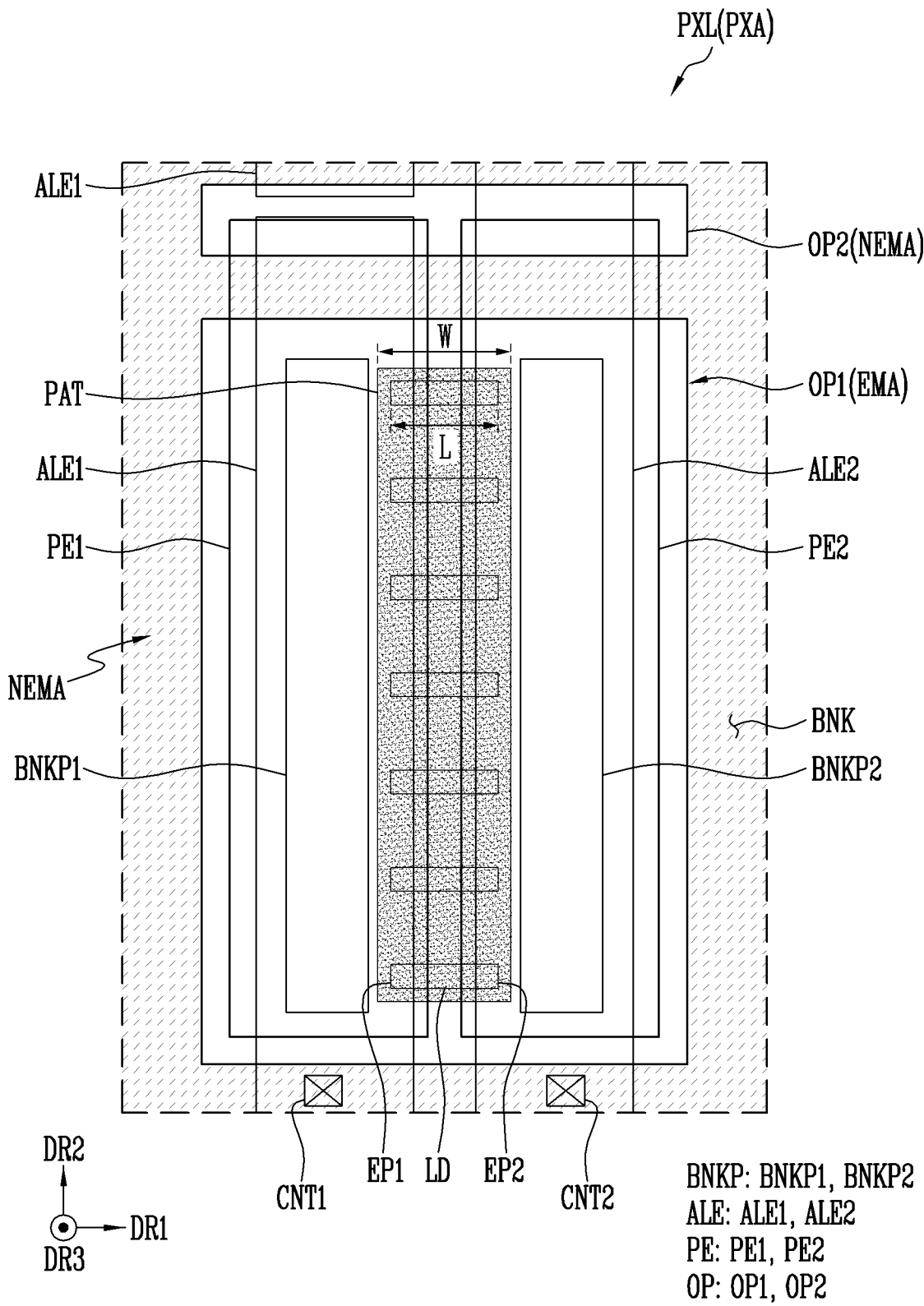
FIGS. 18A and 18B are schematic plan views schematically illustrating the pixel PXL shown in FIG. 4.
Figure 18B:
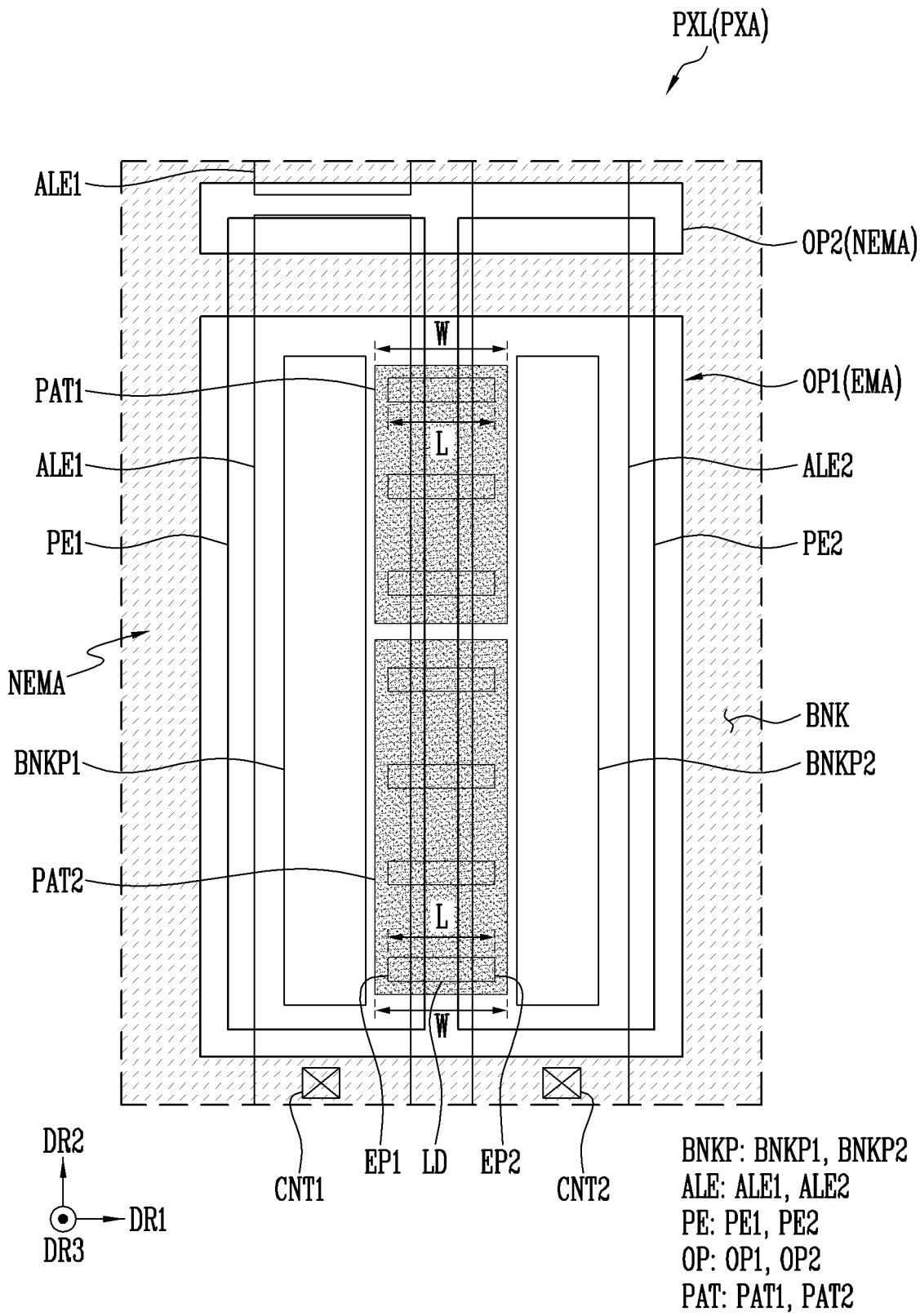

FIGS. 18A and 18B are schematic plan views schematically illustrating the pixel PXL shown in FIG. 4.

The pixels PXL shown in each of FIGS. 18A and 18B represent modified embodiments of the embodiment of FIG. 7 in relation to the pattern PAT and the like within the spirit and the scope of the disclosure. For example, FIG. 18A discloses an embodiment in which one pattern PAT overlaps the light emitting elements LD at least in the emission area EMA, and FIG. 18B discloses an embodiment in which the first and second patterns PAT1 and PAT2 spaced from each other overlap the corresponding light emitting elements LD at least in the emission area EMA.

Accordingly, in relation to the pixel PXL of FIGS. 18A and 18B, differences from the above-described embodiment are described in order to avoid a repetitive description.

First, referring to FIGS. 4 and 18A, the pixel PXL may include one pattern PAT overlapping the light emitting elements LD disposed between the first alignment electrode ALE1 and the second alignment electrode ALE2.

The pattern PAT may have a width W greater than the length L of the light emitting elements LD in the first direction DR1, but is not limited thereto. According to an embodiment, the pattern PAT may have a same width W as the length L of the light emitting elements LD in the first direction DR1. The pattern PAT may have a bar shape extending along the second direction DR2.

The above-described pattern PAT may be combined to a base member having a hydrophilic functional group such as a hydroxyl group (—OH) (for example, the first insulating layer INS1 described with reference to FIG. 8) to be formed of the SAM including the hydrophilic functional group at the end which modifies a surface of the base member so that the surface has hydrophilicity.

At least in the emission area EMA, as one pattern PAT has a shape extended to overlap all of the light emitting elements LD disposed between the first alignment electrode ALE1 and the second alignment electrode ALE2, in the step of aligning the light emitting elements LD, the repulsive force generated between the light emitting elements LD on which surface treatment is performed so that the light emitting elements LD have hydrophobicity and the pattern PAT having hydrophilicity may increase. Accordingly, the frictional force between the pattern PAT and the light emitting elements LD may be further reduced, and thus the light emitting elements LD may be prevented from being separated from the aligned position.

As shown in FIGS. 4 and 18B, the pattern PAT may include the first pattern PAT1 and the second pattern PAT2 spaced from each other in the emission area EMA of the pixel PXL.

The first pattern PAT1 and the second pattern PAT2 may be spaced from each other in the second direction DR2 and may overlap the corresponding light emitting elements LD, respectively. For example, the first pattern PAT1 may overlap some or a number of the light emitting elements LD positioned at an upper end portion of the emission area EMA in case that viewed in a plan view. The second pattern PAT2 may be disposed to be spaced from the first pattern PAT1 in the second direction DR2, and may overlap the remaining light emitting elements LD positioned at a lower end portion of the emission area EMA.

The first pattern PAT1 and the second pattern PAT2 may include a same material or a similar material through the same process. For example, the first and second patterns PAT1 and PAT2 may be combined to the base member having a hydrophilic functional group such as a hydroxyl group (—OH) (for example, the first insulating layer INS1 described with reference to FIG. 8) to be formed of the SAM including the hydrophilic functional group at the end which modifies the surface of the base member so that the surface has hydrophilicity.

Each of the first and second patterns PAT1 and PAT2 may have a width W greater than the length L of the light emitting elements LD in the first direction DR1, but is not limited thereto. According to an embodiment, each of the first and second patterns PAT1 and PAT2 may have the same width W as the length L of the light emitting elements LD in the first direction DR1. Each of the first and second patterns PAT1 and PAT2 may have a bar shape extending in the second direction DR2.

Figure 19A:
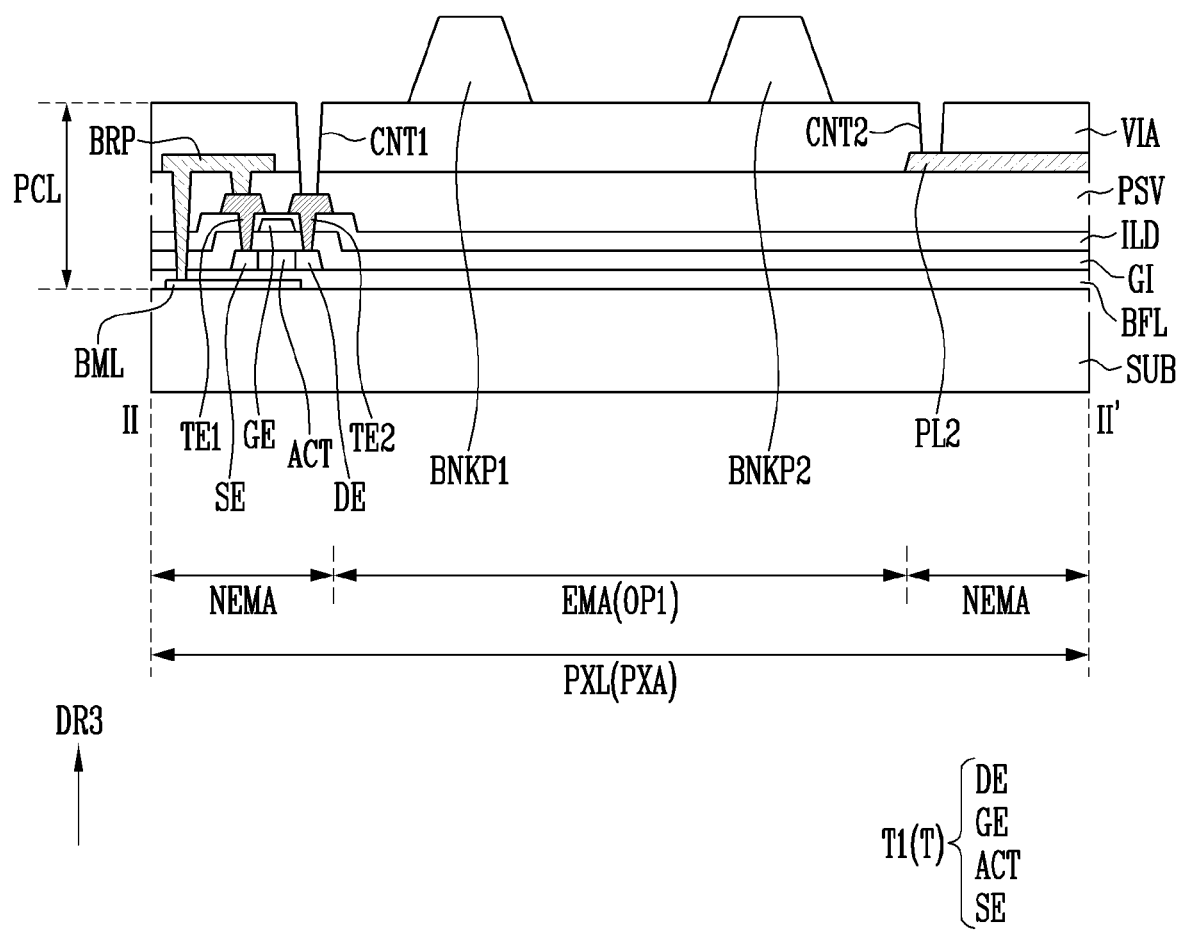
FIGS. 19A to 19N are schematic cross-sectional views schematically illustrating a method of manufacturing the pixel shown in FIG. 8.
Figure 19B:
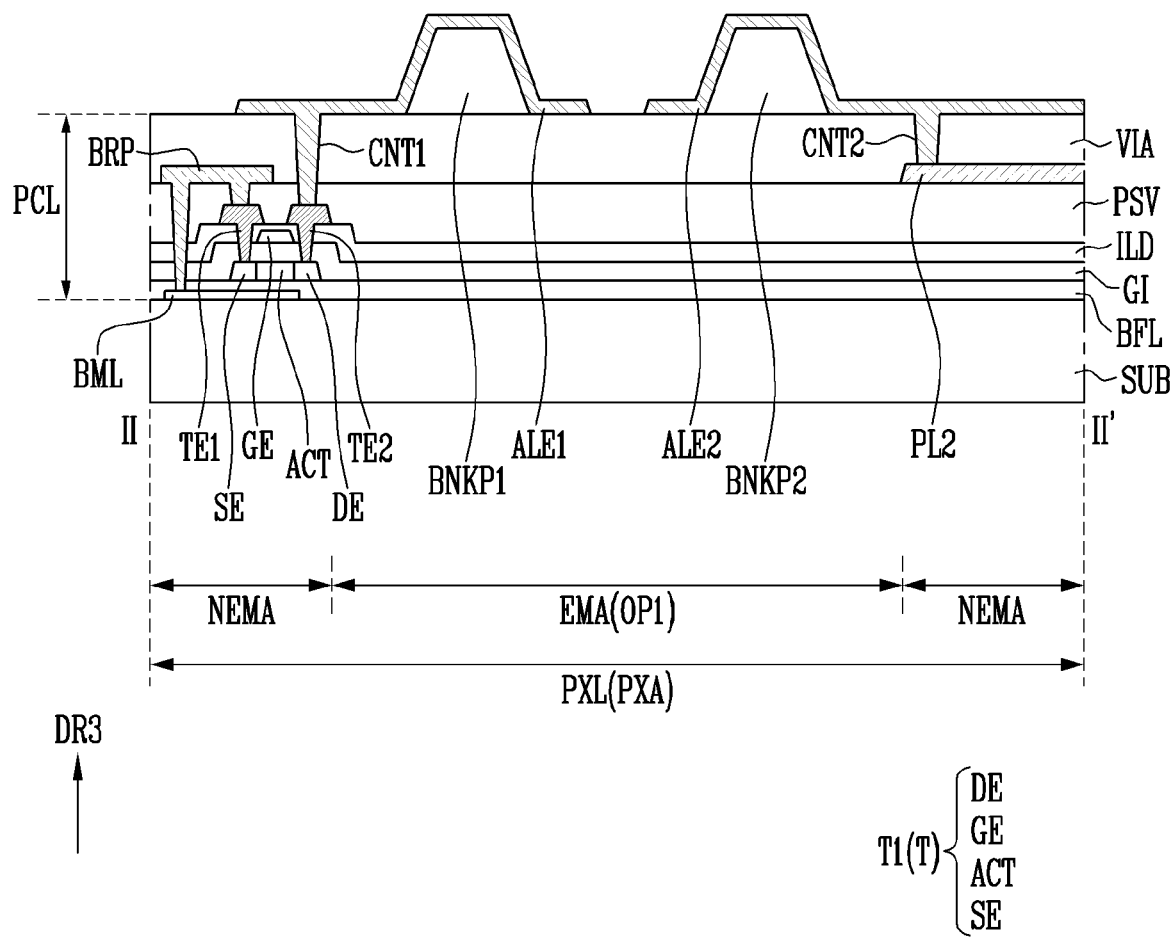
Figure 19C:
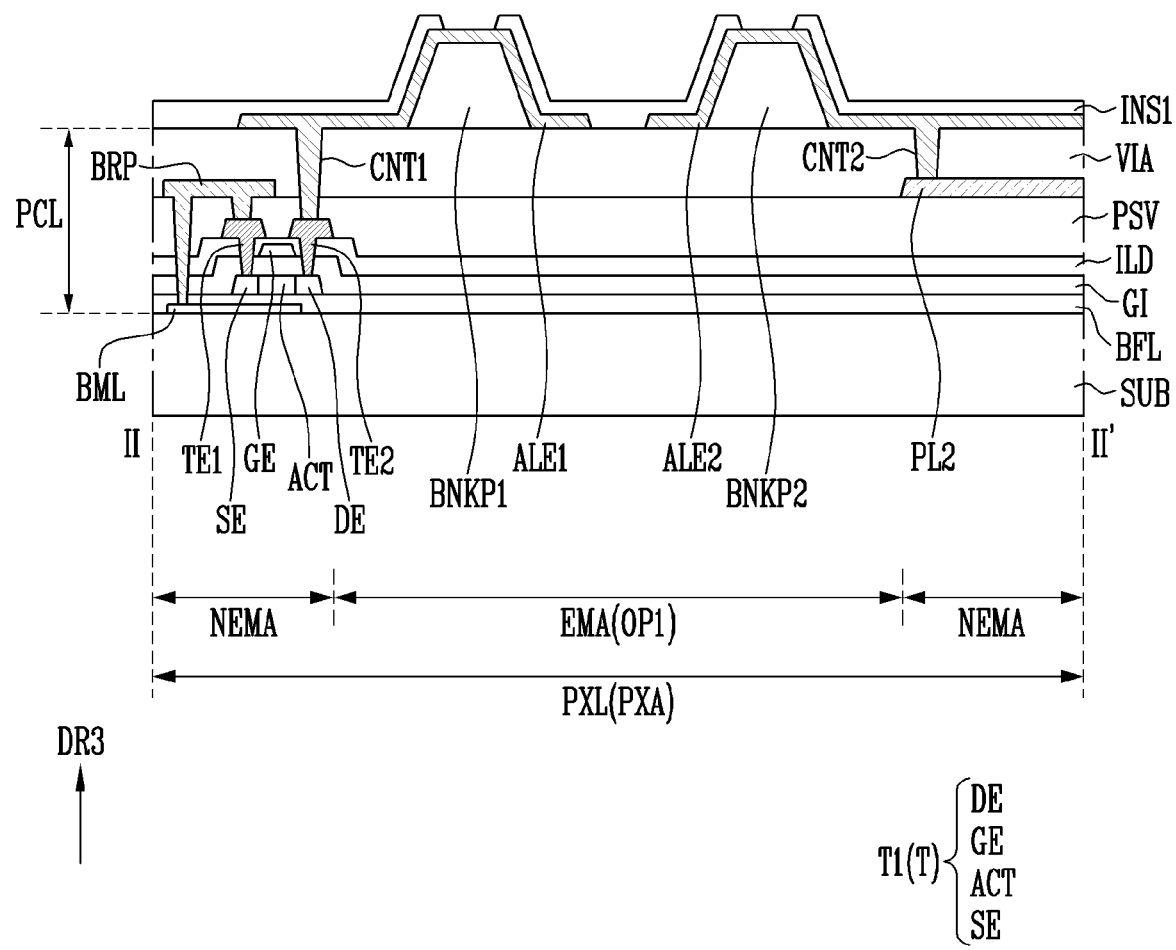
Figure 19D:
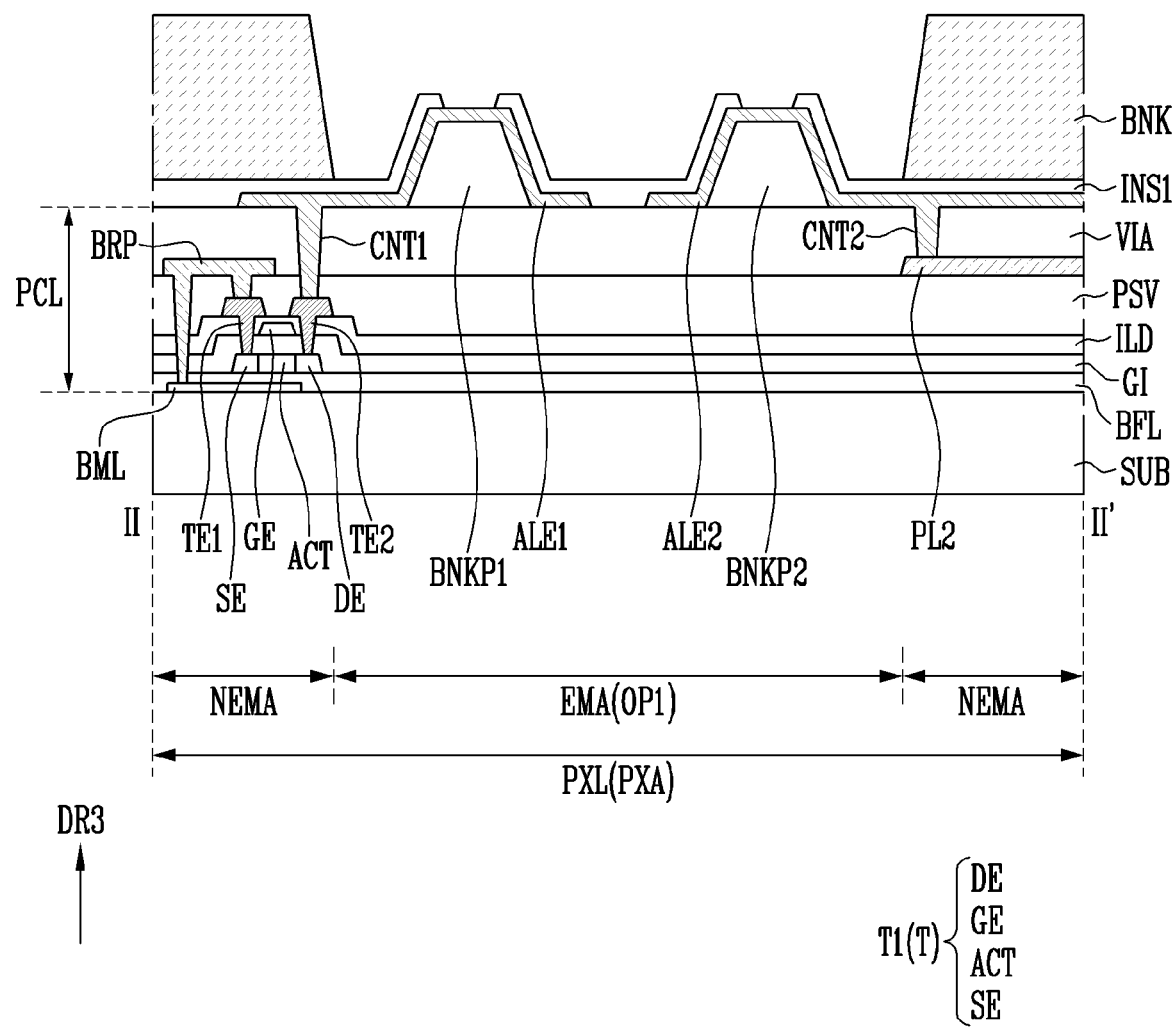
Figure 19E:
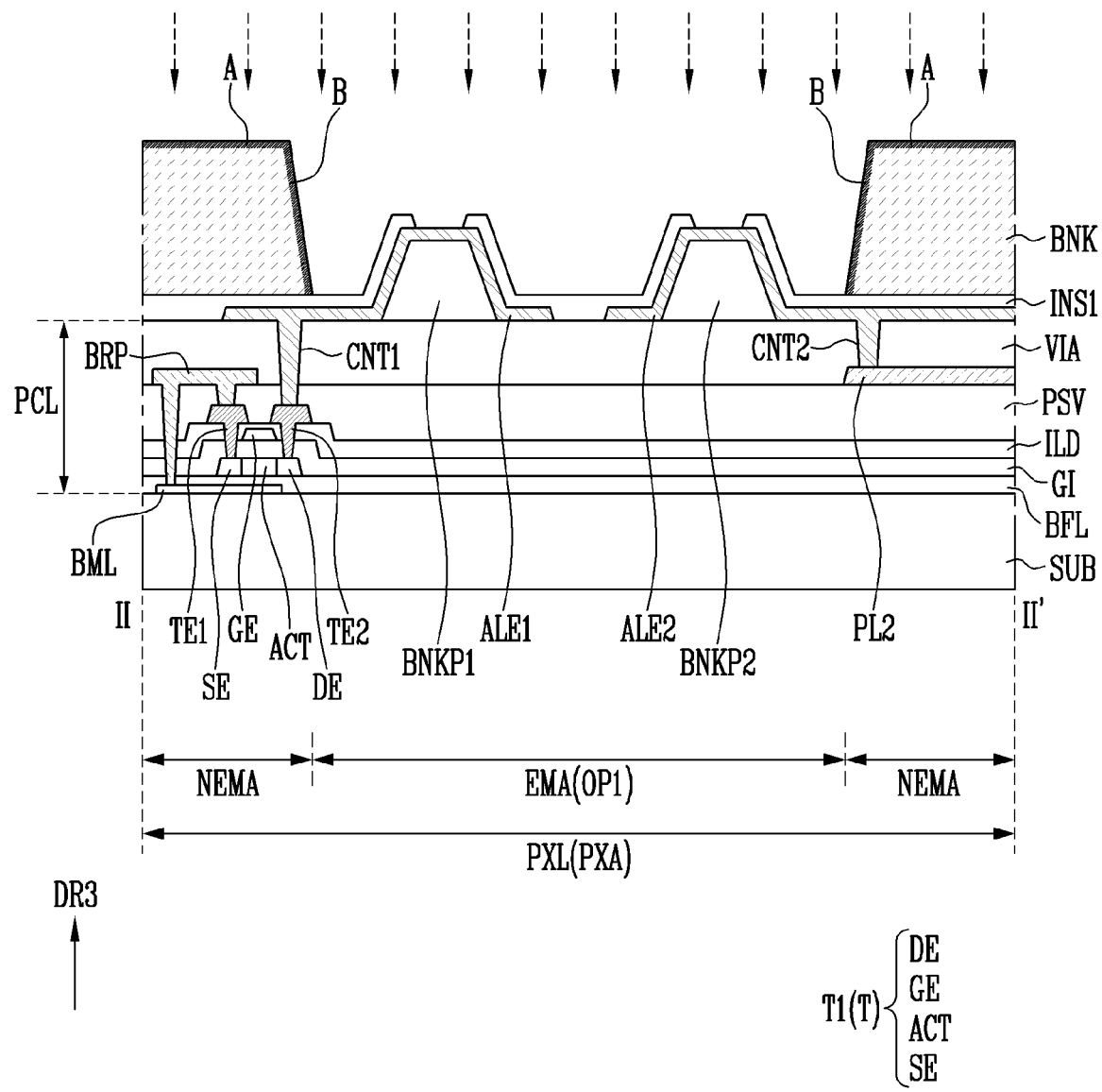
Figure 19F:
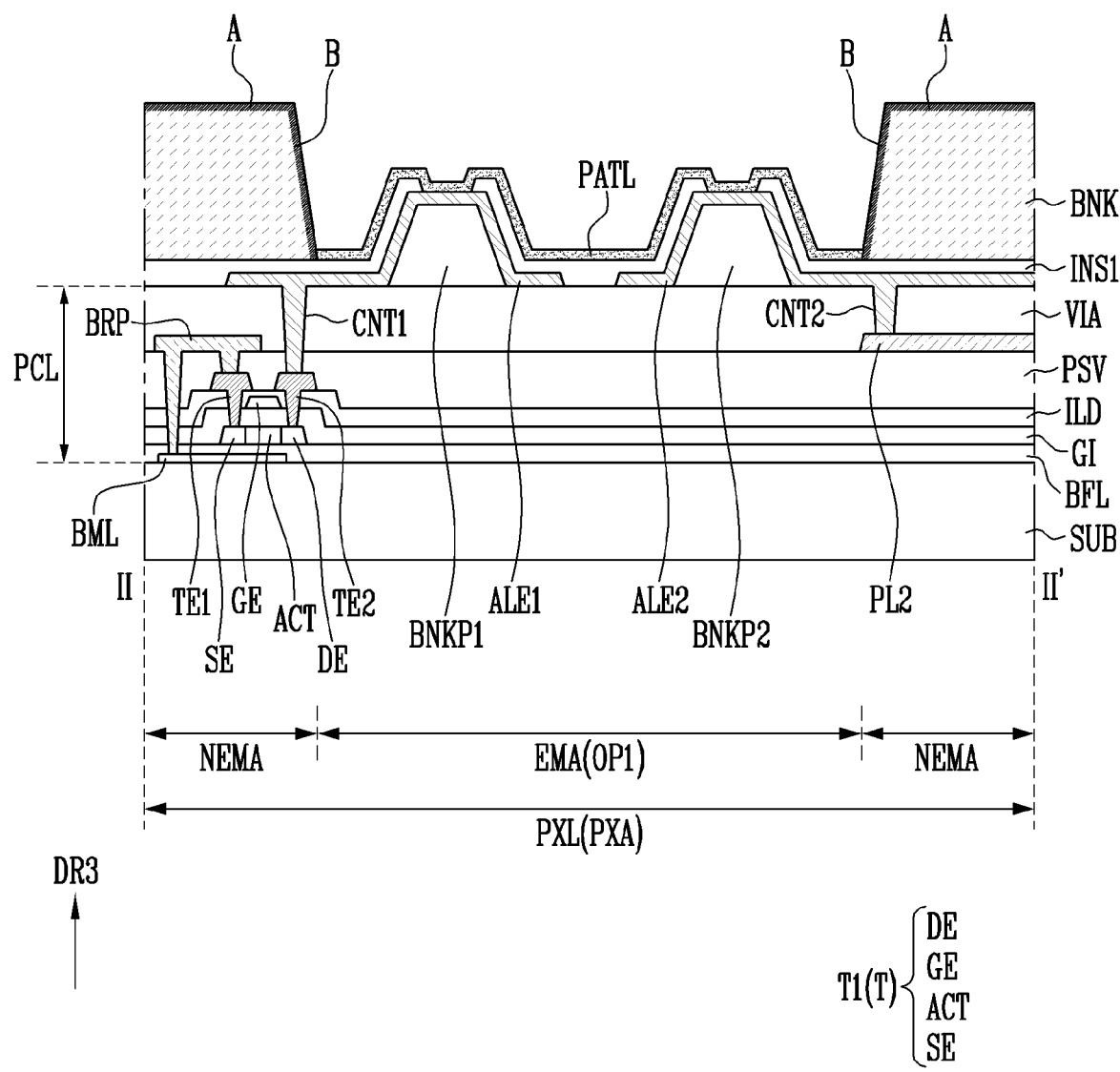
Figure 19G:
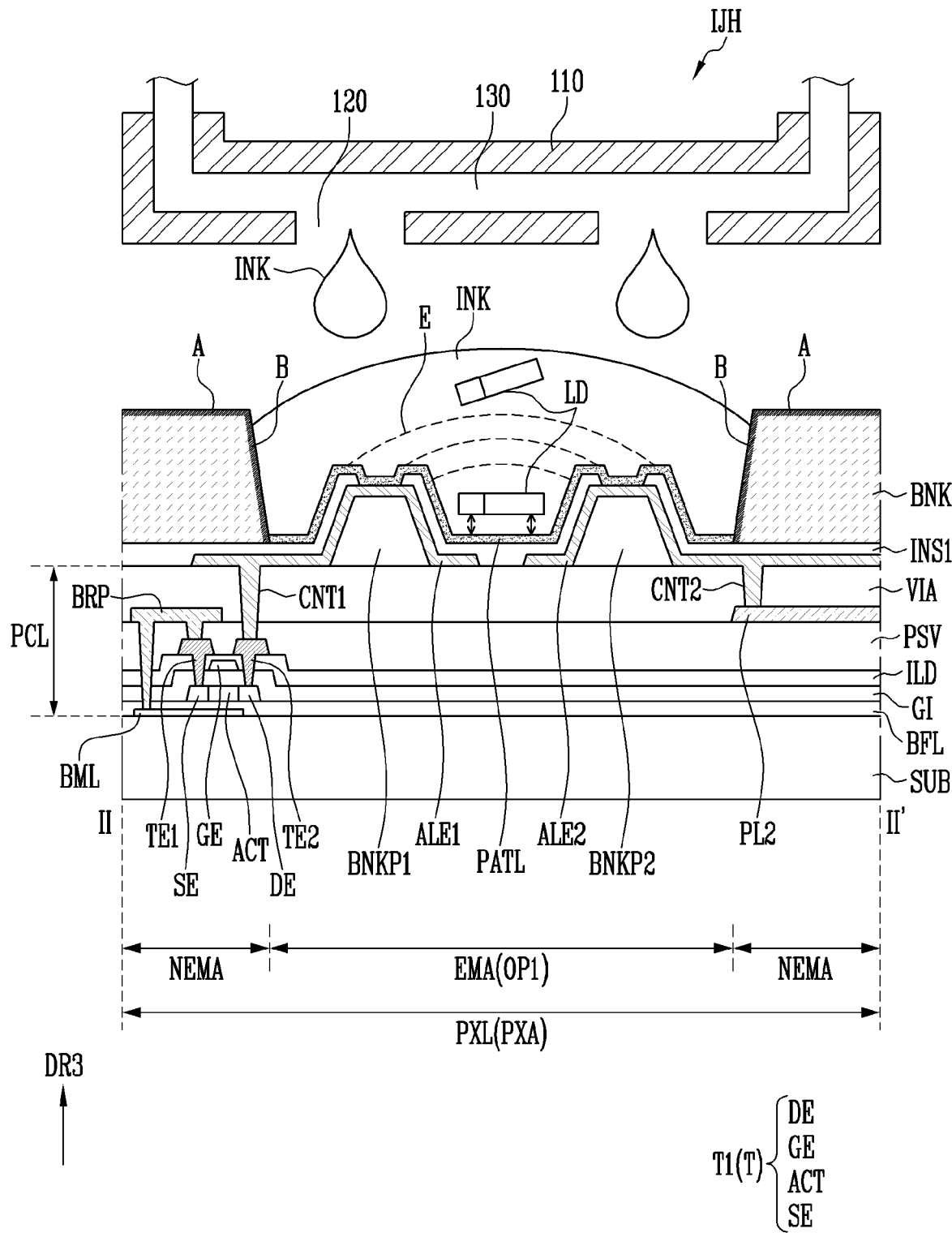
Figure 19H:
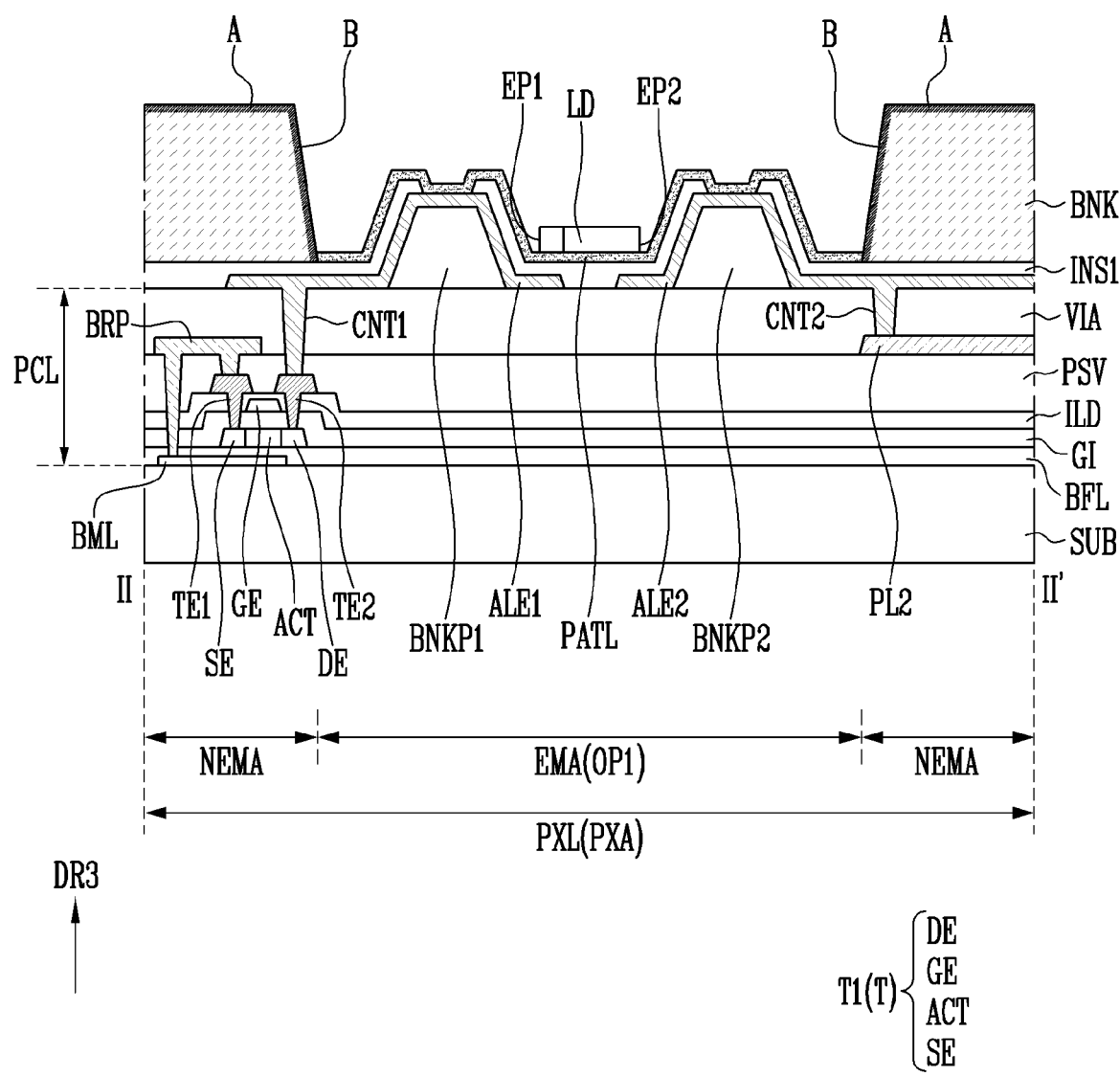
Figure 19I:
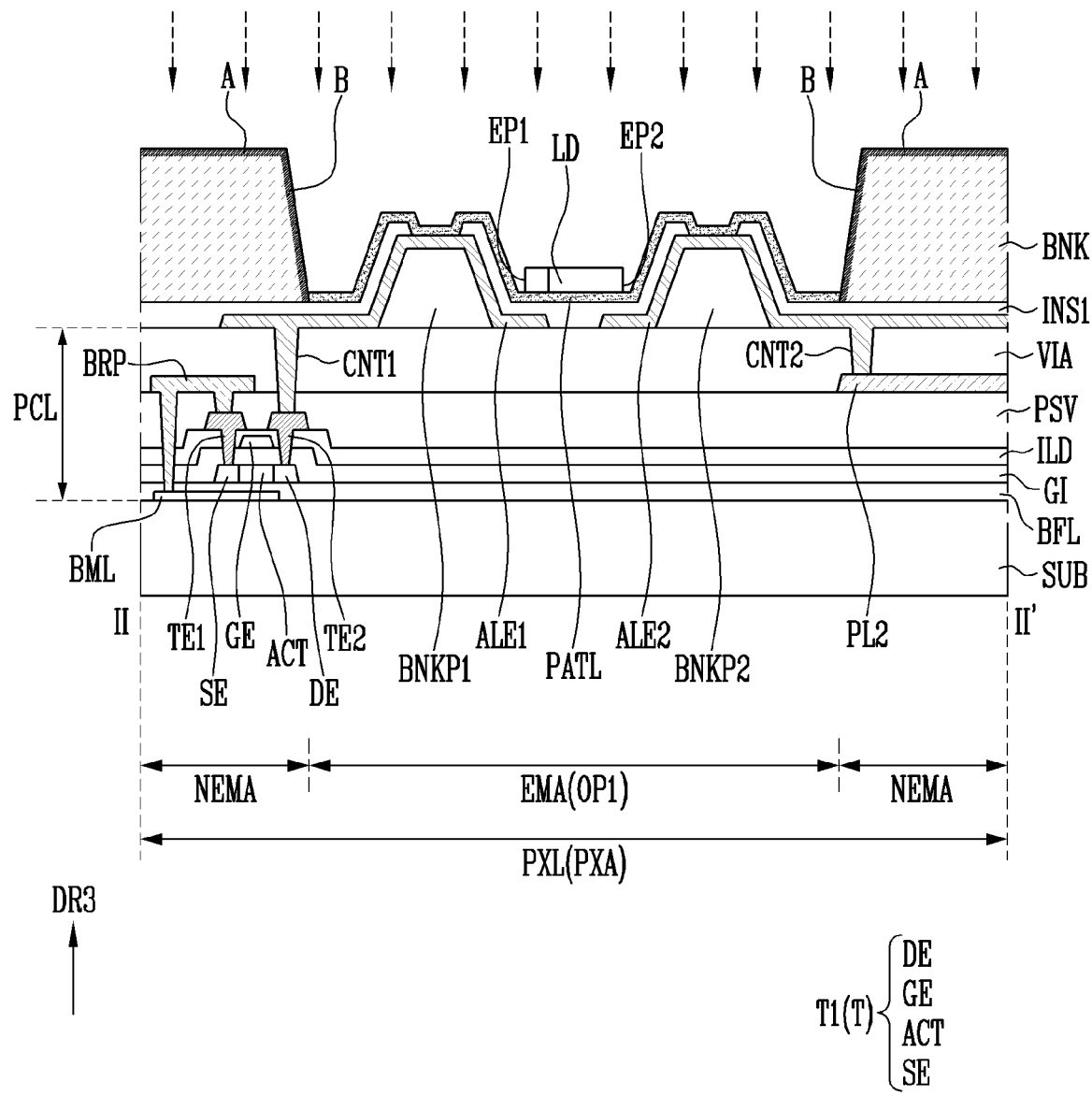
Figure 19J:
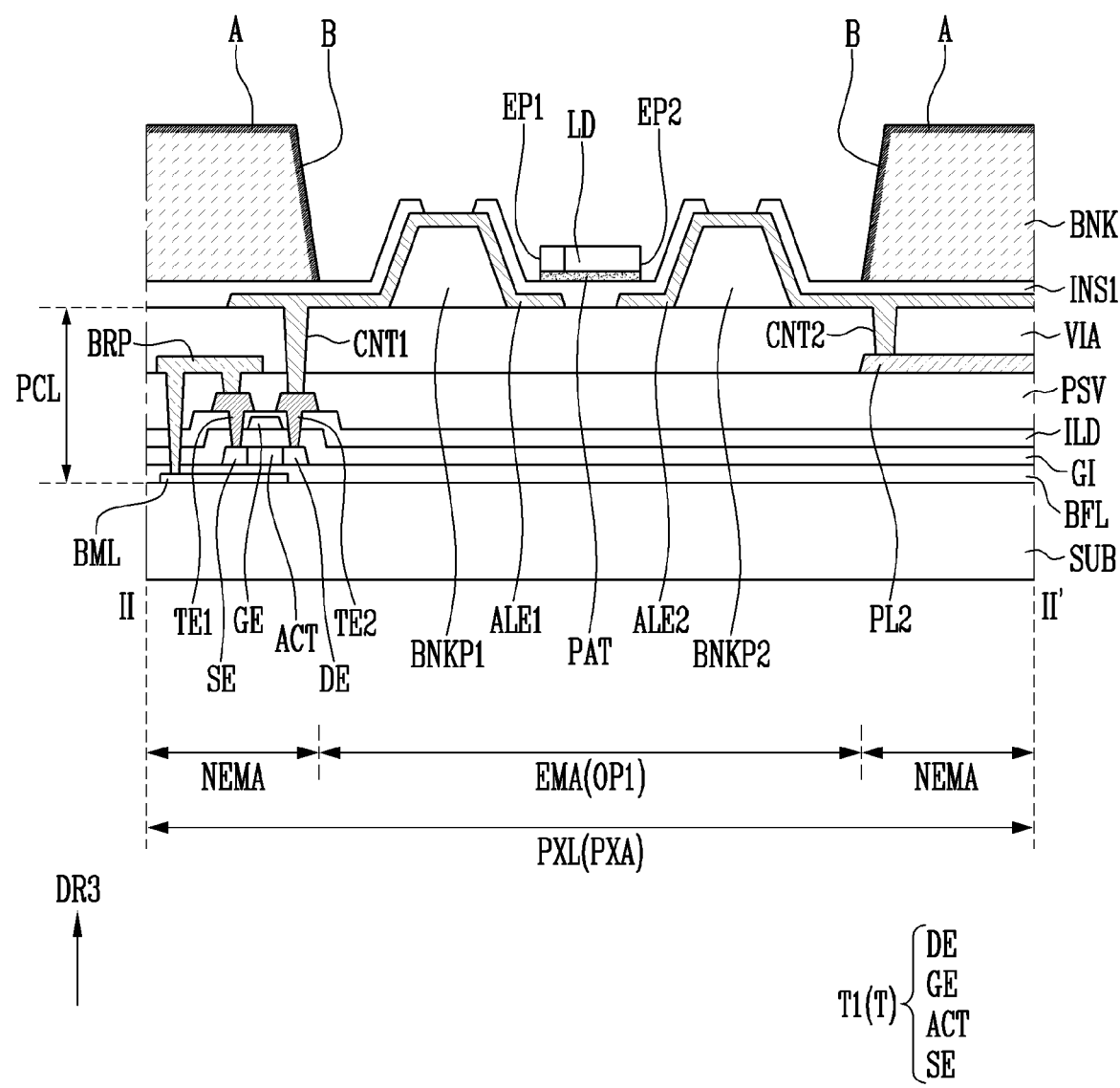
Figure 19K:
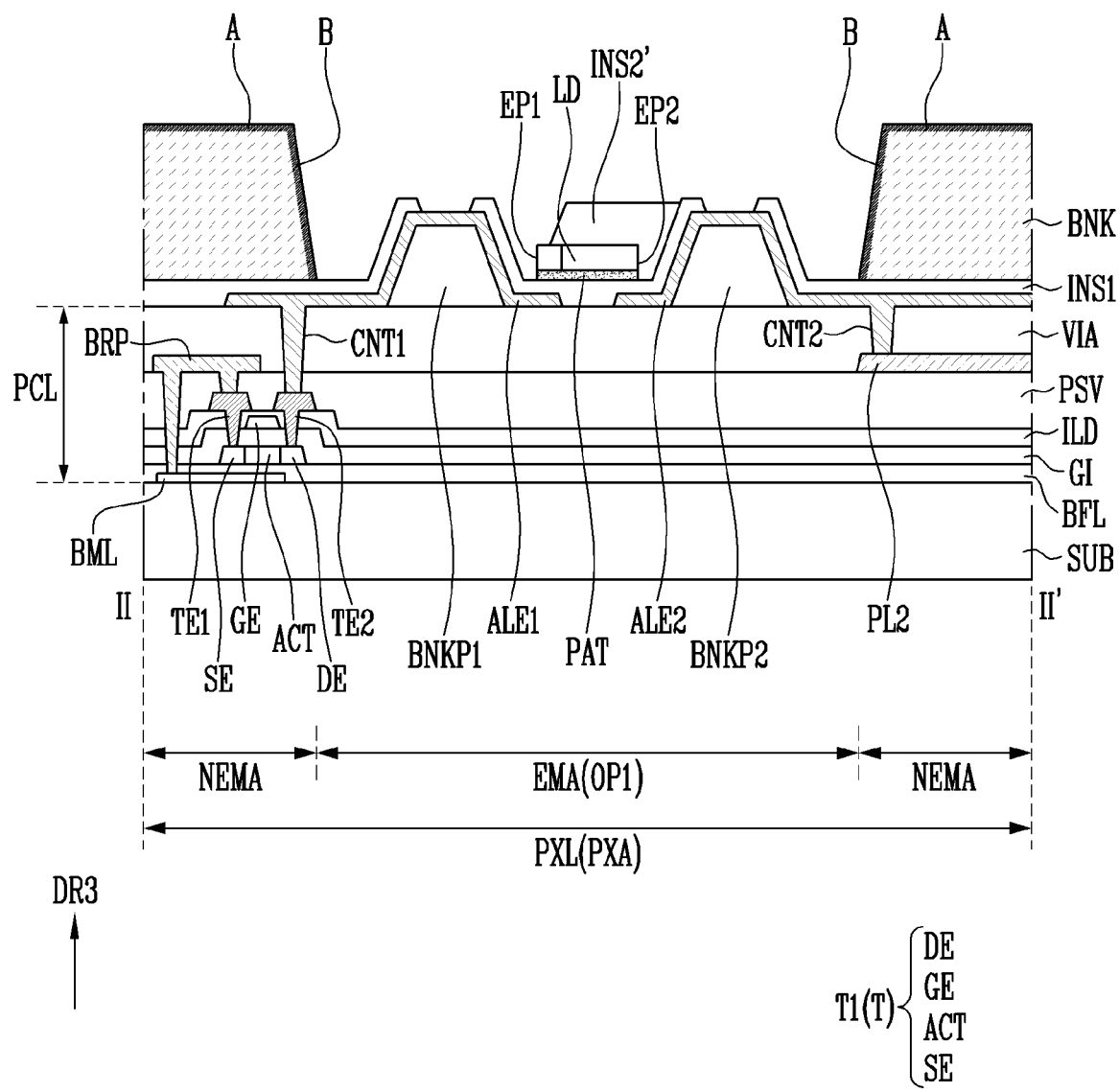
Figure 19L:
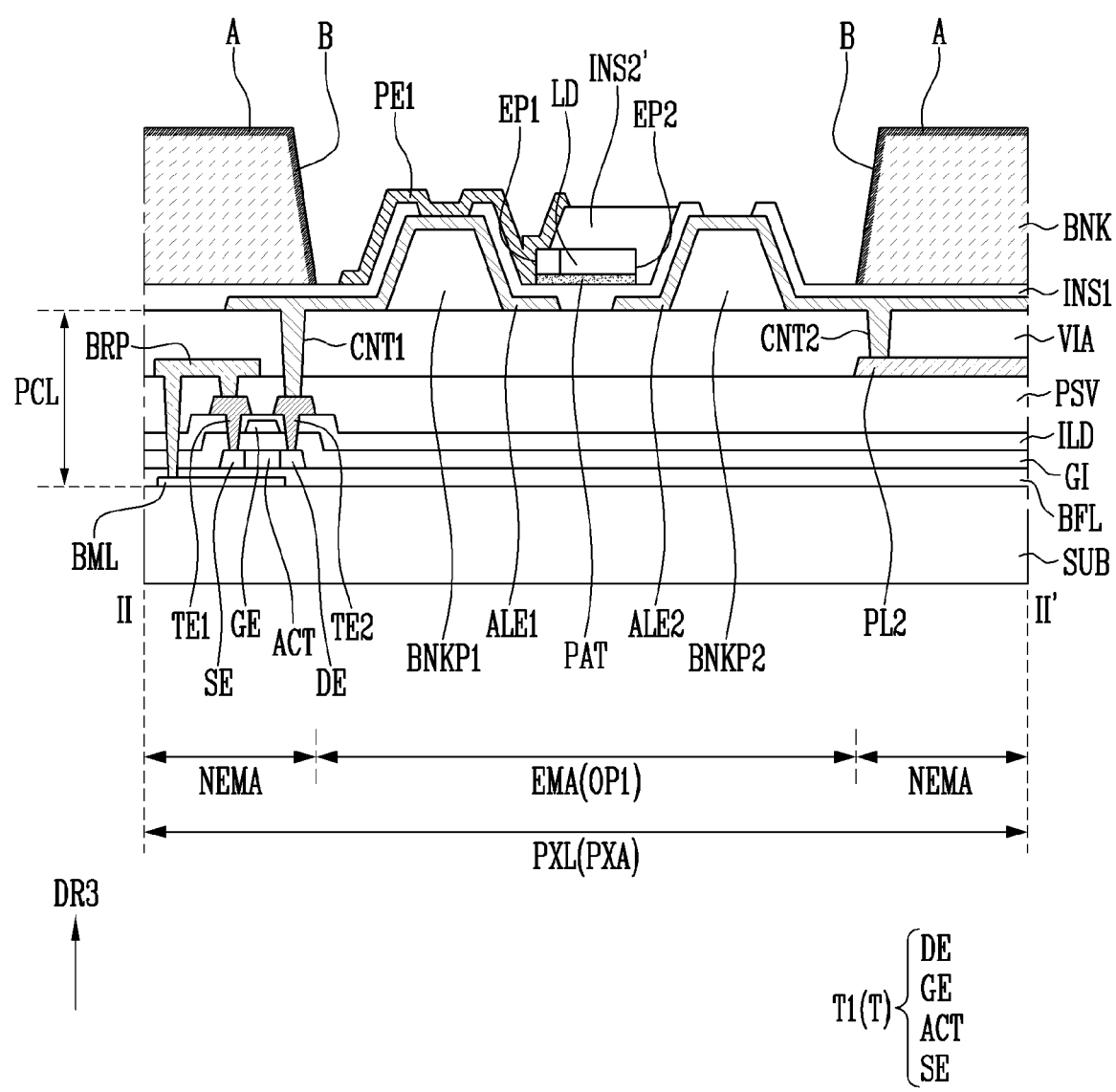
Figure 19M:
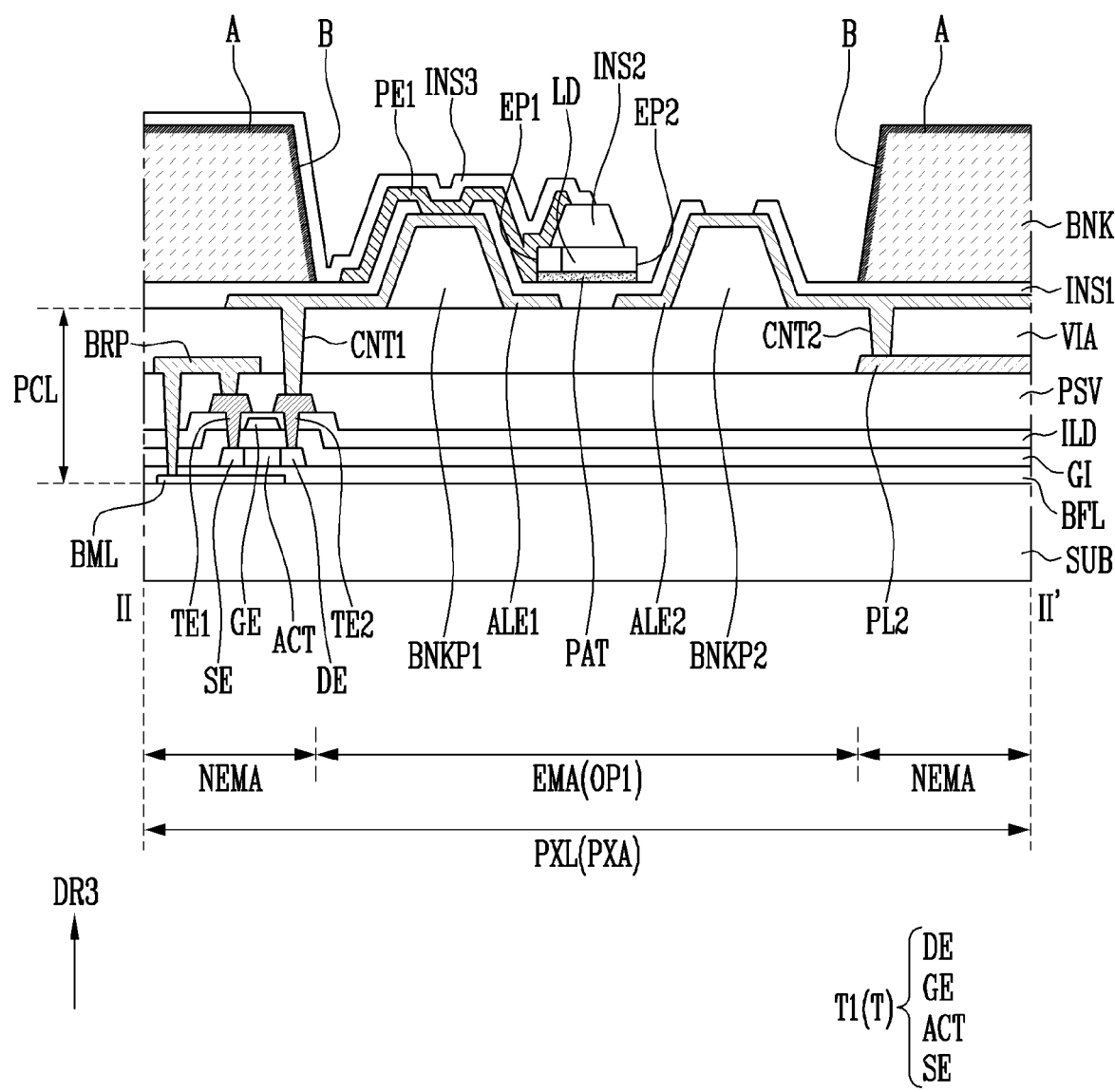
Figure 19N:
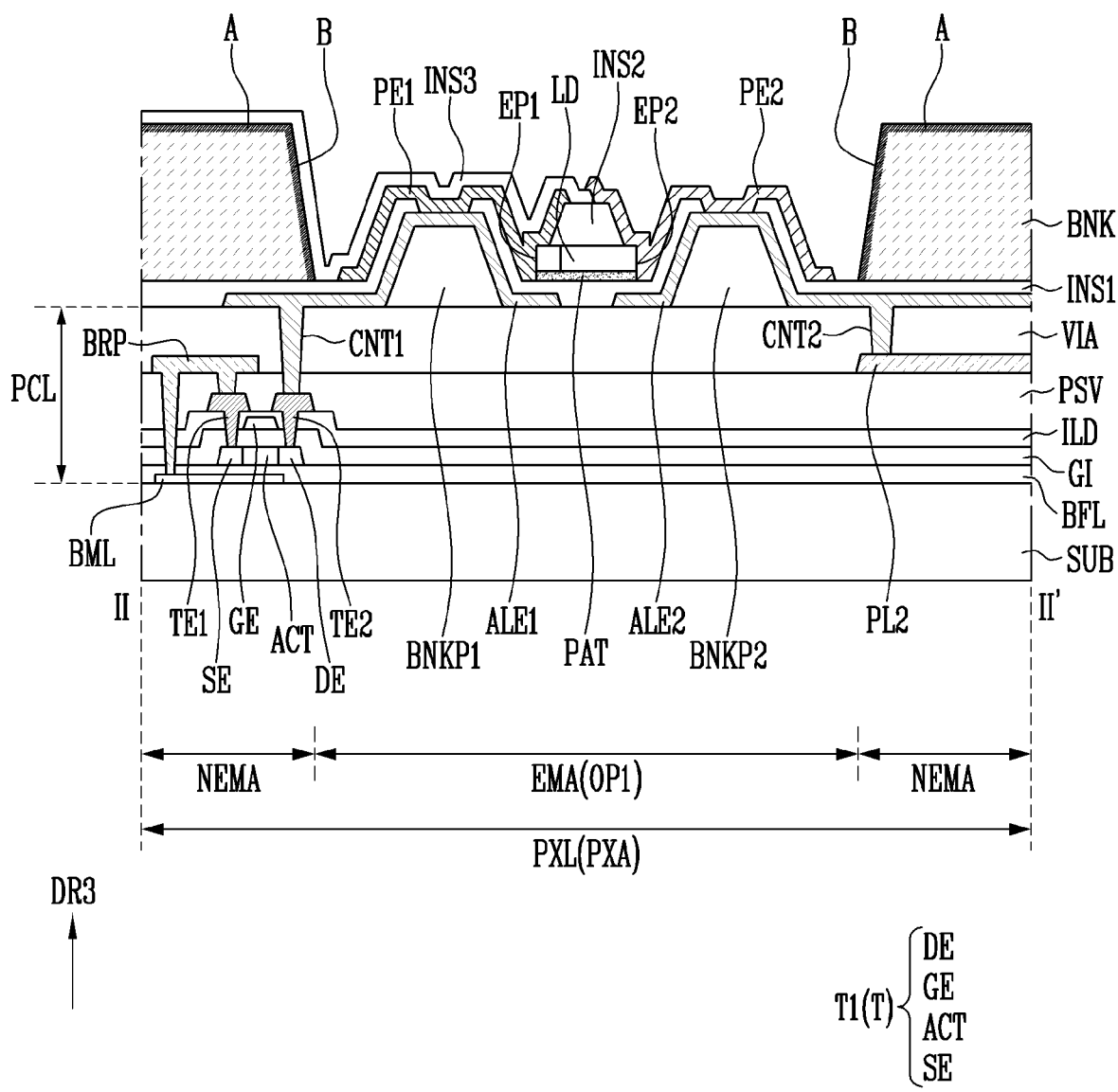
Figure 21:
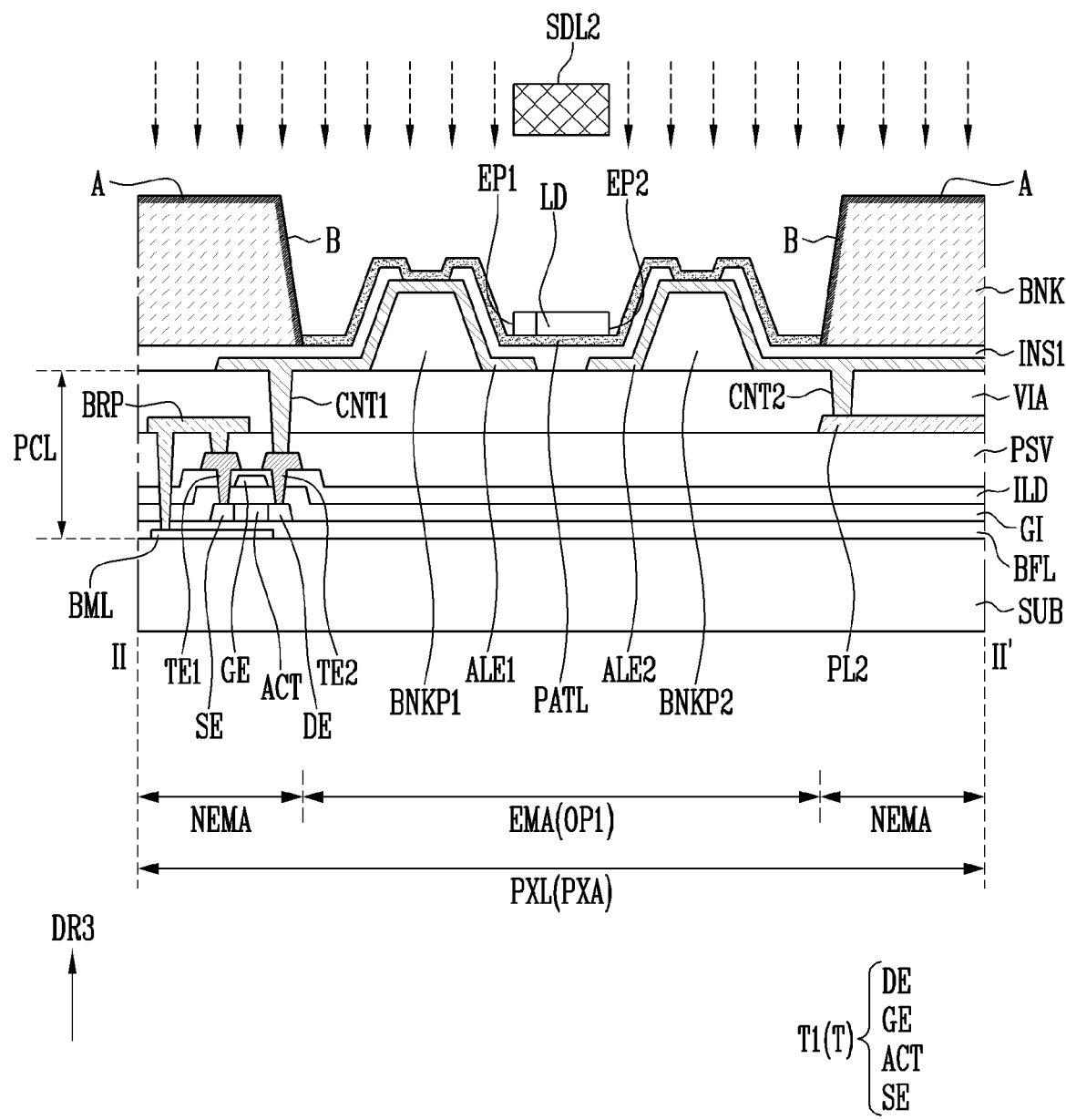
FIG. 21 is a schematic cross-sectional view illustrating a method of manufacturing the pixel of FIG. 19I according to an embodiment.

FIGS. 19A to 19N are schematic cross-sectional views schematically illustrating a method of manufacturing the pixel PXL shown in FIG. 8, FIG. 20 is a schematic cross-sectional view illustrating a method of manufacturing the pixel of FIG. 19E according to an embodiment, and FIG. 21 is a schematic cross-sectional view illustrating a method of manufacturing the pixel of FIG. 19I according to an embodiment.

Hereinafter, the pixel PXL according to the embodiment shown in FIG. 8 is sequentially described according to a manufacturing method with reference to FIGS. 19A to 19N.

In the specification, steps of manufacturing the pixel PXL may be sequentially performed according to a cross-sectional view, however some or a number steps shown as being performed consecutively may be performed simultaneously, an order of each step may be changed, some or a number of steps may be omitted, another step may be further included between each step within the spirit and scope of the disclosure.

In FIGS. 19A to 19N, 20, and 21, in order to avoid a repetitive description, differences from the above-described embodiment are described.

Referring to FIGS. 7, 8, and 19A, the pixel circuit layer PCL is formed on the substrate SUB.

The pixel circuit layer PCL may include the buffer layer BFL, the gate insulating layer GI, the interlayer insulating layer ILD, the first transistor T1, the second power line PL2, the passivation layer PSV, and the via layer (VIA).

The passivation layer PSV may include the first contact portion CNT1 exposing a portion of the first transistor T1 at least in the non-emission area NEMA.

At least in the non-emission region NEMA, the via layer VIA may include the first contact portion CNT1 corresponding to the first contact portion CNT1 of the passivation layer PSV exposing a portion of the first transistor T1, and the second contact portion CNT2 exposing a portion of the second power line PL2.

The bank patterns BNKP are formed on one surface or a surface of the via layer VIA of the display area DA (or the pixel area PXA). The bank patterns BNKP may include the first bank pattern BNKP1 and the second bank pattern BNKP2 spaced from each other on one surface or a surface of the via layer VIA.

Referring to FIGS. 7, 8, 19A, and 19B, the first alignment electrode ALE1 and the second alignment electrode ALE2 are formed on the bank patterns BNKP and the via layer VIA. The first alignment electrode ALE2 may be formed on the first bank pattern BNKP1, and the second alignment electrode ALE2 may be formed on the second bank pattern BNKP2.

The first alignment electrode ALE1 and the second alignment electrode ALE2 may be disposed to be spaced from each other.

Referring to FIGS. 7, 8, and 19A to 19C, the first insulating layer INS1 partially opened to expose some or a number of configurations positioned thereunder may be formed by performing a photolithography process using a mask, after completely coating an insulating material layer (not shown) on the first and second alignment electrodes ALE1 and ALE2, the first and second bank patterns BNKP1 and BNKP2, and the via layer VIA. For example, the first insulating layer INS1 may be partially opened to expose each of a portion of the first alignment electrode ALE1 and a portion of the second alignment electrode ALE2 in the emission area EMA.

In an embodiment, the first insulating layer INS1 may include silicon oxide ($SiO_x$) having a hydrophilic functional group such as a hydroxyl group (—OH).

Referring to FIGS. 7, 8, and 19A to 19D, the bank BNK is formed on the first insulating layer INS1 positioned in the non-emission area NEMA.

The bank BNK may be formed of an organic layer including an organic material. Accordingly, the bank BNK may have hydrophobicity compared to the first insulating layer INS1 formed of silicon oxide ($SiO_x$). As the bank BNK is positioned only in the non-emission area NEMA, some or a number of configurations corresponding to the first and second openings OP1 and OP2 of the bank BNK may be exposed.

Referring to FIGS. 7, 8, and 19A to 19E, a hydrophobic thin film is formed by performing surface treatment on one area or an area of the bank BNK. At this time, the one area or an area of the bank BNK may be the upper surface A and the side surface B of the bank BNK.

The surface treatment may be performed, for example, by performing plasma irradiation on the bank BNK and the first insulating layer INS1. For example, the surface treatment may be performed on the upper surface A and the side surface B of the bank BNK by using a reduced pressure plasma treatment or atmospheric pressure plasma treatment in which a gas containing fluorine or a fluorine compound is used as an introduction gas and plasma is irradiated under a reduced pressure atmosphere containing a fluorine compound and oxygen or under an atmospheric pressure atmosphere. Due to the above-described surface treatment, the upper surface A and the side surface B of the bank BNK may each have hydrophobicity. For example, the upper surface A and the side surface B of the bank BNK may include a hydrophobic thin film containing fluorine (F).

In case that the above-described surface treatment is performed, the plasma may also be irradiated onto the first insulating layer INS1. However, a degree at which the gas (for example, the gas containing fluorine) used in the above-described plasma treatment interacts with the first insulating layer INS1 including a hydrophilic functional group to be covalent-bonded to the first insulating layer INS1 may be significantly lower than that of the bank BNK. Accordingly, the first insulating layer INS1 may not have hydrophobicity in the above-described surface treatment process.

According to an embodiment, in case that the surface treatment is performed, as shown in FIG. 20, a mask including a first shielding member SDL1 may be disposed on the first insulating layer INS1 to protect the first and second alignment electrodes ALE1 and ALE2 exposed in the emission area EMA by the plasma, and the exposed first insulating layer INS1.

Referring to FIGS. 7, 8, and 19A to 19F, a self-assembled monolayer (SAM) PATL is formed on the first insulating layer INS1 that does not overlap the bank BNK.

As a mono-molecule forming the self-assembled monolayer PATL, a generally used mono-molecule may be used, but for example, the mono-molecule may be selected from a group consisting of chlorosilanes such as octadecyltrichlorosilane, alkylsiloxane of 8 to 18 carbon atoms represented by octadecyltrimethoxysilane and octadecyltriethoxysilane, hexamethyldisilazane, carboxylic acid derivatives and phosphoric acid derivatives. In an embodiment, the self-assembled monolayer PATL may be an alkylsiloxane SAM.

A method of forming the self-assembled monolayer PATL may be liquid phase deposition, vapor phase deposition, or the like, and any method that may secure reproducibility may be adopted.

The liquid phase deposition may refer to a method of supporting the substrate SUB on which the first insulating layer INS1 is formed in a piranha solution or forming a hydrophilic functional group such as —OH on the first insulating layer INS1 through UV-ozone treatment, and supporting the substrate SUB in an organic solution containing a mono-molecule for forming the SAM.

The vapor deposition is a method of forming the SAM on the first insulating layer INS1 by injecting a gas using plasma after making a chamber into a vacuum state using a vacuum pump.

The self-assembled monolayer PATL is formed on the first insulating layer INS1 using the above-described methods. At this time, the self-assembled monolayer PATL may be formed only on the exposed first insulating layer INS1 by disposing a mask on the bank BNK on which the hydrophobic thin film is formed. For example, the self-assembled monolayer PATL may not be formed on the bank BNK, and may be formed only on the first insulating layer INS1 that does not overlap the bank BNK. However, the disclosure is not limited thereto, and according to an embodiment, the self-assembled monolayer PATL may be formed on the bank BNK. The self-assembled monolayer PATL including the hydrophilic functional group does not form a chemical bond with the bank BNK on which the hydrophobic thin film is formed.

As described above, in case that the self-assembled monolayer PATL is formed on the first insulating layer INS1 formed of silicon oxide ($SiO_x$), which is a hydrophilic material having a hydroxyl group (—OH), a thin film formed of water and the hydroxyl group (—OH) exists on a surface of the first insulating layer INS1, and alkylsiloxane may be physically adsorbed on the film. An alkyl chain that is physically absorbed as described above has fluidity and thus molecules are closely clustered together. Subsequently, Si—X bonds are generated as Si—OH bonds through hydrolysis, and thus absorption of the alkylsiloxane is performed. The OH functional group generated at this time may react with the OH functional group of the first insulating layer INS1, and a Si—O—Si bond may be formed on the first insulating layer INS1 through a condensation reaction.

Through the above-described reaction, the self-assembled monolayer PATL having hydrophilicity may be finally formed on the first insulating layer INS1.

According to an embodiment, a process of performing oxygen plasma treatment on the first insulating layer INS1 may be performed to increase density of hydroxyl groups (—OH) on the surface of the first insulating layer INS1 before the self-assembled monolayer PATL is formed.

As described above, the process of forming the self-assembled monolayer PATL may be performed after the process of forming the hydrophobic thin film in the bank BNK, but is not limited thereto. According to an embodiment, a surface treatment process for the bank BNK may be performed after the self-assembled monolayer PATL is first formed on the first insulating layer INS1 that does not overlap the bank BNK.

Referring to FIGS. 7, 8, and 19A to 19G, an electric field E is formed between the first alignment electrode ALE1 and the second alignment electrode ALE2 by applying an alignment signal corresponding to each of the first alignment electrode ALE1 and the second alignment electrode ALE2.

The light emitting elements LD are aligned between the first alignment electrode ALE1 and the second alignment electrode ALE2. The light emitting elements LD are supplied (or input) to the pixel area PXA through the inkjet printing method. For example, an inkjet head or inkjet head unit IJH may be disposed so that a nozzle 120 is properly positioned on the self-assembled monolayer PATL.

The inkjet head unit IJH may include a print head 110 and at least one nozzle 120 positioned on a bottom surface of the print head 110. The print head 110 may have a shape extending in one direction or in a direction, but is not limited thereto. The print head 110 may include an inner tube 130 formed along an extension direction. The nozzle 120 may be electrically connected to the inner tube 130 of the print head 110. An Ink INK including a solvent and light emitting elements LD included (or dispersed) in the solvent may be supplied to the inner tube 130, and the ink INK may flow along the inner tube 130 and may be sprayed (or discharged) at a preset position through the nozzle 120. The ink INK sprayed through the nozzle 120 may be supplied to the self-assembled monolayer PATL of the pixel PXL. A spray amount of the ink INK through the nozzle 120 may be adjusted according to a signal applied to the corresponding nozzle 120.

As the hydrophobic thin film is formed on the upper surface A and the side surface B of the bank BNK, the ink INK may be induced to be positioned on the self-assembled monolayer PATL.

Referring to FIGS. 7, 8, and 19A to 19H, the light emitting elements LD supplied to the self-assembled monolayer PATL may be disposed at a position by receiving dielectrophoretic force by the electric field E formed between the first alignment electrode ALE1 and the second alignment electrode ALE2. At this time, repulsive force may be generated between the self-assembled monolayer PATL having hydrophilicity and the light emitting elements LD on which the surface treatment is performed so that the light emitting elements LD have hydrophobicity. Frictional force between the light emitting elements LD and the self-assembled monolayer PATL may be reduced by the repulsive force, and thus the light emitting elements LD positioned at the position (for example, between the first alignment electrode ALE1 and the second alignment electrode ALE2) may be self-aligned.

After the light emitting elements LD are self-aligned, the solvent included in the ink INK is evaporated or removed by other methods.

Referring to FIGS. 7, 8, and 19A to 19I, after the light emitting elements LD are aligned, an etching process is performed.

The etching process may be performed by dry etching using oxygen plasma. In the above-described etching process, the self-assembled monolayer PATL exposed to the outside may be removed.

In the above-described etching process, a mask (not shown) may be disposed on the bank BNK, and thus the oxygen plasma may be irradiated only on the self-assembled monolayer PATL on the first insulating layer INS1 except for the bank BNK. However, the disclosure is not limited thereto, and according to an embodiment, in case that the self-assembled monolayer PATL is formed on the bank BNK, the oxygen plasma may also be irradiated on the self-assembled monolayer PATL on the bank BNK.

In the above-described etching process, the light emitting elements LD may be used as an etching mask. In case that the light emitting elements LD are used as the etching mask, a portion of the self-assembled monolayer PATL positioned between the light emitting elements LD and the first insulating layer INS1 may not be removed and may remain in a patterned form. Accordingly, as shown in FIG. 19J, the pattern PAT positioned between the light emitting elements LD and the first insulating layer INS1 may be finally formed. The pattern PAT may be locally disposed on the first insulating layer INS1. The pattern PAT formed by using the light emitting elements LD as the etching mask may have the same plane shape as the corresponding light emitting element LD. For example, a width W of the pattern PAT in the first direction DR1 may be the same as the length L of the light emitting element LD positioned thereon.

In the above-described etching process, in order to minimize damage to the light emitting elements LD by the oxygen plasma (or to prevent the light emitting elements LD from being affected by the oxygen plasma), a treatment condition (selectivity, temperature, pressure, or the like) may be properly adjusted.

According to an embodiment, as shown in FIG. 21, a second shielding member SDL2 may be disposed on the light emitting elements LD to minimize damage to the outer circumferential surface (for example, the insulating layer 14 described with reference to FIG. 1) of the light emitting elements LD by the oxygen plasma described above. The second shielding member SDL2 may be, for example, a mask.

Referring to FIGS. 7, 8, and 19A to 19K, after the pattern PAT is formed, an insulating pattern INS2' is formed on the light emitting elements LD. The insulating pattern INS2' may be a base material for forming the second insulating layer INS2, and may be formed of an inorganic insulating layer (or inorganic layer) including an inorganic material or an organic insulating layer (or organic layer) including an organic material.

The insulating pattern INS2' may expose the first end portion EP1 of the light emitting elements LD and cover or overlap the second end portion EP2 of the light emitting elements LD. The insulating pattern INS2' may cover or overlap a portion of the first insulating layer INS1 adjacent to the second end portion EP2 of the light emitting elements LD. The insulating pattern INS2' may cover or overlap at least a portion of one surface or a surface (for example, an upper surface in the third direction DR3) of each of the light emitting elements LD to expose the first end portion EP1 of each of the light emitting elements LD.

During a process of forming the insulating pattern INS2', a portion of the alignment electrodes ALE may be removed in the second opening OP2 of the bank BNK which is the electrode separation area so that the pixel PXL may be driven independently or individually from the pixels PXL adjacent thereto.

Referring to FIGS. 7, 8, and 19A to 19L, the first pixel electrode PE1 is formed on the insulating pattern INS2' and the light emitting elements LD.

The first pixel electrode PE1 may be positioned on the first end portion EP1 of the light emitting elements LD in the emission area EMA and may be electrically connected to the light emitting elements LD. The first pixel electrode PE1 may be in contact with or direct contact with the first alignment electrode ALE1 exposed in the emission area EMA and may be electrically connected to the first alignment electrode ALE1.

Referring to FIGS. 7, 8, and 19A to 19M, the third insulating layer INS3 is formed on the first pixel electrode PE1. The third insulating layer INS3 may cover or overlap the first pixel electrode PE1.

During a process of forming the third insulating layer INS3, a portion of the insulating pattern INS2' may be removed to form the second insulating layer INS2 exposing both end portions EP1 and EP2 of the light emitting elements LD.

As the third insulating layer INS3 covers or overlaps only the first pixel electrode PE1, the second end portion EP2 of each of the light emitting elements LD may be exposed by the second insulating layer INS2.

Referring to FIGS. 7, 8, and 19A to 19N, the second pixel electrode PE2 is formed on the exposed second end portion EP2 of the light emitting elements LD.

The second pixel electrode PE2 may be positioned on the second end portion EP2 of the light emitting elements LD in the emission area EMA and may be electrically connected to the light emitting elements LD. The second pixel electrode PE2 may be in contact with or direct contact with the second alignment electrode ALE2 exposed in the emission area EMA and may be electrically connected to the second alignment electrode ALE2.

Subsequently, the fourth insulating layer INS4 may be formed on the second pixel electrode PE2 and the third insulating layer INS3.

Figure 22:
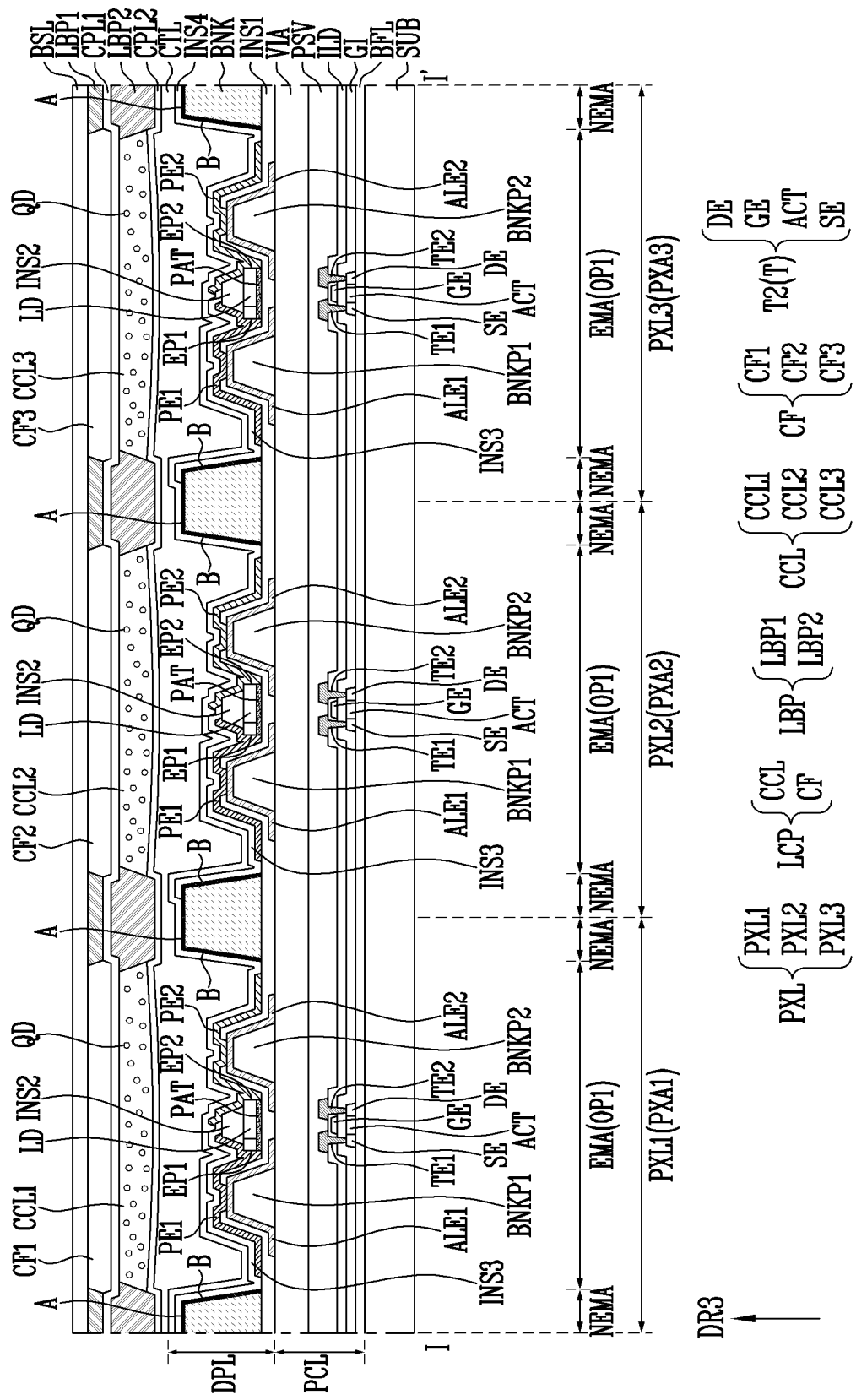
FIG. 22 is a schematic cross-sectional view taken along line I-I' of FIG. 4.

FIG. 22 is a schematic cross-sectional view taken along line I-I' of FIG. 4.

In order to avoid a repetitive description in relation to first to third pixels PXL1, PXL2, and PXL3 of FIG. 22, differences from the above-described embodiment are described. A part that may not be described in the embodiment is in accordance with the above-described embodiment, the same reference numeral denotes the same component, and a similar reference numeral denotes a similar component.

In FIG. 22, a partial configuration of each of the first to third pixels PXL1, PXL2, and PXL3 is shown for convenience.

Referring to FIGS. 4 and 22, the first pixel PXL1 (or a first sub pixel), the second pixel PXL2 (or a second sub pixel), and the third pixel PXL3 (or a third sub pixel) may be arranged or disposed in one direction or in a direction. Each of the first to third pixels PXL1, PXL2, and PXL3 may have the same configuration as the pixel PXL described with reference to FIGS. 7 to 13.

The display area DA of the substrate SUB may include a first pixel area PXA1 in which the first pixel PXL1 is provided (or arranged or disposed), a second pixel area PXA2 in which the second pixel PXL2 is provided (or arranged or disposed), and a third pixel area PXA3 in which the third pixel PXL3 is provided (or arranged or disposed). In an embodiment, the first pixel PXL1 may be a red pixel, the second pixel PX2L may be a green pixel, and the third pixel PXL3 may be a blue pixel. However, the disclosure is not limited thereto, and according to an embodiment, the second pixel PXL2 may be a red pixel, the first pixel PXL1 may be a green pixel, and the third pixel PXL3 may be a blue pixel. According to an embodiment, the third pixel PXL3 may be a red pixel, the first pixel PXL1 may be a green pixel, and the second pixel PXL2 may be a blue pixel.

Each of the first, second, and third pixels PXL1, PXL2, and PXL3 may include the emission area EMA. Each of the first, second, and third pixels PXL1, PXL2, and PXL3 may include the non-emission area NEMA adjacent to the emission area EMA of the corresponding pixel PXL. The bank BNK may be positioned in the non-emission area NEMA.

The pixel circuit layer PCL of each of the first, second, and third pixels PXL1, PXL2, and PXL3 may include the buffer layer BFL disposed on the substrate SUB, at least one or more transistors T provided on the buffer layer BFL, the passivation layer PSV provided on the transistor T, and the via layer VIA provided on the passivation layer PSV. The transistor T may be a second transistor T2.

The display element layer DPL of each of the first, second, and third pixels PXL1, PXL2, and PXL3 may include the first and second bank patterns BNKP1 and BNKP2, the first and second alignment electrodes ALE1 and ALE2, the first insulating layer INS1, the bank BNK, the pattern PAT, the second insulating layer INS2, at least one light emitting element LD, the third insulating layer INS3, the first and second pixel electrodes PE1 and PE2, and the fourth insulating layer INS4.

The upper substrate including the light conversion pattern LCP and the light blocking pattern LBP may be disposed on the display element layer DPL of the first pixel PXL1. The light conversion pattern LCP of the first pixel PXL1 may include a first color conversion layer CCL1 and a first color filter CF1. The first color conversion layer CCL1 may include color conversion particles QD including a red quantum dot that converts the light emitted from the light emitting element LD into light of red. The first color filter CF1 may be a red color filter.

The upper substrate including the light conversion pattern LCP and the light blocking pattern LBP may be disposed on the display element layer DPL of the second pixel PXL2. The light conversion pattern LCP of the second pixel PXL2 may include a second color conversion layer CCL2 and a second color filter CF2. The second color conversion layer CCL2 may include color conversion particles QD including a green quantum dot that converts the light emitted from the light emitting element LD into light of green. The second color filter CF2 may be a green color filter.

The upper substrate including the light conversion pattern LCP and the light blocking pattern LBP may be disposed on the display element layer DPL of the third pixel PXL3. The light conversion pattern LCP of the third pixel PXL3 may include a third color conversion layer CCL3 and a third color filter CF3. The third color conversion layer CCL3 may include color conversion particles QD including a blue quantum dot that converts the light emitted from the light emitting element LD into light of blue. The third color filter CF3 may be a blue color filter. According to an embodiment, the third pixel PXL3 may include a light scattering layer including light scattering particles instead of the color conversion layer CCL3.

In case that the light emitting element LD is aligned in each of the first, second, and third pixels PXL1, PXL2, and PXL3, repulsive force may be generated in each area between the light emitting element LD on which surface treatment is performed so that the light emitting element LD has hydrophobicity and the first insulating layer INS1 having hydrophilicity and between the light emitting element LD on which surface treatment is performed so that the light emitting element LD has hydrophobicity and the pattern PAT having hydrophilicity. Frictional force between the light emitting element LD and the first insulating layer INS1 may be reduced in each of the first, second, and third pixels PXL1, PXL2, and PXL3 by the repulsive force, and thus a defect in that the light emitting element LD is separated from a position of each of the first to third pixels PXL1, PXL2, and PXL3 may be prevented.

Although the disclosure has been described with reference to the embodiment above, those skilled in the art or those having a common knowledge in the art will understand that the disclosure may be variously modified and changed without departing from the spirit and scope of the disclosure described in the claims attached herewith.

Therefore, the technical scope of the disclosure should not be limited to the contents described in the detailed description of the specification, but should be defined by the claims.

What is claimed is:

1. A display device comprising:
a substrate including a pixel area; and
a pixel disposed in the pixel area, the pixel including an emission area and a non-emission area,
wherein the pixel comprises:
  a first alignment electrode and a second alignment electrode spaced from each other on the substrate;
  an insulating layer disposed on the first alignment electrode and the second alignment electrode;
  at least one light emitting element disposed on the insulating layer between the first alignment electrode and the second alignment electrode in the emission area;
  a pattern disposed between the at least one light emitting element and the insulating layer in a thickness direction of the display device, the pattern including a hydrophilic group; and
  a bank disposed on the insulating layer in the non-emission area, the bank including a first opening corresponding to the emission area and a second opening spaced from the first opening of the bank.

2. The display device according to claim 1, wherein the pattern is entirely overlapped by the at least one light emitting element in a plan view.

3. The display device according to claim 2, wherein the pattern has a width in a lateral direction orthogonal to the thickness direction equal to a length of the at least one light emitting element in the lateral direction.

4. The display device according to claim 2, wherein the hydrophilic group of the pattern includes one of a hydroxyl group (—OH), a carboxyl group (—COOH), or a combination thereof.

5. The display device according to claim 4, wherein the at least one light emitting element includes an outer circumferential surface having hydrophobicity.

6. The display device according to claim 5, wherein
the insulating layer includes silicon oxide ($SiO_x$), and
the pattern includes an organic material.

7. The display device according to claim 6, wherein the pattern includes an alkylsiloxane self-assembled monolayer.

8. The display device according to claim 7, wherein
the pattern has hydrophilicity, and
at least a surface of the bank has hydrophobicity.

9. The display device according to claim 8, wherein an upper surface of the bank and a side surface of the bank include fluorine (F).

10. The display device according to claim 1, wherein
the pixel further includes: a first pixel electrode and a second pixel electrode spaced apart from each other and electrically connected to the at least one light emitting element,
each of the at least one light emitting element is comprised of an active layer disposed between a first semiconductor layer and a second semiconductor layer, and
the active layer has a multi quantum well structure.

11. The display device according to claim 10, wherein
the insulating layer is partially opened to expose each of a portion of the first alignment electrode and a portion of the second alignment electrode in the emission area,
the first pixel electrode is electrically connected to the first alignment electrode through an open portion of the insulating layer, and
the second pixel electrode is electrically connected to the second alignment electrode through another open portion of the insulating layer.

12. The display device according to claim 10, wherein the insulating layer includes:
a first contact hole exposing a portion of the first alignment electrode; and
a second contact hole exposing a portion of the second alignment electrode within the second opening of the bank.

13. The display device according to claim 12, wherein
the first pixel electrode is electrically connected to the first alignment electrode through the first contact hole of the insulating layer, and
the second pixel electrode is electrically connected to the second alignment electrode through the second contact hole of the insulating layer.

14. The display device according to claim 13, wherein the insulating layer completely overlaps each of the first alignment electrode and the second alignment electrode in the emission area in a plan view.

15. The display device according to claim 10, further comprising:
a light conversion pattern disposed on the first pixel electrode and the second pixel electrode and corresponding to the emission area; and
a light blocking pattern disposed on the bank and corresponding to the non-emission area,
wherein the pattern coincides in a plan view with the at least one light emitting element.

* * * * *